(12) United States Patent
Kimura et al.

(10) Patent No.: US 12,289,083 B2
(45) Date of Patent: Apr. 29, 2025

(54) COMMUNICATION DEVICE

(71) Applicant: SEMICONDUCTOR ENERGY LABORATORY CO., LTD., Atsugi (JP)

(72) Inventors: Hajime Kimura, Kanagawa (JP); Takayuki Ikeda, Kanagawa (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 604 days.

(21) Appl. No.: 17/611,921

(22) PCT Filed: May 19, 2020

(86) PCT No.: PCT/IB2020/054711
§ 371 (c)(1),
(2) Date: Nov. 17, 2021

(87) PCT Pub. No.: WO2020/240339
PCT Pub. Date: Dec. 3, 2020

(65) Prior Publication Data
US 2022/0255511 A1 Aug. 11, 2022

(30) Foreign Application Priority Data

May 31, 2019 (JP) ................. 2019-102029
May 31, 2019 (JP) ................. 2019-102036

(51) Int. Cl.
H03F 3/45 (2006.01)
H03F 3/19 (2006.01)
H04B 1/40 (2015.01)

(52) U.S. Cl.
CPC .......... H03F 3/19 (2013.01); H03F 2200/451 (2013.01); H04B 1/40 (2013.01)

(58) Field of Classification Search
CPC ...... H03F 3/19; H03F 2200/451; H03F 1/223; H03F 3/195; H03F 3/45188; H04B 1/40;
(Continued)

(56) References Cited

U.S. PATENT DOCUMENTS 6,366,172 B1  4/2002  Hayashi et al.
6,639,446 B2  10/2003 Komurasaki et al.
(Continued)

FOREIGN PATENT DOCUMENTS

CN   001308788 A   8/2001
CN   101356724 A   1/2009
(Continued)

OTHER PUBLICATIONS

International Search Report (Application No. PCT/IB2020/054711) Dated Jul. 14, 2020.
(Continued)

Primary Examiner — Andrea Lindgren Baltzell
Assistant Examiner — Khiem D Nguyen
(74) Attorney, Agent, or Firm — NIXON PEABODY LLP; Jeffrey L. Costellia

(57) ABSTRACT

A communication device that can transmit and receive a signal with a large amplitude is provided. The communication device includes an amplifier circuit including first to fourth transistors, first to fourth bias transistors, first to fourth loads, and first to fourth terminals. The drains of the first to fourth transistors are electrically connected to the sources of the first to fourth bias transistors. The sources of the first to fourth transistors are electrically connected to power supply lines. The gates of the first and second bias transistors are electrically connected to a first wiring, and the gates of the third and fourth bias transistors are electrically connected to a second wiring. The first to fourth terminals are electrically connected to the gates of the first to fourth (Continued)

transistors, the drains of the third, fourth, first, and second bias transistors, and the first to fourth loads.

12 Claims, 31 Drawing Sheets

(58) Field of Classification Search
CPC .......... H01L 29/78648; H01L 29/7869; H01L 29/78696; H01L 27/1225
USPC .................................................. 330/253, 254
See application file for complete search history.

(56) References Cited

U.S. PATENT DOCUMENTS

| | | | |
|---|---|---|---|
| 7,485,838 B2 | 2/2009 | Nishi et al. | |
| 7,531,784 B2 | 5/2009 | Arao et al. | |
| 7,847,635 B2 | 12/2010 | Aiba | |
| 8,638,162 B2 | 1/2014 | Watanabe | |
| 9,788,211 B2 | 10/2017 | Zhang | |
| 10,360,855 B2 | 7/2019 | Takahashi | |
| 10,484,877 B2 | 11/2019 | Zhang | |
| 2003/0052727 A1 | 3/2003 | Komurasaki et al. | |
| 2007/0045672 A1 | 3/2007 | Nishi et al. | |
| 2007/0257248 A1 | 11/2007 | Arao et al. | |
| 2009/0231041 A1* | 9/2009 | Groe ................... | H03F 3/45188 330/254 |
| 2010/0013556 A1 | 1/2010 | Aiba | |
| 2010/0226411 A1 | 9/2010 | Watanabe et al. | |
| 2012/0075007 A1 | 3/2012 | Watanabe | |
| 2013/0307421 A1 | 11/2013 | Tanada | |
| 2014/0027765 A1 | 1/2014 | Toyotaka | |
| 2015/0257012 A1 | 9/2015 | Zhang | |
| 2017/0053584 A1 | 2/2017 | Takahashi | |
| 2018/0014204 A1 | 1/2018 | Zhang | |
| 2018/0019719 A1 | 1/2018 | Roderick | |

FOREIGN PATENT DOCUMENTS

| | | |
|---|---|---|
| EP | 1096669 A | 5/2001 |
| EP | 2058944 A | 5/2009 |
| JP | 2003-078355 A | 3/2003 |
| JP | 2018-148589 A | 9/2018 |
| KR | 2009-0037488 A | 4/2009 |
| WO | WO-2000/002307 | 1/2000 |
| WO | WO-2008/026528 | 3/2008 |
| WO | WO-2008/035480 | 3/2008 |

OTHER PUBLICATIONS

Written Opinion (Application No. PCT/IB2020/054711) Dated Jul. 14, 2020.
Pang.J et al., "A 28GHz CMOS Phased-Array Beamformer Utilizing Neutralized Bi-Directional Technique Supporting Dual-Polarized MIMO for 5G NR", ISSCC 2019 (Digest of Technical Papers. IEEE International Solid-State Circuits Conference), Feb. 17, 2019, pp. 344-345.

* cited by examiner

FIG. 6A1
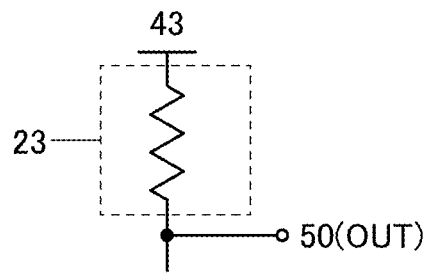
FIG. 6A2
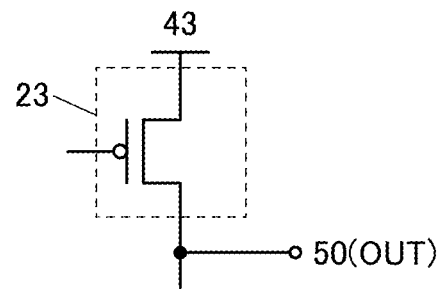
FIG. 6A3
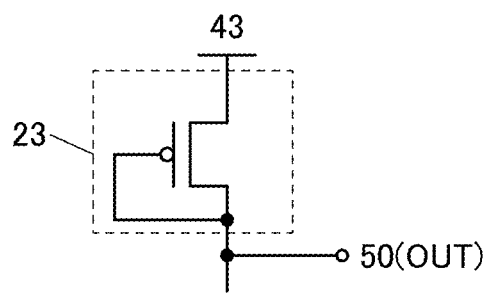
FIG. 6A4
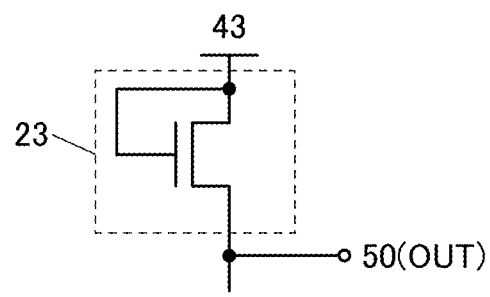
FIG. 6B1
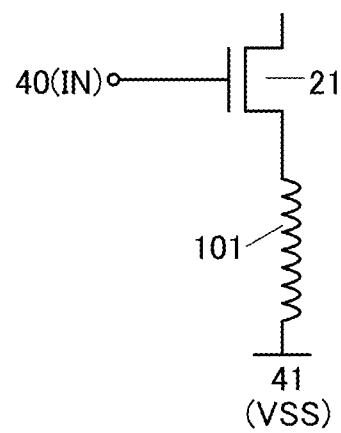
FIG. 6B2
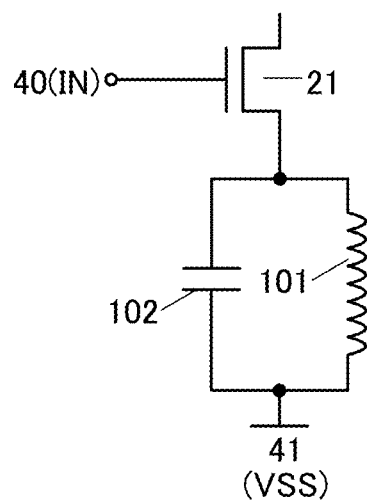

FIG. 7A1
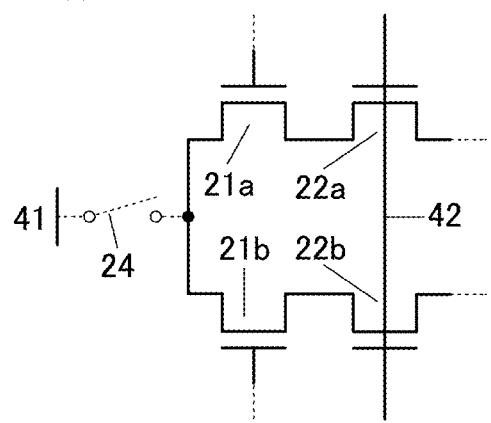
FIG. 7A2
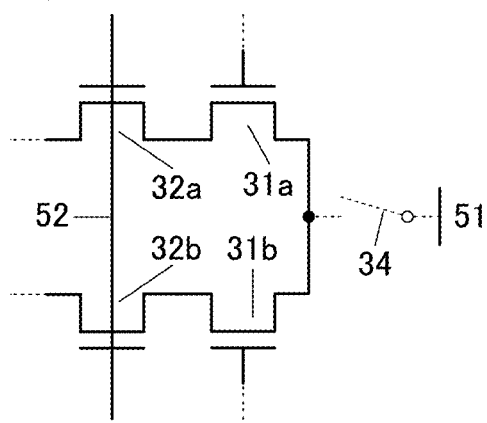
FIG. 7B1
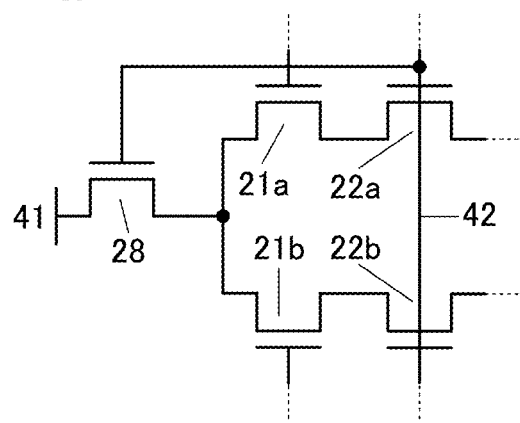
FIG. 7B2
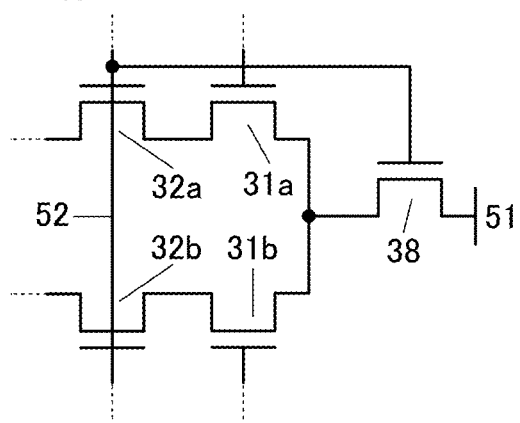

20

20

500, 550

500, 550

FIG. 25A
Intermediate state
New boundary region
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 25B
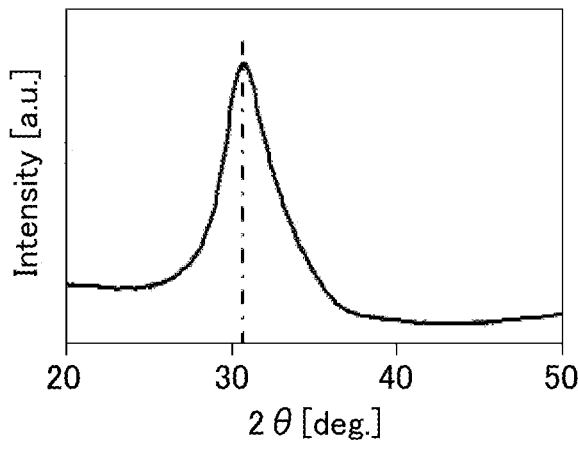
FIG. 25C
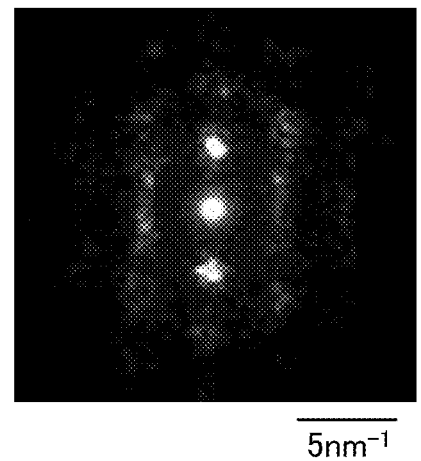

COMMUNICATION DEVICE

TECHNICAL FIELD

One embodiment of the present invention relates to a communication device and an operation method thereof. Another embodiment of the present invention relates to a semiconductor device and an operation method thereof.

Note that one embodiment of the present invention is not limited to the above technical field. The technical field of the invention disclosed in this specification and the like relates to an object, a method, or a manufacturing method. Alternatively, one embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices.

A display device, a light-emitting device, a lighting device, an electro-optical device, a communication device, an electronic device, and the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

BACKGROUND ART

Information terminals that are easy to carry, typified by smartphones, tablet terminals, and the like, have come into widespread use. With the widespread use of information terminals, various communication standards have been established. For example, the use of an LTE-Advanced standard called the fourth-generation mobile communication system (4G) has started.

With the development of information technology such as Internet of Things (IoT), the amount of data handled in information terminals has been recently showing an increasing tendency. In addition, the transmission speed of electronic devices such as information terminals needs to be improved.

In order to be compatible with various kinds of information technology such as IoT, a new communication standard called the fifth-generation mobile communication system (5G), which achieves higher transmission speed, more simultaneous connections, and shorter delay time than 4G, has been examined (see Patent Document 1).

REFERENCE

Patent Document

[Patent Document 1] Japanese Published Patent Application No. 2018-148589

SUMMARY OF THE INVENTION

Problems to be Solved by the Invention

An object of one embodiment of the present invention is to provide a communication device that can transmit and receive a signal with a large amplitude. Another object is to provide a communication device including an amplifier having a high amplification factor. Another object is to provide a communication device with low power consumption. Another object is to provide a novel communication device. Another object is to provide a novel semiconductor device.

An object of one embodiment of the present invention is to provide an operation method of a communication device that can transmit and receive a signal with a large amplitude. Another object is to provide an operation method of a communication device including an amplifier having a high amplification factor. Another object is to provide an operation method of a communication device with low power consumption. Another object is to provide an operation method of a novel communication device. Another object is to provide an operation method of a novel semiconductor device.

The description of these objects does not preclude the existence of other objects. In one embodiment of the present invention, there is no need to achieve all the objects. Note that objects other than these will be apparent from the description of the specification, the drawings, the claims, and the like, and objects other than these can be derived from the description of the specification, the drawings, the claims, and the like.

Means for Solving the Problems

One embodiment of the present invention is a communication device including an amplifier circuit. The amplifier circuit includes a first transistor, a second transistor, a third transistor, a fourth transistor, a fifth transistor, a sixth transistor, a seventh transistor, an eighth transistor, a first load, a second load, a third load, a fourth load, a first terminal, a second terminal, a third terminal, and a fourth terminal. One of a source and a drain of the first transistor is electrically connected to one of a source and a drain of the second transistor. One of a source and a drain of the third transistor is electrically connected to one of a source and a drain of the fourth transistor. One of a source and a drain of the fifth transistor is electrically connected to one of a source and a drain of the sixth transistor. One of a source and a drain of the seventh transistor is electrically connected to one of a source and a drain of the eighth transistor. The other of the source and the drain of the first transistor and the other of the source and the drain of the third transistor are electrically connected to a first power supply line. The other of the source and the drain of the fifth transistor and the other of the source and the drain of the seventh transistor are electrically connected to a second power supply line. A gate of the second transistor and a gate of the fourth transistor are electrically connected to a first wiring. A gate of the sixth transistor and a gate of the eighth transistor are electrically connected to a second wiring. The first terminal is electrically connected to the gate of the first transistor, the other of the source and the drain of the sixth transistor, and the first load. The second terminal is electrically connected to the gate of the third transistor, the other of the source and the drain of the eighth transistor, and the second load. The third terminal is electrically connected to the gate of the fifth transistor, the other of the source and the drain of the second transistor, and the third load. The fourth terminal is electrically connected to the gate of the seventh transistor, the other of the source and the drain of the fourth transistor, and the fourth load.

Another embodiment of the present invention is a communication device including amplifier circuit. The amplifier circuit includes a first transistor, a second transistor, a third transistor, a fourth transistor, a fifth transistor, a sixth transistor, a seventh transistor, an eighth transistor, a first operational amplifier, a second operational amplifier, a third operational amplifier, a fourth operational amplifier, a first load, a second load, a third load, a fourth load, a first terminal, a second terminal, a third terminal, and a fourth terminal. One of a source and a drain of the first transistor is electrically connected to one of a source and a drain of the second transistor. One of a source and a drain of the third transistor is electrically connected to one of a source and a drain of the fourth transistor. One of a source and a drain of the fifth transistor is electrically connected to one of a source and a drain of the sixth transistor. One of a source and a drain of the seventh transistor is electrically connected to one of a source and a drain of the eighth transistor. The other of the source and the drain of the first transistor and the other of the source and the drain of the third transistor are electrically connected to a first power supply line. The other of the source and the drain of the fifth transistor and the other of the source and the drain of the seventh transistor are electrically connected to a second power supply line. A non-inverting input terminal of the first operational amplifier and a non-inverting input terminal of the second operational amplifier are electrically connected to a first wiring. A non-inverting input terminal of the third operational amplifier and a non-inverting input terminal of the fourth operational amplifier are electrically connected to a second wiring. An inverting input terminal of the first operational amplifier is electrically connected to the one of the source and the drain of the first transistor. An inverting input terminal of the second operational amplifier is electrically connected to the one of the source and the drain of the third transistor. An inverting input terminal of the third operational amplifier is electrically connected to the one of the source and the drain of the fifth transistor. An inverting input terminal of the fourth operational amplifier is electrically connected to the one of the source and the drain of the seventh transistor. An output terminal of the first operational amplifier is electrically connected to a gate of the second transistor. An output terminal of the second operational amplifier is electrically connected to a gate of the fourth transistor. An output terminal of the third operational amplifier is electrically connected to a gate of the sixth transistor. An output terminal of the fourth operational amplifier is electrically connected to a gate of the eighth transistor. The first terminal is electrically connected to the gate of the first transistor, the other of the source and the drain of the sixth transistor, and the first load. The second terminal is electrically connected to the gate of the third transistor, the other of the source and the drain of the eighth transistor, and the second load. The third terminal is electrically connected to the gate of the fifth transistor, the other of the source and the drain of the second transistor, and the third load. The fourth terminal is electrically connected to the gate of the seventh transistor, the other of the source and the drain of the fourth transistor, and the fourth load.

In the above embodiment, the second transistor, the fourth transistor, the sixth transistor, and the eighth transistor may each include a back gate. The back gate of the second transistor may be electrically connected to the first terminal. The back gate of the fourth transistor may be electrically connected to the second terminal. The back gate of the sixth transistor may be electrically connected to the third terminal. The back gate of the eighth transistor may be electrically connected to the fourth terminal.

In the above embodiment, when a first signal wave is input to the first terminal, the amplifier circuit may have a function of outputting a signal wave corresponding to the first signal wave from the third terminal. When a second signal wave is input to the second terminal, the amplifier circuit may have a function of outputting a signal wave corresponding to the second signal wave from the fourth terminal. When a third signal wave is input to the third terminal, the amplifier circuit may have a function of outputting a signal wave corresponding to the third signal wave from the first terminal. When a fourth signal wave is input to the fourth terminal, the amplifier circuit may have a function of outputting a signal wave corresponding to the fourth signal wave from the second terminal.

In the above embodiment, when the first signal wave is input to the first terminal and the second signal wave is input to the second terminal, a potential of the first wiring may be a potential at which the second and fourth transistors may be operated in a saturation region and a potential of the second wiring may be a potential at which the sixth and eighth transistors may be bought into an off state. When the third signal wave is input to the third terminal and the fourth signal wave is input to the fourth terminal, the potential of the first wiring may be a potential at which the second and fourth transistors may be bought into an off state and the potential of the second wiring may be a potential at which the sixth and eighth transistors may be operated in a saturation region.

In the above embodiment, there may be an antiphase relationship between the first signal wave and the second signal wave, and there may be an antiphase relationship between the third signal wave and the fourth signal wave.

In the above embodiment, the one of the source and the drain of each of the first to eighth transistors may be a source.

Effect of the Invention

According to one embodiment of the present invention, a communication device that can transmit and receive a signal with a large amplitude can be provided. A communication device including an amplifier having a high amplification factor can be provided. A communication device with low power consumption can be provided. A novel communication device can be provided. A novel semiconductor device can be provided.

According to one embodiment of the present invention, an operation method of a communication device that can transmit and receive a signal with a large amplitude can be provided. An operation method of a communication device including an amplifier having a high amplification factor can be provided. An operation method of a communication device with low power consumption can be provided. An operation method of a novel communication device can be provided. An operation method of a novel semiconductor device can be provided.

Note that the description of these effects does not preclude the existence of other effects. One embodiment of the present invention does not have to have all these effects. Note that effects other than these will be apparent from the description of the specification, the drawings, the claims, and the like, and effects other than these can be derived from the description of the specification, the drawings, the claims, and the like.

BRIEF DESCRIPTION OF THE DRAWINGS

FIG. 6A1, FIG. 6A2, FIG. 6A3, FIG. 6A4, FIG. 6B1, and FIG. 6B2 are diagrams illustrating configuration examples of a communication device.

FIG. 7A1, FIG. 7A2, FIG. 7B1, and FIG. 7B2 are circuit diagrams illustrating configuration examples of a communication device.

FIG. 25A is a diagram showing classifications of crystal structures of IGZO. FIG. 25B is a graph showing an XRD spectrum of a CAAC-IGZO film. FIG. 25C is an image showing nanobeam electron diffraction patterns of a CAAC-IGZO film.

MODE FOR CARRYING OUT THE INVENTION

Figure 1:
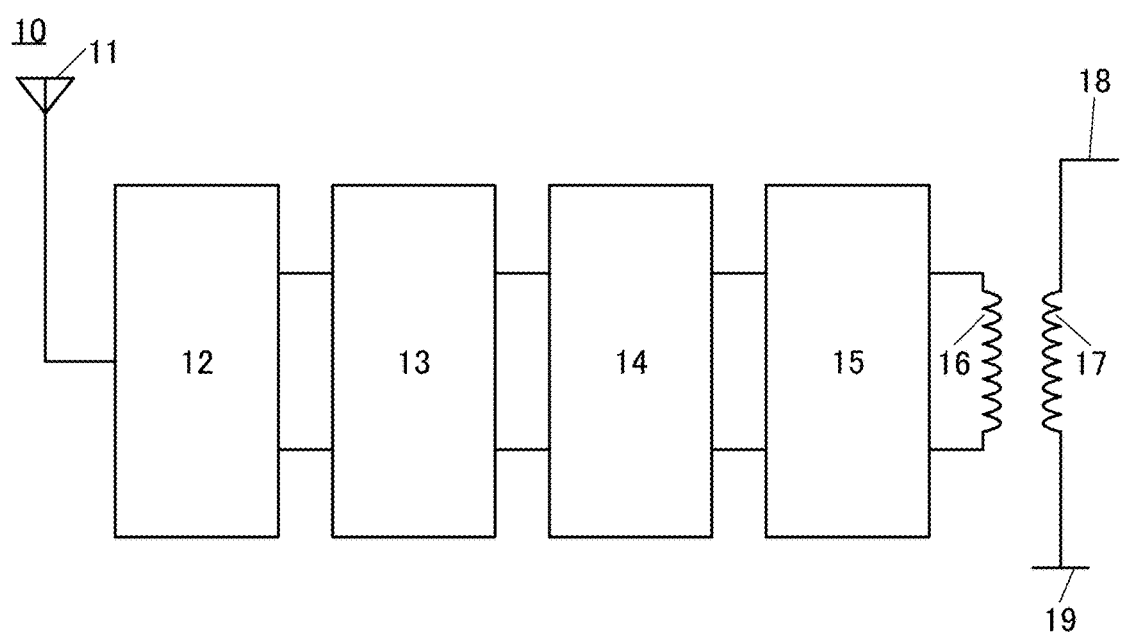
FIG. 1 is a block diagram illustrating a configuration example of a communication device.

Embodiments are described in detail with reference to the drawings. However, the present invention is not limited to the following description, and it is readily appreciated by those skilled in the art that modes and details can be modified in various ways without departing from the spirit and the scope of the present invention. Thus, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases for easy understanding of the invention. Therefore, the disclosed invention is not necessarily limited to the position, size, range, or the like disclosed in the drawings. For example, in an actual manufacturing process, a resist mask or the like might be unintentionally reduced in size by treatment such as etching, which might not be reflected in the drawings for easy understanding.

In a top view (also referred to as a "plan view"), a perspective view, or the like, some components might be omitted for easy understanding of the drawings.

In this specification and the like, the term such as an "electrode," or a "wiring," does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" can also include the case where a plurality of "electrodes," "wirings," "terminals," or the like are formed in an integrated manner.

In this specification and the like, a "terminal" in an electric circuit refers to a portion that inputs or outputs current or voltage or receives or transmits a signal. Accordingly, part of a wiring or an electrode functions as a terminal in some cases.

In addition, in this specification and the like, the terms such as "over" or "above" and "under" or "below" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

Functions of a source and a drain are interchanged with each other depending on operation conditions and the like, for example, when a transistor of different polarity is employed or when the current direction is changed in a circuit operation; therefore, it is difficult to define which is the source or the drain. Thus, the terms "source" and "drain" can be interchangeably used in this specification.

In this specification and the like, the expression "electrically connected" includes the case where components are directly connected to each other and the case where components are connected through an "object having any electric function." Here, there is no particular limitation on the "object having any electric function" as long as electric signals can be transmitted and received between components that are connected through the object. Thus, even when the expression "electrically connected" is used, there is a case where no physical connection portion is made and a wiring is just extended in an actual circuit.

In this specification and the like, the terms "identical," "same," "equal," "uniform," and the like used in describing calculation values and actual measurement values allow for a margin of error of ±20% unless otherwise specified.

A voltage refers to a potential difference between a certain potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Even a "semiconductor" has characteristics of an "insulator" when conductivity is sufficiently low, for example. Thus, a "semiconductor" can be replaced with an "insulator." In that case, a "semiconductor" and an "insulator" cannot be strictly distinguished from each other because a border therebetween is not clear. Accordingly, a "semiconductor" and an "insulator" described in this specification can be replaced with each other in some cases.

A "semiconductor" has characteristics of a "conductor" when conductivity is sufficiently high, for example. Thus, a "semiconductor" can be replaced with a "conductor." In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

In this specification and the like, an "on state" of a transistor refers to a state in which a source and a drain of the transistor are electrically short-circuited. Furthermore, an "off state" of the transistor refers to a state in which the source and the drain of the transistor are electrically disconnected.

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In addition, in this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or all of a source region, a source electrode, or a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when OS transistor is mentioned, the OS transistor can also be called a transistor including an oxide or an oxide semiconductor.

Embodiment 1

In this embodiment, a communication device which is one embodiment of the present invention is described.

FIG. 1 is a diagram illustrating a configuration example of a communication device 10, which is the communication device of one embodiment of the present invention. The communication device 10 includes an antenna 11, an amplifier 12, an amplifier 13, a phase shifter 14, an amplifier 15, an inductor 16, and an inductor 17. Note that the inductor is also referred to as a coil. The inductor 16 and the inductor 17 are provided to face each other.

The communication device 10 has a function of performing wireless communication. For example, the communication device 10 can transmit and receive signals to exchange data represented by the signals with a base station.

The antenna 11 has a function of receiving a signal from the outside of the communication device 10. The antenna 11 also has a function of transmitting a signal to the outside of the communication device 10. For example, the antenna 11 has a function of receiving a signal transmitted as a radio wave from the base station. For example, the antenna 11 has a function of transmitting a signal as a radio wave to the outside of the communication device 10.

As described above, the signal transmitted or received by the communication device 10 can be a wave. In this specification and the like, a signal that is a wave is sometimes referred to as a signal wave.

The amplifier 12 has a function of amplifying a signal received by the antenna 11 and outputting the signal to the amplifier 13. The amplifier 12 also has a function of amplifying a signal input from the amplifier 13 and outputting the signal to the antenna 11. The amplifier 12, which functions as a power amplifier, can significantly amplify the signal received by the antenna 11 and the signal input from the amplifier 13. The amplifier 12, which functions as a low noise amplifier, can amplify the signal received by the antenna 11 and the signal input from the amplifier 13 with high accuracy.

The amplifier 13 has a function of amplifying a signal input from the amplifier 12 and outputting the signal to the phase shifter 14. The amplifier 13 also has a function of amplifying a signal input from the phase shifter 14 and outputting the signal to the amplifier 12. The amplifier 13, which functions as an RF (Radio Frequency) amplifier, can amplify high-frequency signals. Thus, high-frequency signals can be transmitted and received by the communication device 10 owing to the amplifier 13. Accordingly, the communication device 10 can perform wireless communication using the fifth-generation mobile communication system (5G), for example, owing to the amplifier 13 provided in the communication device 10.

The phase shifter 14 has a function of changing the phase of a signal. Even when the communication device 10 transmits and receives a high-frequency signal, the phase of the signal can be controlled with high accuracy owing to the phase shifter 14 included in the communication device 10. Thus, even when the communication device 10 transmits and receives a high-frequency signal, beamforming can be performed. This allows the communication device 10 to receive a signal transmitted from a distance. The communication device 10 can also transmit a signal to a distance. Accordingly, owing to the phase shifter 14 provided in the communication device 10, the communication device 10 can perform wireless communication using 5G, for example.

The amplifier 15 has a function of amplifying a signal input from the phase shifter 14 and outputting the signal to the inductor 16. The amplifier 15 has a function of amplifying a signal input from the inductor 16 and outputting the signal to the phase shifter 14. The amplifier 15 has a function of an isolation amplifier. Thus, noise included in a signal input to the amplifier 15 can be removed.

A signal input to the inductor 16 is supplied to the inductor 17 by electromagnetic induction. Providing the inductor 16 and the inductor 17 in the communication device 10 enables impedance matching, for example. This allows efficient signal transmission.

One terminal of the inductor 17 is electrically connected to a wiring 18. The other terminal of the inductor 17 is electrically connected to a wiring 19. The wiring 19 has a function of a power supply line. The potential of the wiring 19 can be a low potential or aground potential, for example.

Figure 2:
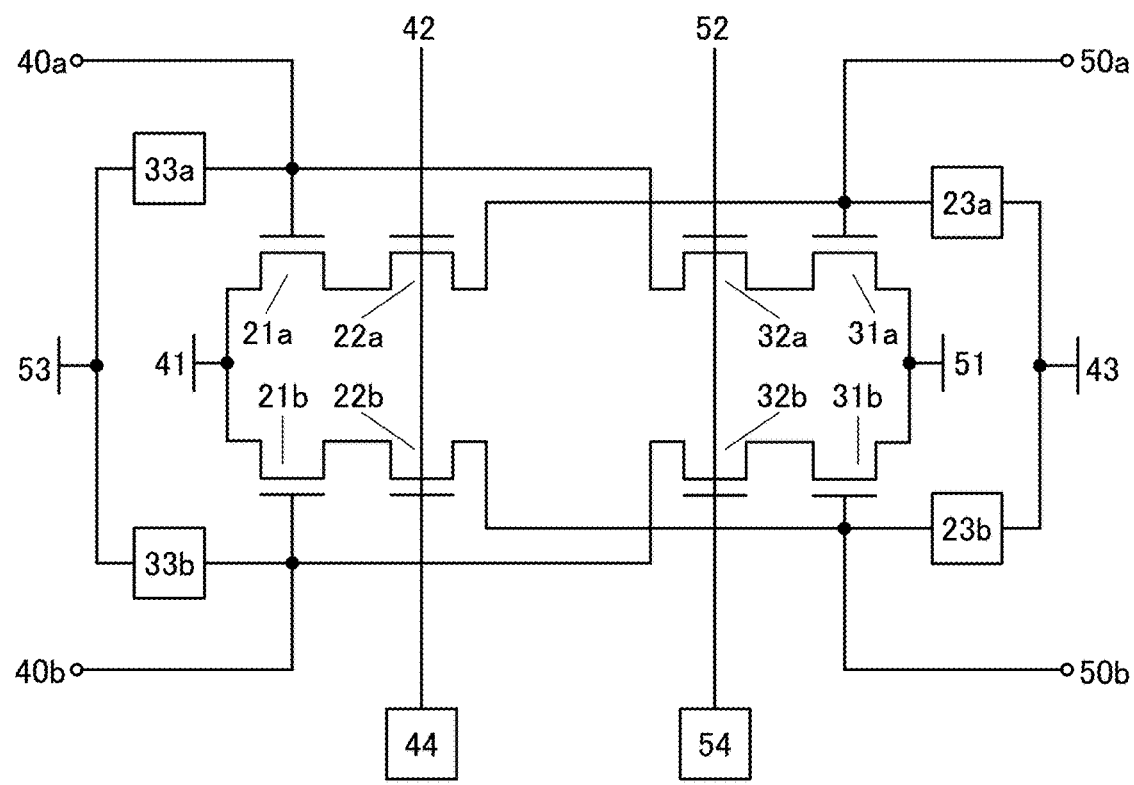
FIG. 2 is a circuit diagram illustrating a configuration example of a communication device.

FIG. 2 is a diagram illustrating a configuration example of an amplifier circuit 20. The amplifier 12, the amplifier 13, the phase shifter 14, and the amplifier 15 illustrated in FIG. 1 can include the amplifier circuit 20.

The amplifier circuit 20 includes a transistor 21a, a transistor 21b, a transistor 22a, a transistor 22b, a load 23a, a load 23b, a transistor 31a, a transistor 31b, a transistor 32a, a transistor 32b, a load 33a, a load 33b, a terminal 40a, a terminal 40b, a potential generation circuit 44, a terminal 50a, a terminal 50b, and a potential generation circuit 54. Note that the potential generation circuit 44 and the potential generation circuit 54 may be provided outside the amplifier circuit 20.

Figure 3:
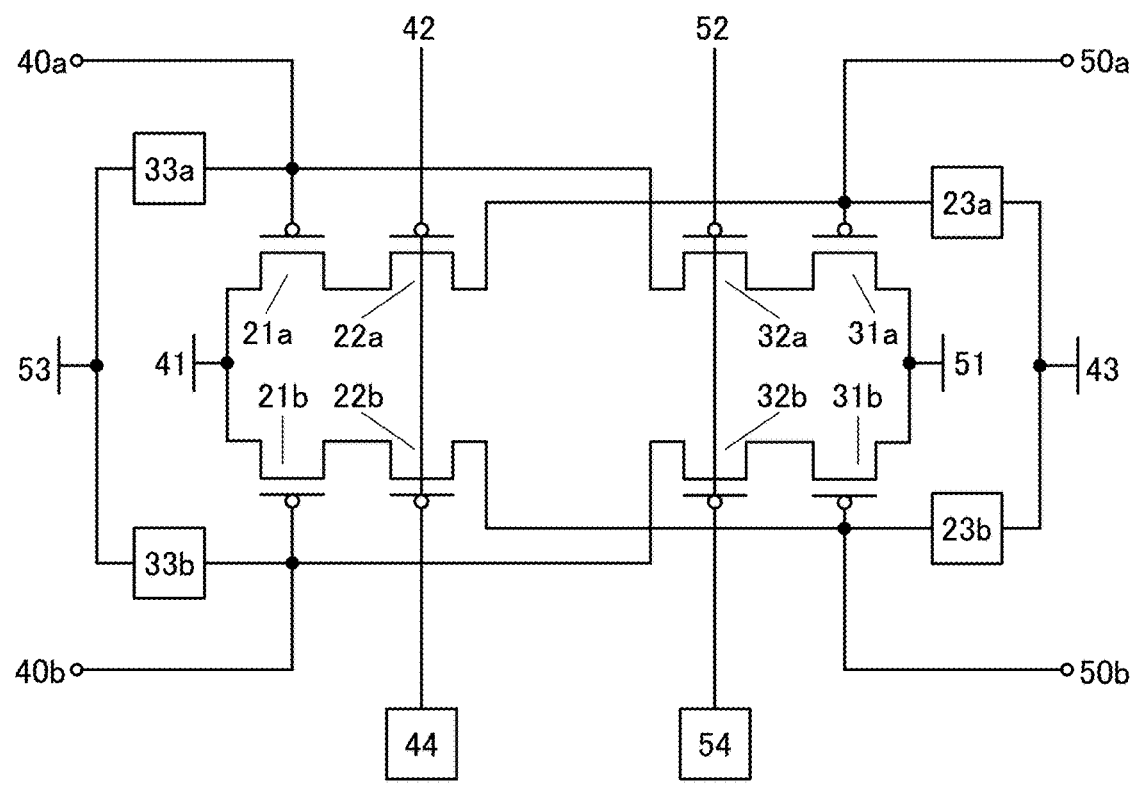
FIG. 3 is a circuit diagram illustrating a configuration example of a communication device.

In the following description, the transistor 21a, the transistor 21b, the transistor 22a, the transistor 22b, the transistor 31a, the transistor 31b, the transistor 32a, and the transistor 32b are all n-channel transistors. However, as needed, any or all of the above transistors may be p-channel transistors by, for example, changing the potential relationship as appropriate. For example, as illustrated in FIG. 3, the transistor 21a, the transistor 21b, the transistor 22a, the transistor 22b, the transistor 31a, the transistor 31b, the transistor 32a, and the transistor 32b may be all p-channel transistors.

One of a source and a drain of the transistor 21a is electrically connected to one of a source and a drain of the transistor 22a. One of a source and a drain of the transistor 21b is electrically connected to one of a source and a drain of the transistor 22b. One of a source and a drain of the transistor 31a is electrically connected to one of a source and a drain of the transistor 32a. One of a source and a drain of the transistor 31b is electrically connected to one of a source and a drain of the transistor 32b.

The other of the source and the drain of the transistor 21a and the other of the source and the drain of the transistor 21b are each electrically connected to a wiring 41. A gate of the transistor 22a and a gate of the transistor 22b are electrically connected to a wiring 42. The other of the source and the drain of the transistor 31a and the other of the source and the drain of the transistor 31b are electrically connected to a wiring 51. A gate of the transistor 32a and a gate of the transistor 32b are electrically connected to a wiring 52.

The potential generation circuit 44 is electrically connected to the wiring 42. The potential generation circuit 54 is electrically connected to the wiring 52.

The terminal 40a is electrically connected to a gate of the transistor 21a, the other of the source and the drain of the transistor 32a, and the load 33a. The terminal 40b is electrically connected to a gate of the transistor 21b, the other of the source and the drain of the transistor 32b, and the load 33b. The terminal 50a is electrically connected to a gate of the transistor 31a, the other of the source and the drain of the transistor 22a, and the load 23a. The terminal 50b is electrically connected to a gate of the transistor 31b, the other of the source and the drain of the transistor 22b, and the load 23b. The load 23a and the load 23b are electrically connected to the wiring 43. The load 33a and the load 33b are electrically connected to the wiring 53.

The wiring 41, the wiring 43, the wiring 51, and the wiring 53 each have a function of a power supply line. The potentials of the wiring 41, the wiring 43, the wiring 51, and the wiring 53 can be set to, for example, constant potentials. For example, the potentials of the wiring 41 and the wiring 51 can be low potentials, and the potentials of the wiring 43 and the wiring 53 can be high potentials.

Here, the power supply lines supplied with the same potential can be electrically connected to each other. For example, the wiring 41 and the wiring 51 can be electrically connected to each other. The wiring 43 and the wiring 53 can be electrically connected to each other. In other words, it may be said that the wiring 41 and the wiring 51 can be the same wiring and the wiring 43 and the wiring 53 can be the same wiring.

A bias potential can be supplied to the wiring 42 and the wiring 52. Thus, the transistor 22a, the transistor 22b, the transistor 32a, and the transistor 32b can function as bias transistors. The bias potential can be a potential at which a transistor functioning as a bias transistor can operate in a saturation region.

The potential supplied to the wiring 42 can be generated by the potential generation circuit 44. The potential of the potential generation circuit 54 can be generated by the potential supplied to the wiring 52.

When a signal is input to the terminal 40a, a signal corresponding to the signal is output from the terminal 50a, and when a signal is input to the terminal 40b, a signal corresponding to the signal is output from the terminal 50b, as described later in detail. In this case, the terminal 40a and the terminal 40b serve as input terminals and the terminal 50a and the terminal 50b serve as output terminals. When a signal is input to the terminal 50a, a signal corresponding to the signal is output from the terminal 40a, and when a signal is input to the terminal 50b, a signal corresponding to the signal is output from the terminal 40b. In this case, the terminal 40a and the terminal 40b serve as output terminals and the terminal 50a and the terminal 50b serve as input terminals. It can thus be said that the terminal 40a, the terminal 40b, the terminal 50a, and the terminal 50b have both the function of an input terminal and the function of an output terminal.

Here, the ratio of the channel width to the channel length of each of the transistor 22a, the transistor 22b, the transistor 32a, and the transistor 32b which can function as bias transistors is preferably high. For example, the ratio of the channel width to the channel length (channel width/channel length) of the transistor 22a is preferably higher than or equal to the ratio of the channel width to the channel length of the transistor 21a. The ratio of the channel width to the channel length of the transistor 22b is preferably higher than or equal to the ratio of the channel width to the channel length of the transistor 21b. The ratio of the channel width to the channel length of the transistor 32a is preferably higher than or equal to the ratio of the channel width to the channel length of the transistor 31a. The ratio of the channel width to the channel length of the transistor 32b is preferably higher than or equal to the ratio of the channel width to the channel length of the transistor 31b. The Miller effect can be inhibited by the high ratio of the channel width to the channel length of each of the transistor 22a, the transistor 22b, the transistor 32a, and the transistor 32b which can function as bias transistors.

Here, the product of the channel width and the channel length of each of the transistor 22a, the transistor 22b, the transistor 32a, and the transistor 32b which can function as bias transistors is preferably high. For example, the product of the channel width and the channel length of the transistor 22a is preferably greater than or equal to the product of the channel width and the channel length of the transistor 21a. The product of the channel width and the channel length of the transistor 22b is preferably greater than or equal to the product of the channel width and the channel length of the transistor 21b. The product of the channel width and the channel length of the transistor 32a is preferably greater than or equal to the product of the channel width and the channel length of the transistor 31a. The product of the channel width and the channel length of the transistor 32b is preferably greater than or equal to the product of the channel width and the channel length of the transistor 31b. These are because an increase in channel length or channel width does not damage frequency characteristics in the case of the transistor 22a, the transistor 22b, the transistor 32a, and the transistor 32b which can function as bias transistors.

The channel length of each of the transistor 22a, the transistor 22b, the transistor 32a, and the transistor 32b which can function as bias transistors is preferably long. For example, the channel length of the transistor 22a is preferably longer than or equal to the channel length of the transistor 21a. The channel length of the transistor 22b is preferably longer than or equal to the channel length of the transistor 21b. The channel length of the transistor 32a is preferably longer than or equal to the channel length of the transistor 31a. The channel length of the transistor 32b is preferably longer than or equal to the channel length of the transistor 31b. Even when an increase in the channel length of each of the transistor 22a, the transistor 22b, the transistor 32a, and the transistor 32b which can function as bias transistors increases a voltage Vds which is the difference between the drain potential and the source potential of the transistor, the drain current flowing through the transistor can be inhibited from increasing as long as the gate potential is constant.

Preferably, the threshold voltage of the transistor 21a is higher than the threshold voltage of the transistor 22a, the threshold voltage of the transistor 21b is higher than the threshold voltage of the transistor 22b, the threshold voltage of the transistor 31a is higher than the threshold voltage of the transistor 32a, and the threshold voltage of the transistor 31b is higher than the threshold voltage of the transistor 32b. In particular, the transistor 21a, the transistor 21b, the transistor 31a, and the transistor 31b are preferably normally off and the transistor 22a, the transistor 22b, the transistor 32a, and the transistor 32b are preferably normally on. In this case, a gate-source voltage Vgs of the transistor 22a, a voltage Vgs of the transistor 22b, a voltage Vgs of the transistor 32a, and a voltage Vgs of the transistor 32b are reduced. This can expand the range of the drain-source voltage Vds where the transistor 22a, the transistor 22b, the transistor 32a, and the transistor 32b which can function as bias transistors are operated in the saturation region.

Figure 4A:
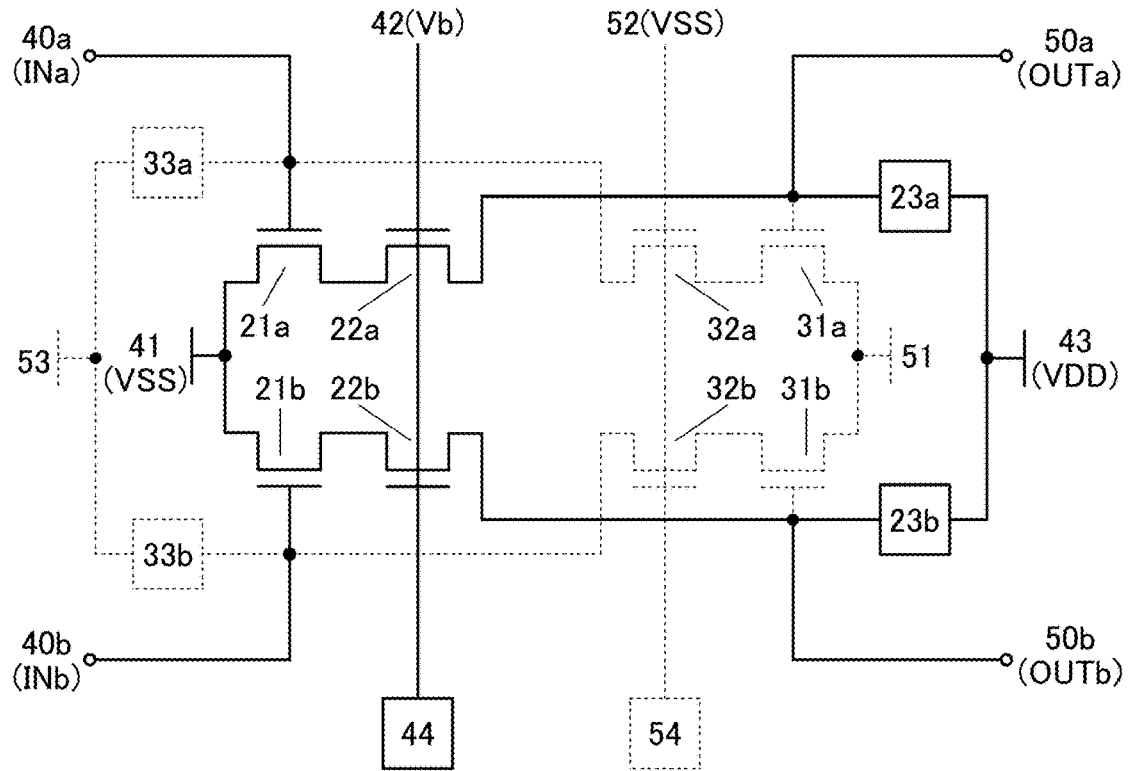
FIG. 4A and FIG. 4B are circuit diagrams illustrating an example of an operation method of a communication device.
Figure 4B:
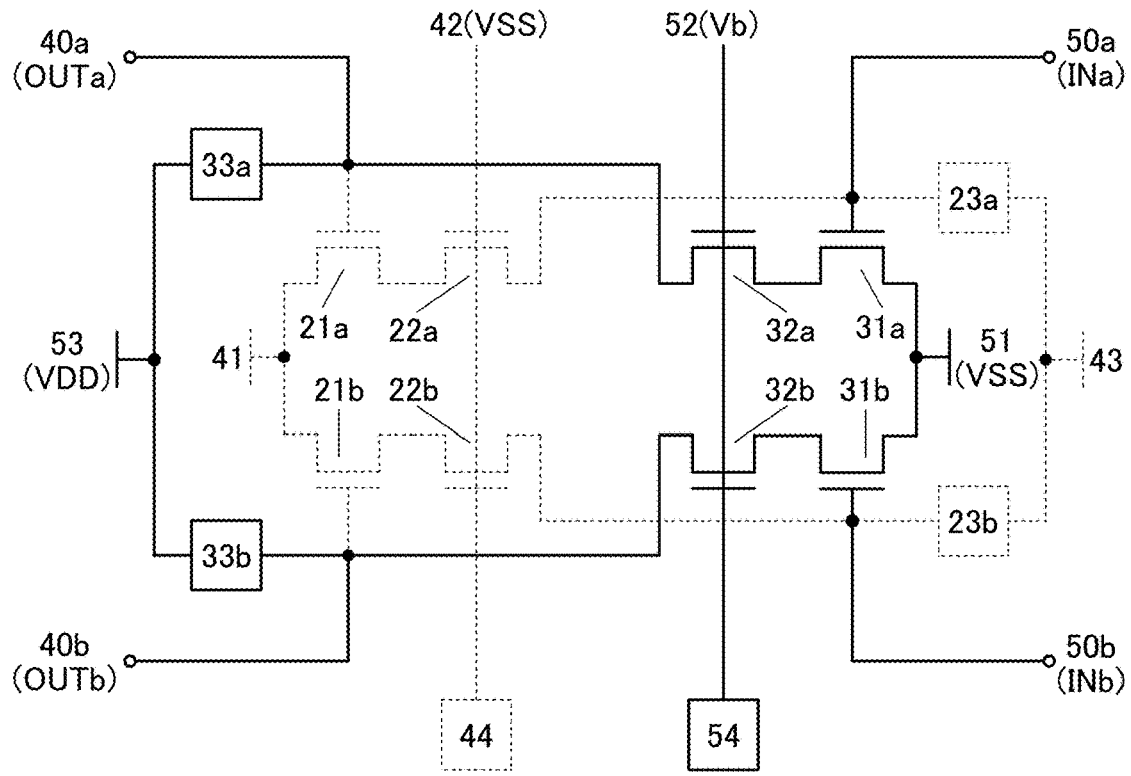

Examples of operation methods of the amplifier circuit 20 having the configuration illustrated in FIG. 2 are described using FIG. 4A and FIG. 4B. FIG. 4A illustrates an example of an operation method of the amplifier circuit 20 having the configuration illustrated in FIG. 2 where the terminal 40a is an input terminal INa, the terminal 40b is an input terminal INb, the terminal 50a is an output terminal OUTa, and the terminal 50b is an output terminal OUTb. FIG. 4B illustrates an example of an operation method of the amplifier circuit 20 having the configuration illustrated in FIG. 2 where the terminal 50a is an input terminal INa, the terminal 50b is an input terminal INb, the terminal 40a is an output terminal OUTa, and the terminal 40b is an output terminal OUTb. Here, a signal having a phase opposite to that of the signal input to the input terminal INa can be input to the input terminal INb.

In FIG. 4A and FIG. 4B, a potential VDD indicates a high potential and a potential VSS indicates a low potential. The same is shown in the other drawings.

First, the case where signals are input to the terminal 40a and the terminal 40b is described. In this case, as illustrated in FIG. 4A, the potential of the wiring 42 is a bias potential Vb and the potential of the wiring 52 is a low potential. This makes the transistor 22a and the transistor 22b function as bias transistors. By contrast, the transistor 32a and the transistor 32b are brought into an off state.

In FIG. 4A and FIG. 4B, the dotted lines indicate the transistor, load, circuit, and wiring that do not contribute to transmission of a signal from the input terminal INa to the output terminal OUTa or transmission of a signal from the input terminal INb to the output terminal OUTb. As illustrated in FIG. 4A, for example, the transistor 32a and the transistor 32b are in an off state and therefore do not contribute to the transmission of a signal from the input terminal INa to the output terminal OUTa or the transmission of a signal from the input terminal INb to the output terminal OUTb. Furthermore, since the transistor 32a and the transistor 32b are in an off state, current does not flow into the transistor 31a or the transistor 31b, either, and therefore the transistor 31a and the transistor 31b do not contribute to the transmission of a signal from the input terminal INa to the output terminal OUTa or the transmission of a signal from the input terminal INb to the output terminal OUTb. The load 33a, which is electrically connected to the other of the source and the drain of the transistor 32a in an off state, and the load 33b, which is electrically connected to the other of the source and the drain of the transistor 32b in an off state, do not contribute to the transmission of a signal from the input terminal INa to the output terminal OUTa or the transmission of a signal from the input terminal INb to the output terminal OUTb, either. As described above, in FIG. 4A, the dotted lines indicate the transistor 31a, the transistor 31b, the transistor 32a, the transistor 32b, the load 33a, and the load 33b and parts of the circuit and wiring that are electrically connected to these.

Figure 5A:
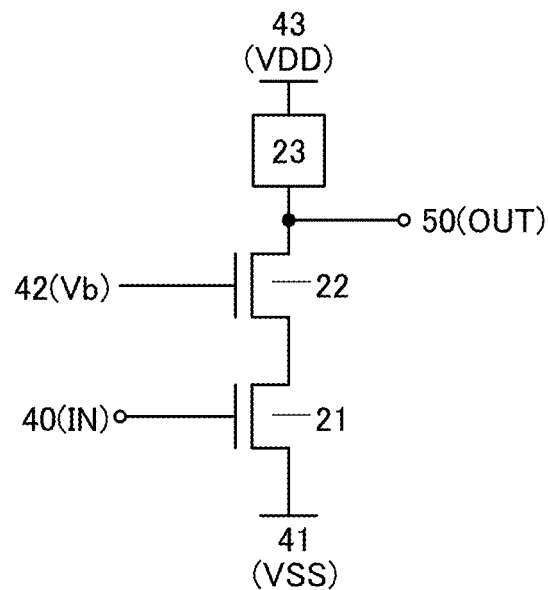
FIG. 5A and FIG. 5B are circuit diagrams illustrating configuration examples of a semiconductor device.

FIG. 5A is a diagram of the transistor 21 (the transistor 21a or the transistor 21b), the transistor 22 (the transistor 22a or the transistor 22b), the load 23 (the load 23a or the load 23b), the terminal 40 (the terminal 40a or the terminal 40b), the wiring 41, the wiring 42, the wiring 43, and the terminal 50 (the terminal 50a or the terminal 50b) excerpted from FIG. 4A. Note that the terminal 40 is the input terminal IN (the input terminal INa or the input terminal INb) and the terminal 50 is the output terminal OUT (the output terminal OUTa or the output terminal OUTb).

Figure 5B:
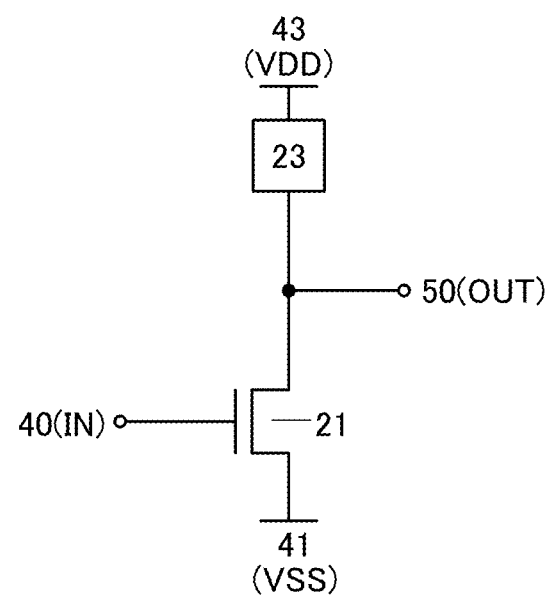

FIG. 5B is a diagram illustrating a circuit configuration in which the transistor 22 and the wiring 42 are omitted from the circuit illustrated in FIG. 5A. In the circuit having the configuration illustrated in FIG. 5B, the terminal 50 is electrically connected to one of a source and a drain of the transistor 21 and the load 23.

First, the configuration illustrated in FIG. 5B is considered. In the case illustrated in FIG. 5B, the transistor 21 is an n-channel transistor. The potential of the wiring 43 electrically connected to one of the source and the drain of the transistor 21 through the load 23 is a high potential, and the potential of the wiring 41 electrically connected to the other of the source and the drain of the transistor 21 is a low potential. Thus, one of the source and the drain of the transistor 21 can be a drain, and the other of the source and the drain of the transistor 21 can be a source.

In the case illustrated in FIG. 5B, since the source potential of the transistor 21 is fixed at a low potential, an increase in the potential of the input terminal IN increases the voltage Vgs which is a difference between the gate potential and the source potential of the transistor 21. Accordingly, the on resistance of the transistor 21 is decreased, leading to a reduction in the voltage Vds which is the difference between the drain potential and source potential of the transistor 21. Since the source potential of the transistor 21 is fixed at a low potential as described above, the drain potential of the transistor 21 is decreased. Here, in the case of the operation of the transistor 21 in a linear region, the transconductance gm (Ids/Vgs, Ids is a drain current) of the transistor 21 is lower than that in the case of the operation in a saturation region, and therefore the amplification factor (also referred to as "gain") of the potential of a signal output from the output terminal OUT with respect to the potential of a signal input from the input terminal IN is decreased. Hence, the transistor 21 is preferably operated in a saturation region. As described above, since an excessive increase in the potential of the input terminal IN significantly reduces the voltage Vds to cause the transistor 21 to be operated in a linear region, the potential of the input terminal IN must be a value less than or equal to a predetermined value to operate the transistor 21 in a saturation region.

Next, the case illustrated in FIG. 5A is considered. Also in the case illustrated in FIG. 5A, as in the case illustrated in FIG. 5B, the transistor 21 is an n-channel transistor, where one of the source and the drain of the transistor 21 can be a drain and the other of the source and the drain of the transistor 21 can be a source. In addition, one of a source and a drain of the transistor 22 can be a source and the other of the source and the drain of the transistor 22 can be a drain.

In the case illustrated in FIG. 5A, when the potential of the input terminal IN is increased, the on resistance of the transistor 21 is decreased. Here, the transistor 21 and the transistor 22 are connected in series. Therefore, the amount of drain current of the transistor 21 is equal to the amount of drain current of the transistor 22. Thus, the amount of the difference between the gate potential of the transistor 22 (the bias potential Vb) and the source potential of the transistor 22 (the drain potential of the transistor 21) corresponds to the difference between the gate potential of the transistor 21 (the potential of the input terminal IN) and the source potential of the transistor 21 (the low potential). For example, in the case where the electrical characteristics of the transistor 22 are equal to the electrical characteristics of the transistor 21, the difference between the gate potential and the source potential of the transistor 22 is equal to the difference between the gate potential and the source potential of the transistor 21. Here, for example, when the transistor 21 and the transistor 22 are equal in all of channel length, channel width, constituent material, and the like, the transistor 21 and the transistor 22 are equal in electrical characteristics.

As described above, even when the on resistance of the transistor 21 is decreased, the voltage Vds which is the difference between the drain potential and the source potential of the transistor 21 is not so decreased as that in the case illustrated in FIG. 5B. Accordingly, the upper limit value of the potential of the input terminal IN for operating the transistor 21 in the saturation region is larger than that in the case illustrated in FIG. 5B. Thus, when the amplifier circuit 20 includes the transistor 22 which can function as a bias transistor, the amplitude of the signal that can be input to the input terminal IN can be increased. Accordingly, the amplitude of the signal that can be transmitted and received by the communication device 10 can be increased.

Next, the case where signals are input to the terminal 50a and the terminal 50b is described. In this case, as illustrated in FIG. 4B, the potential of the wiring 42 is a low potential and the potential of the wiring 52 is a bias potential. This brings the transistor 22a and the transistor 22b into an off state. By contrast, the transistor 32a and the transistor 32b function as bias transistors.

As illustrated in FIG. 4B, the transistor 22a and the transistor 22b are in an off state and therefore do not contribute to the transmission of a signal from the input terminal INa to the output terminal OUTa and the transmission of a signal from the input terminal INb to the output terminal OUTb. Furthermore, since the transistor 22a and the transistor 22b are in an off state, current does not flow also into the transistor 21a and the transistor 21b, and therefore the transistor 21a and the transistor 21b do not contribute to the transmission of a signal from the input terminal INa to the output terminal OUTa and the transmission of a signal from the input terminal INb to the output terminal OUTb. The load 23a, which is electrically connected to the other of the source and the drain of the transistor 22a in an off state, and the load 23b, which is electrically connected to the other of the source and the drain of the transistor 22b in an off state, also do not contribute to the transmission of a signal from the input terminal INa to the output terminal OUTa and the transmission of a signal from the input terminal INb to the output terminal OUTb. As described above, in FIG. 4B, the dotted lines indicate the transistor 21a, the transistor 21b, the transistor 22a, the transistor 22b, the load 23a, and the load 23b and parts of the circuit and wiring that are electrically connected to these.

FIG. 6A1 to FIG. 6A4 are diagrams illustrating configuration examples of the load 23. Note that the wiring 43 and the terminal 50 are also illustrated for convenience of explanation in FIG. 6A1 to FIG. 6A4.

As illustrated in FIG. 6A1, the load 23 may include a resistor. As illustrated in FIG. 6A2, the load 23 may include a transistor. As illustrated in FIG. 6A3, the load 23 may include a transistor and a gate of the transistor may be electrically connected to the terminal 50. As illustrated in FIG. 6A4, the load 23 may include a transistor and a gate of the transistor may be electrically connected to the wiring 43. The transistor included in the load 23 is a p-channel transistor in FIG. 6A2 and FIG. 6A3 and the transistor included in the load 23 is an n-channel transistor in FIG. 6A4; however, one embodiment of the present invention not limited thereto. Even in the case where the load 23 is as illustrated in FIG. 6A2 and FIG. 6A3, the transistor included in the load 23 may be an n-channel transistor. Even in the case where the load 23 is as illustrated in FIG. 6A4, the transistor included in the load 23 may be a p-channel transistor.

A passive element may be provided between the transistor 21 and the wiring 41. For example, an inductor 101 may be provided as illustrated in FIG. 6B1. In the configuration illustrated in FIG. 6B1, one terminal of the inductor 101 is electrically connected to the other of the source and the drain of the transistor 21, and the other terminal of the inductor 101 is electrically connected to the wiring 41.

As illustrated in FIG. 6B2, the inductor 101 and the capacitor 102 may be provided. In the configuration illustrated in FIG. 6B2, one terminal of the inductor 101 and one terminal of the capacitor 102 are electrically connected to the other of the source and the drain of the transistor 21. The other terminal of the inductor 101 and the other terminal of the capacitor 102 are electrically connected to the wiring 41.

The explanation referring to FIG. 5A, FIG. 5B, FIG. 6A1 to FIG. 6A4, FIG. 6B1, and FIG. 6B2 can also apply to the case illustrated in FIG. 4B in such a manner that the transistor 21 is replaced with the transistor 31 (the transistor 31a or the transistor 31b), the transistor 22 is replaced with the transistor 32 (the transistor 32a or the transistor 32b), the load 23 is replaced with the load 33 (the load 33a or the load 33b), the terminal 40 is replaced with the terminal 50, the wiring 41 is replaced with the wiring 51, the wiring 42 is replaced with the wiring 52, the wiring 43 is replaced with the wiring 53, and the terminal 50 is replaced with the terminal 40. The circuit having the configuration illustrated in FIG. 5A can also apply to a semiconductor device other than a communication device. For example, the circuit can be used as part of an operational amplifier.

As illustrated in FIG. 4A and FIG. 4B, changing the potential of the wiring 42 can change whether the state between the wiring 41 and the terminal 50a and the terminal 50b is conducting or non-conducting. Changing the potential of the wiring 52 can change whether the state between the wiring 51 and the terminal 40a and the terminal 40b is conducting or non-conducting. Thus, the amplifier circuit 20 can be operated normally even without the switch 24 illustrated in FIG. 7A1 and the switch 34 illustrated in FIG. 7A2. Specifically, when a signal is input to the terminal 40a and the terminal 40b, a signal corresponding to the signal can be output from the terminal 50a and the terminal 50b. When a signal is input to the terminal 50a and the terminal 50b, a signal corresponding to the signal can be output from the terminal 40a and the terminal 40b. Note that the switch 24 and the switch 34 may be provided. In that case, the potential of the wiring 42 and the potential of the wiring 52 can each be fixed to the bias potential Vb.

A transistor 28 may be provided as the switch 24 and a transistor 38 may be provided as the switch 34. In this case, as illustrated in FIG. 7B1, one of a source and a drain of the transistor 28 can be electrically connected to the other of the source and the drain of the transistor 21a and the other of the source and the drain of the transistor 21b, and the other of the source and the drain of the transistor 28 can be electrically connected to the wiring 41. As illustrated in FIG. 7B2, one of a source and a drain of the transistor 38 can be electrically connected to the other of the source and the drain of the transistor 31a and the other of the source and the drain of the transistor 31b, and the other of the source and the drain of the transistor 38 can be electrically connected to the wiring 51. In the case where the amplifier circuit 20 includes the transistor 28 and the transistor 38, a gate of the transistor 28 can be electrically connected to the wiring 42 and a gate of the transistor 38 can be electrically connected to the wiring 52 as illustrated in FIG. 7B1 and FIG. 7B2. In this case, the potential of the wiring 42 can be the bias potential Vb or a low potential.

Figure 8A:
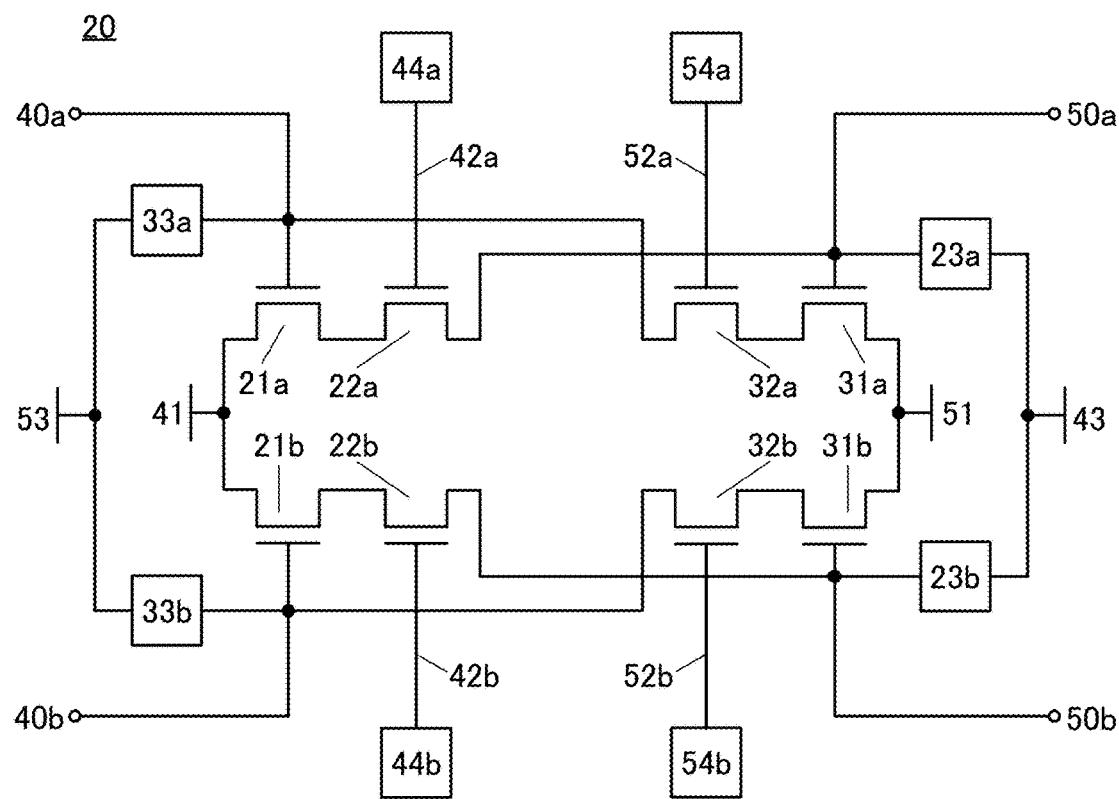
FIG. 8A and FIG. 8B are circuit diagrams illustrating configuration examples of a communication device.

FIG. 8A is a diagram showing a configuration example of the amplifier circuit 20, which is a modification example of the configuration illustrated in FIG. 2. The amplifier circuit 20 in the having the configuration illustrated in FIG. 8A differs from the amplifier circuit 20 having the configuration illustrated in FIG. 2 in that the gate of the transistor 22a and a gate of the transistor 22b are electrically connected to different wirings and the gate of the transistor 32a and the gate of the transistor 32b are electrically connected to different wirings.

In the amplifier circuit 20 having the configuration illustrated in FIG. 8A, the gate of the transistor 22a and a potential generation circuit 44a are electrically connected to each other through a wiring 42a. In addition, the gate of the transistor 22b and a potential generation circuit 44b are electrically connected to each other through a wiring 42b. The gate of the transistor 32a and a potential generation circuit 54a are electrically connected to each other through a wiring 52a. The gate of the transistor 32b and a potential generation circuit 54b are electrically connected to each other through a wiring 52b.

In the amplifier circuit 20 having the configuration illustrated in FIG. 8A, a potential supplied to the wiring 42a can be generated by the potential generation circuit 44a and a potential supplied to the wiring 42b can be generated by the potential generation circuit 44b. A potential supplied to the wiring 52a can be generated by the potential generation circuit 54a and a potential supplied to the wiring 52b can be generated by the potential generation circuit 54b.

Figure 8B:
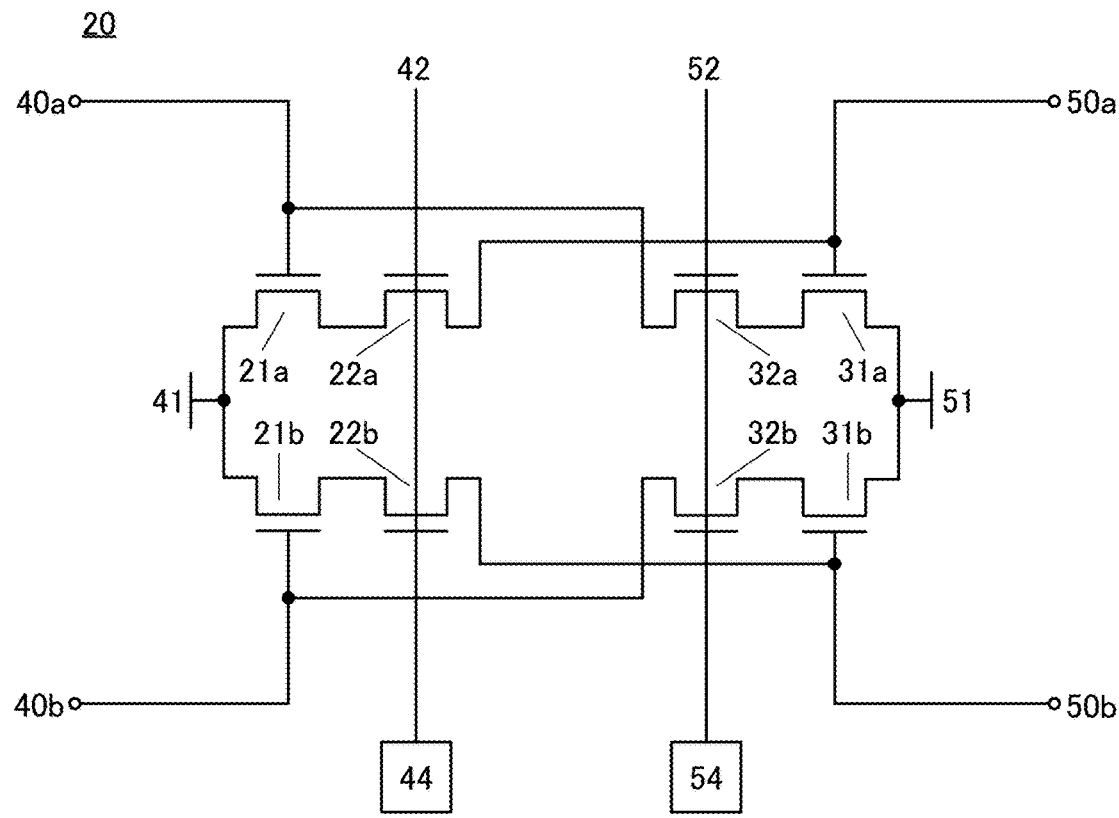

FIG. 8B is a diagram showing a configuration example of the amplifier circuit 20, which is a modification example of the configuration illustrated in FIG. 2. The amplifier circuit 20 having the configuration illustrated in FIG. 8B differs from the amplifier circuit 20 having the configuration illustrated in FIG. 2 in that the load 23a, the load 23b, the load 33a, the load 33b, the wiring 43, and the wiring 53 are not provided.

Figure 9A:
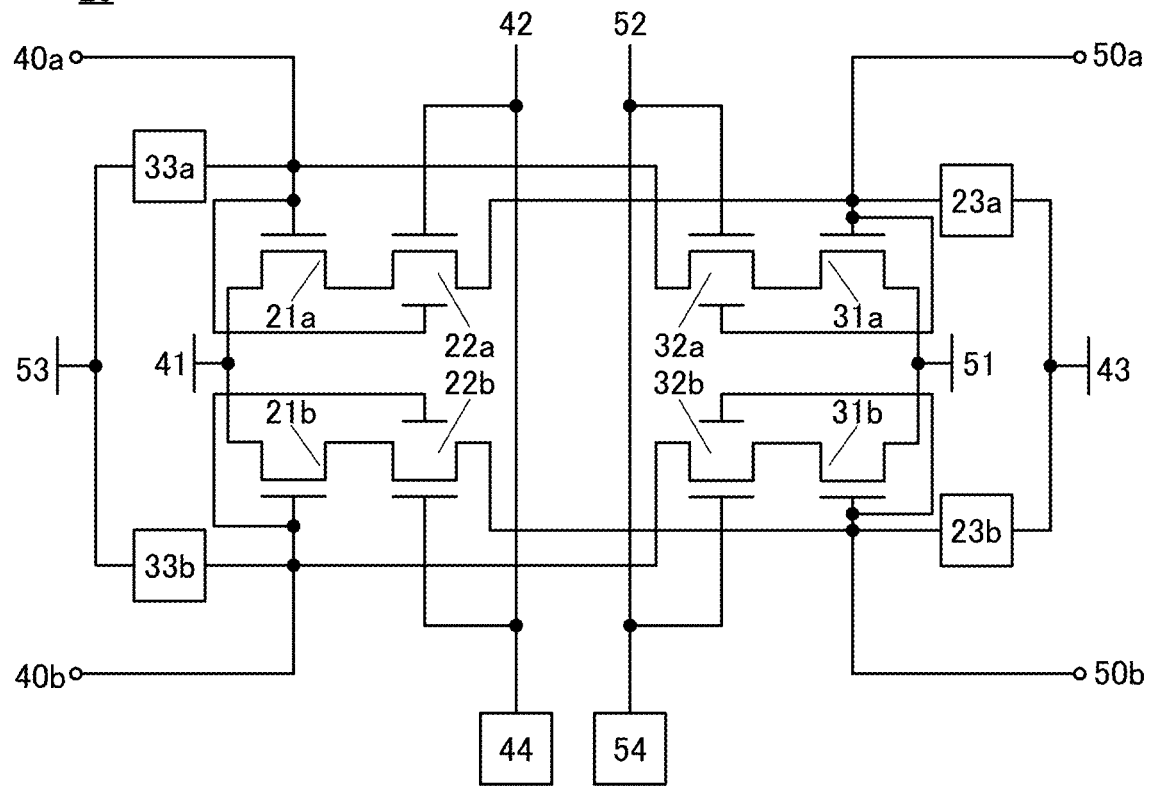
FIG. 9A is a circuit diagram illustrating a configuration example of a communication device.

FIG. 9A is a diagram showing a configuration example of the amplifier circuit 20, which is a modification example of the configuration illustrated in FIG. 2. The amplifier circuit 20 having the configuration illustrated in FIG. 9A differs from the amplifier circuit 20 having the configuration illustrated in FIG. 2 in that the transistor 22a, the transistor 22b, the transistor 32a, and the transistor 32b are each provided with a back gate.

In this specification and the like, when the term "gate" is used alone, it refers to a front gate in some cases or one or both of a front gate and a back gate in other cases.

The back gate of the transistor 22a is electrically connected to the terminal 40a. The back gate of the transistor 22b is electrically connected to the terminal 40b. The back gate of the transistor 32a is electrically connected to the terminal 50a. The back gate of the transistor 32b is electrically connected to the terminal 50b.

Figure 9B:
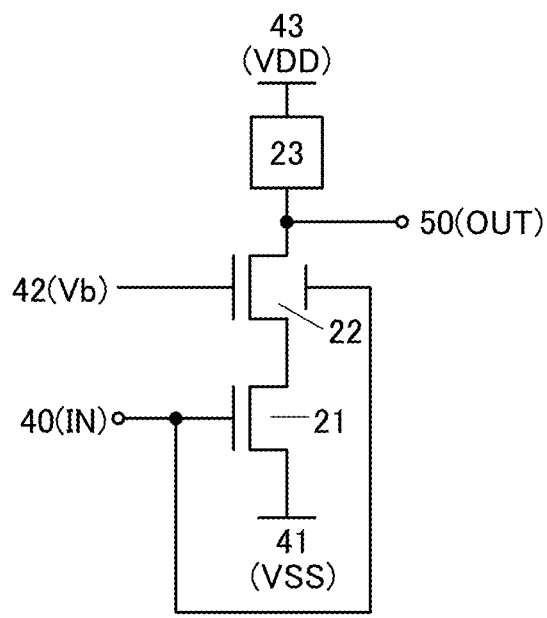
FIG. 9B is a diagram illustrating a configuration example of a semiconductor device.

FIG. 9B is a diagram of the transistor 21, the transistor 22, the load 23, the terminal 40, the wiring 41, the wiring 42, the wiring 43, and the terminal 50 excerpted from FIG. 9A. Note that the terminal 40 is the input terminal IN and the terminal 50 is the output terminal OUT.

In the case illustrated in FIG. 9B, an increase in the potential of the input terminal IN increases the voltage Vgs which is the difference between the gate potential of the transistor 21 (the potential of the input terminal IN) and the source potential of the transistor 21 (the low potential), so that the on resistance of the transistor 21 is decreased and the drain current of the transistor 21 is increased. Accordingly, the drain current of the transistor 22 connected in series to the transistor 21 is also increased. Here, since the back gate of the transistor 22 is electrically connected to the input terminal IN, the threshold voltage of the transistor 22 is decreased with increasing the potential of the input terminal IN. Thus, for example, even when the transistor 21 and the transistor 22 are equal in all of channel length, channel width, constituent material, and the like, the increase amount of the difference between the gate potential and source potential of the transistor 22 with an increase in the potential of the input terminal IN can be made smaller than the increase amount of the difference between the gate potential and source potential of the transistor 21.

The above can inhibit the decrease in the drain potential of the transistor 21 (the source potential of the transistor 22) with the increase in the potential of the input terminal IN, which can inhibit the decrease in voltage Vds which is the difference between the drain potential and source potential of the transistor 21. Accordingly, the upper limit value of the potential of the input terminal IN for operating the transistor 21 in the saturation region can be increased. Thus, the amplitude of the signal that can be input to the input terminal IN can be increased. This can increase the amplitude of the signal that can be transmitted and received by the communication device 10.

The circuit having the configuration illustrated in FIG. 9B can also apply to a semiconductor device other than a communication device. For example, the circuit can be used as part of an amplifier circuit included in an operational amplifier.

Figure 10:
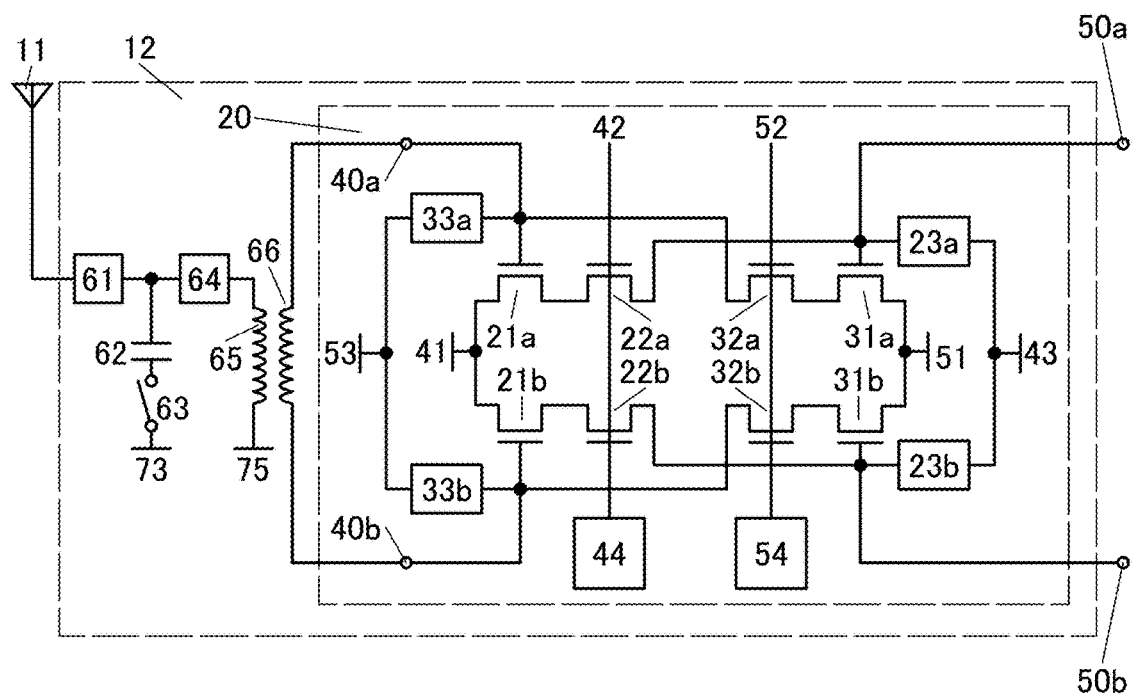
FIG. 10 is a circuit diagram illustrating a configuration example of a communication device.

FIG. 10 is a diagram illustrating a configuration example of the amplifier 12. Note that the antenna 11 is also illustrated in FIG. 10 for convenience of explanation.

The amplifier 12 can include a phase shifter 61, a capacitor 62, a switch 63, a phase shifter 64, an inductor 65, and an inductor 66 in addition to the amplifier circuit 20. Here, the inductor 65 and the inductor 66 are provided to face each other.

In FIG. 10, the amplifier circuit 20 is present in the configuration illustrated in FIG. 2. The configuration of the amplifier circuit 20 included in the amplifier 12 may be another configuration described in this embodiment. The amplifier circuit 20 included in the amplifier 12 may have a configuration described in the following embodiments.

The antenna 11 is electrically connected to one terminal of the phase shifter 61. The other terminal of the phase shifter 61 is electrically connected to one terminal of the capacitor 62. One terminal of the capacitor 62 is electrically connected to one terminal of the phase shifter 64. The other terminal of the capacitor 62 is electrically connected to one terminal of the switch 63. The other terminal of the switch 63 is electrically connected to a wiring 73. The other terminal of the phase shifter 64 is electrically connected to one terminal of the inductor 65. The other terminal of the inductor 65 is electrically connected to a wiring 75. One terminal of the inductor 66 is electrically connected to the terminal 40a. The other terminal of the inductor 66 is electrically connected to the terminal 40b.

The wiring 73 and the wiring 75 each have a function of a power supply line. The potential of the wiring 73 and the potential of the wiring 75 can each be a low potential or a ground potential, for example.

The configurations, structures, methods, and the like described in this embodiment can be used in combination as appropriate with the structures, configurations, methods, and the like described in the other embodiments and the like.

Embodiment 2

In this embodiment, a modification example of the communication device described in Embodiment 1 is described. Specifically, a modification example of the amplifier circuit 20 is described. Note that in this embodiment, description of a configuration and the like similar to those of the communication device described in Embodiment 1 is omitted as appropriate.

Figure 11:
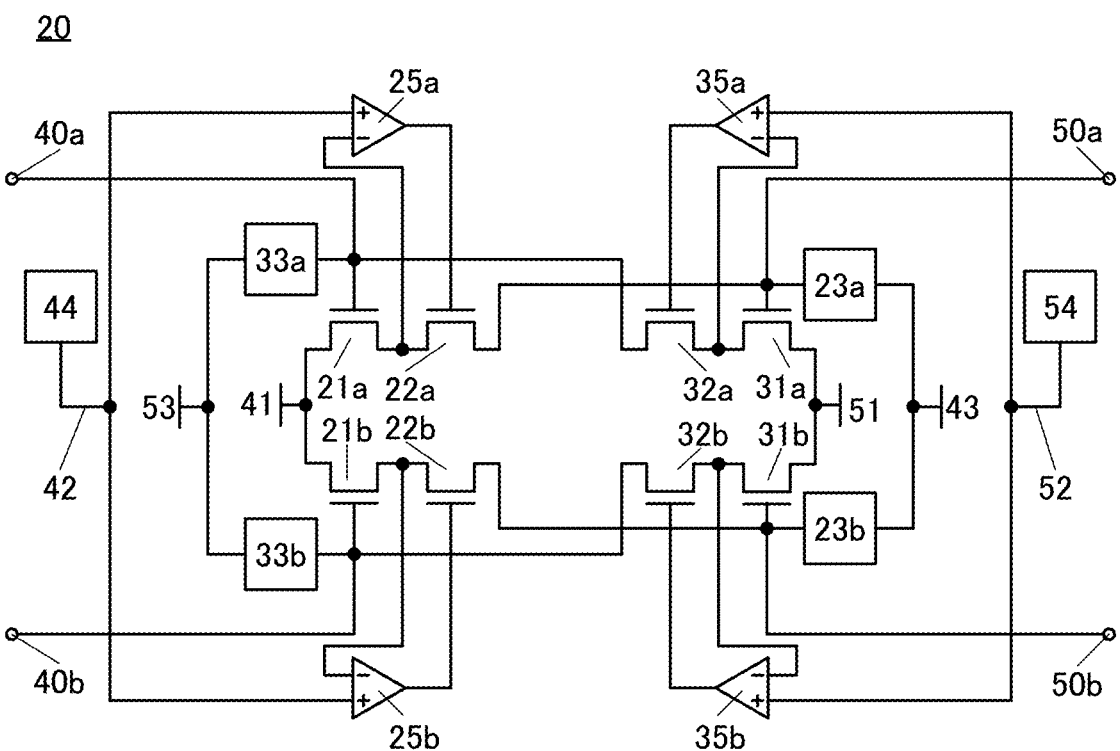
FIG. 11 is a circuit diagram illustrating a configuration example of a communication device.

FIG. 11 is a diagram illustrating a configuration example of the amplifier circuit 20, which is a modification example of the configuration illustrated in FIG. 2. The amplifier circuit 20 having the configuration illustrated in FIG. 11 differs from the amplifier circuit 20 illustrated in FIG. 2 in including an operational amplifier 25a, an operational amplifier 25b, an operational amplifier 35a, and an operational amplifier 35b.

Figure 12:
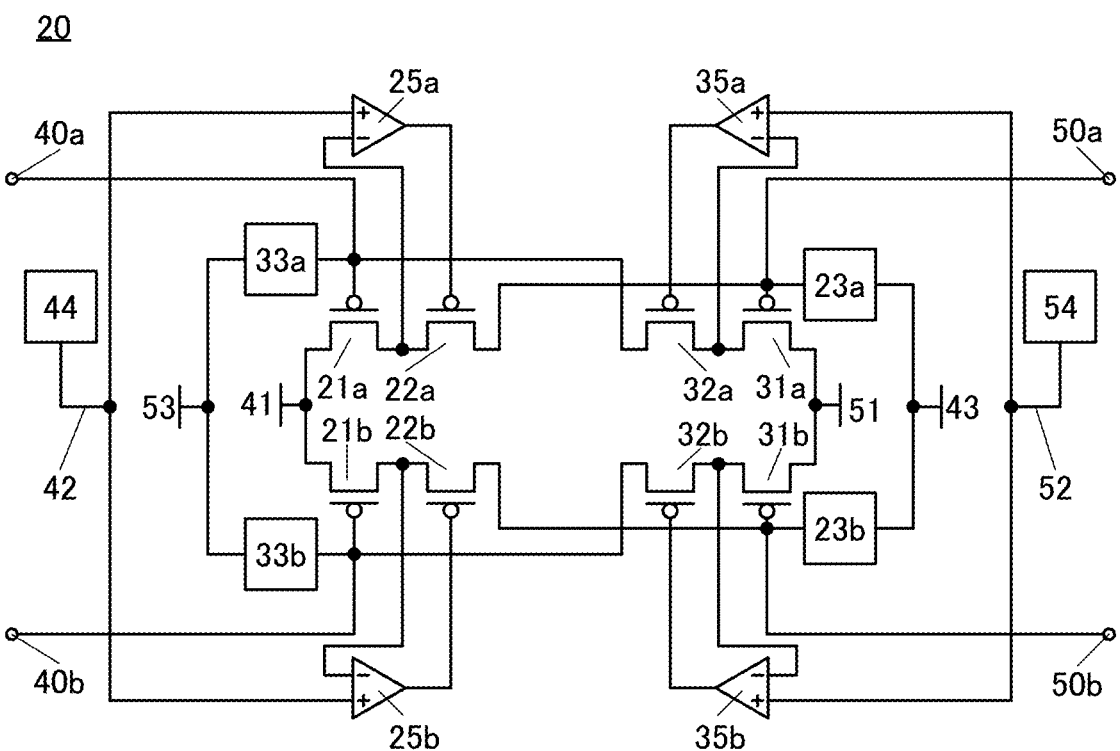
FIG. 12 is a circuit diagram illustrating a configuration example of a communication device.

In FIG. 11, the transistor 21a, the transistor 21b, the transistor 22a, the transistor 22b, the transistor 31a, the transistor 31b, the transistor 32a, and the transistor 32b are all n-channel transistors. However, any or all of the above transistors may be p-channel transistors. For example, as illustrated in FIG. 12, the transistor 21a, the transistor 21b, the transistor 22a, the transistor 22b, the transistor 31a, the transistor 31b, the transistor 32a, and the transistor 32b may be all p-channel transistors.

One of the source and the drain of the transistor 21a is electrically connected to one of the source and the drain of the transistor 22a. One of the source and the drain of the transistor 21b is electrically connected to one of the source and the drain of the transistor 22b. One of the source and the drain of the transistor 31a is electrically connected to one of the source and the drain of the transistor 32a. One of the source and the drain of the transistor 31b is electrically connected to one of a source and a drain of the transistor 32b.

The other of the source and the drain of the transistor 21a and the other of the source and the drain of the transistor 21b are each electrically connected to the wiring 41. The other of the source and the drain of the transistor 31a and the other of the source and the drain of the transistor 31b are electrically connected to the wiring 51.

The potential generation circuit 44 is electrically connected to the wiring 42. The potential generation circuit 54 is electrically connected to the wiring 52.

A non-inverting input terminal of the amplifier 25a and a non-inverting input terminal of the operational amplifier 25b are electrically connected to the wiring 42. A non-inverting input terminal of the amplifier 35a and a non-inverting input terminal of the operational amplifier 35b are electrically connected to the wiring 52. An inverting input terminal of the operational amplifier 25a is electrically connected to one of the source and the drain of the transistor 21a and one of the source and the drain of the transistor 22a. An inverting input terminal of the operational amplifier 25b is electrically connected to one of the source and the drain of the transistor 21b and one of the source and the drain of the transistor 22b. An inverting input terminal of the operational amplifier 35a is electrically connected to one of the source and the drain of the transistor 31a and one of the source and the drain of the transistor 32a. An inverting input terminal of the operational amplifier 35b is electrically connected to one of the source and the drain of the transistor 31b and one of the source and the drain of the transistor 32b. An output terminal of the operational amplifier 25a is electrically connected to the gate of the transistor 22a. An output terminal of the operational amplifier 25b is electrically connected to the gate of the transistor 22b. An output terminal of the operational amplifier 35a is electrically connected to the gate of the transistor 32a. An output terminal of the operational amplifier 35b is electrically connected to the gate of the transistor 32b.

The terminal 40a is electrically connected to the gate of the transistor 21a, the other of the source and the drain of the transistor 32a, and the load 33a. The terminal 40b is electrically connected to the gate of the transistor 21b, the other of the source and the drain of the transistor 32b, and the load 33b. The terminal 50a is electrically connected to the gate of the transistor 31a, the other of the source and the drain of the transistor 22a, and the load 23a. The terminal 50b is electrically connected to the gate of the transistor 31b, the other of the source and the drain of the transistor 22b, and the load 23b. The load 23a and the load 23b are electrically connected to the wiring 43. The load 33a and the load 33b are electrically connected to the wiring 53.

In an operational amplifier, the potential of the output terminal changes so that the potential of the non-inverting input terminal is equal to the potential of the inverting input terminal. For this reason, when a predetermined potential is supplied to the non-inverting input terminal of the operational amplifier, the potential of the output terminal of the operational amplifier becomes a potential corresponding to the above predetermined potential. Thus, when a bias potential is supplied to the wiring 42, the transistor 22a and the transistor 22b function as bias transistors. When a bias potential is supplied to the wiring 52, the transistor 32a and the transistor 32b function as bias transistors. Here, as described above, the bias potential can be a potential at which a transistor functioning as a bias transistor can operate in a saturation region.

Figure 13A:
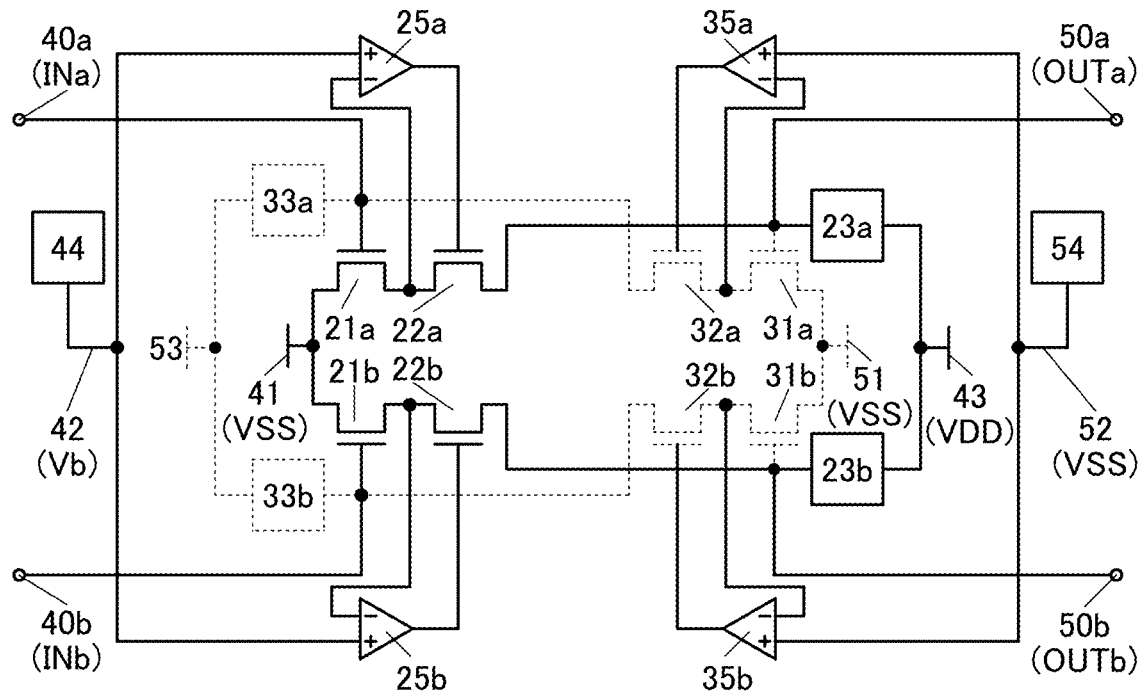
FIG. 13A and FIG. 13B are circuit diagrams illustrating examples of an operation method of a communication device.
Figure 13B:
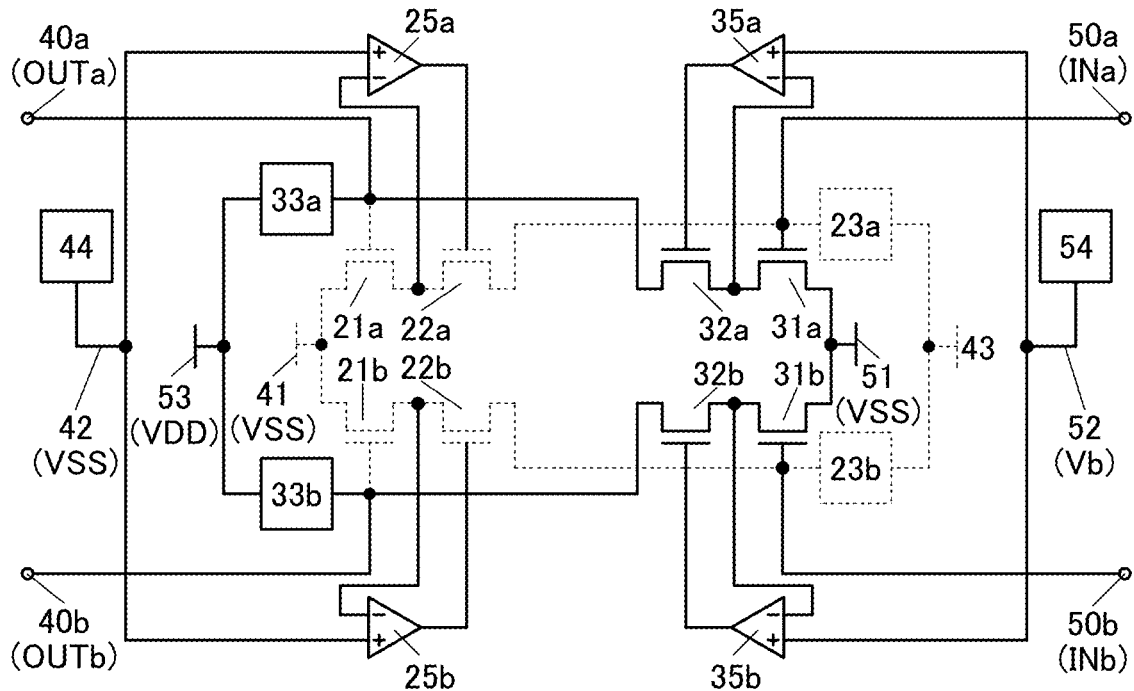

Examples of operation methods of the amplifier circuit 20 having the configuration illustrated in FIG. 11 are described using FIG. 13A and FIG. 13B. FIG. 13A illustrates an example of an operation method of the amplifier circuit 20 having the configuration illustrated in FIG. 11 where the terminal 40a is an input terminal INa, the terminal 40b is an input terminal INb, the terminal 50a is an output terminal OUTa, and the terminal 50b is an output terminal OUTb. FIG. 13B illustrates an example of an operation method of the amplifier circuit 20 having the configuration illustrated in FIG. 11 where the terminal 50a is an input terminal INa, the terminal 50b is an input terminal INb, the terminal 40a is an output terminal OUTa, and the terminal 40b is an output terminal OUTb. Here, a signal having a phase opposite to that of the signal input to the input terminal INa can be input to the input terminal INb.

Figure 14A:
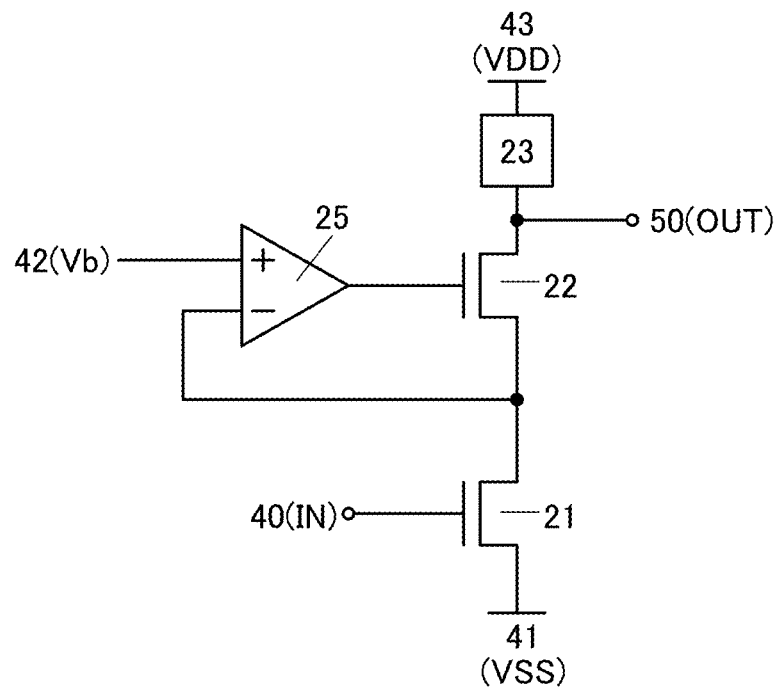
FIG. 14A and FIG. 14B are circuit diagrams illustrating configuration examples of a semiconductor device.

FIG. 14A is a diagram of the transistor 21 (the transistor 21a or the transistor 21b), the transistor 22 (the transistor 22a or the transistor 22b), the load 23 (the load 23a or the load 23b), the operational amplifier 25 (the operational amplifier 25a or the operational amplifier 25b), the terminal 40 (the terminal 40a or the terminal 40b), the wiring 41, the wiring 42, the wiring 43, and the terminal 50 (the terminal 50a or the terminal 50b) excerpted from FIG. 13A. Note that the terminal 40 is the input terminal IN (the input terminal INa or the input terminal INb) and the terminal 50 is the output terminal OUT (the output terminal OUTa or the output terminal OUTb).

Figure 14B:
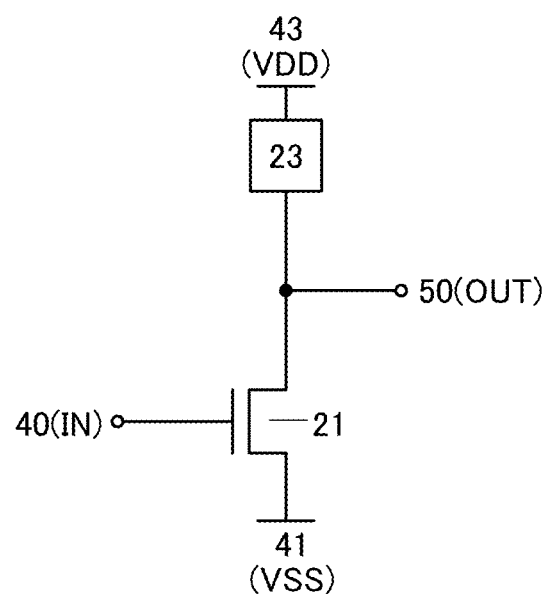

FIG. 14B is a diagram illustrating a circuit configuration in which the transistor 22, the operational amplifier 25, and the wiring 42 are omitted from the circuit illustrated in FIG. 14A. In the circuit having the configuration illustrated in FIG. 14B, the terminal 50 is electrically connected to one of a source and a drain of the transistor 21 and the load 23.

The configuration illustrated in FIG. 14B is similar to the configuration illustrated in FIG. 5B. In the configuration illustrated in FIG. 14B, the potential of the input terminal IN for operating the transistor 21 in the saturation region needs to have a value less than or equal to the predetermined value, as described in the explanation of FIG. 5B.

Next, the case illustrated in FIG. 14A is considered. Also in the case illustrated in FIG. 14A, as in the cases illustrated in FIG. 5B and FIG. 14B, the transistor 21 is an n-channel transistor, where one of the source and the drain of the transistor 21 can be a drain and the other of the source and the drain of the transistor 21 can be a source. In addition, one of the source and the drain of the transistor 22 can be a source and the other of the source and the drain of the transistor 22 can be a drain.

In the case illustrated in FIG. 14A, when the potential of the input terminal IN is increased, the on resistance of the transistor 21 is decreased. However, the drain of the transistor 21 is electrically connected to the inverting input terminal of the operational amplifier 25, and the bias potential Vb is supplied to the non-inverting input terminal of the operational amplifier 25. Thus, the decrease in the drain potential of the transistor 21 can be inhibited even when the on resistance of the transistor 21 is decreased. For example, the drain potential of the transistor 21 can be the bias potential Vb. Accordingly, the upper limit value of the potential of the input terminal IN for operating the transistor 21 in the saturation region is larger than that in the case illustrated in FIG. 14B. Thus, when the amplifier circuit 20 includes the transistor 22 which can function as a bias transistor and the operational amplifier 25, the amplitude of the signal that can be input to the input terminal IN can be increased. Accordingly, the amplitude of the signal that can be transmitted and received by the communication device 10 can be increased.

Figure 15A:
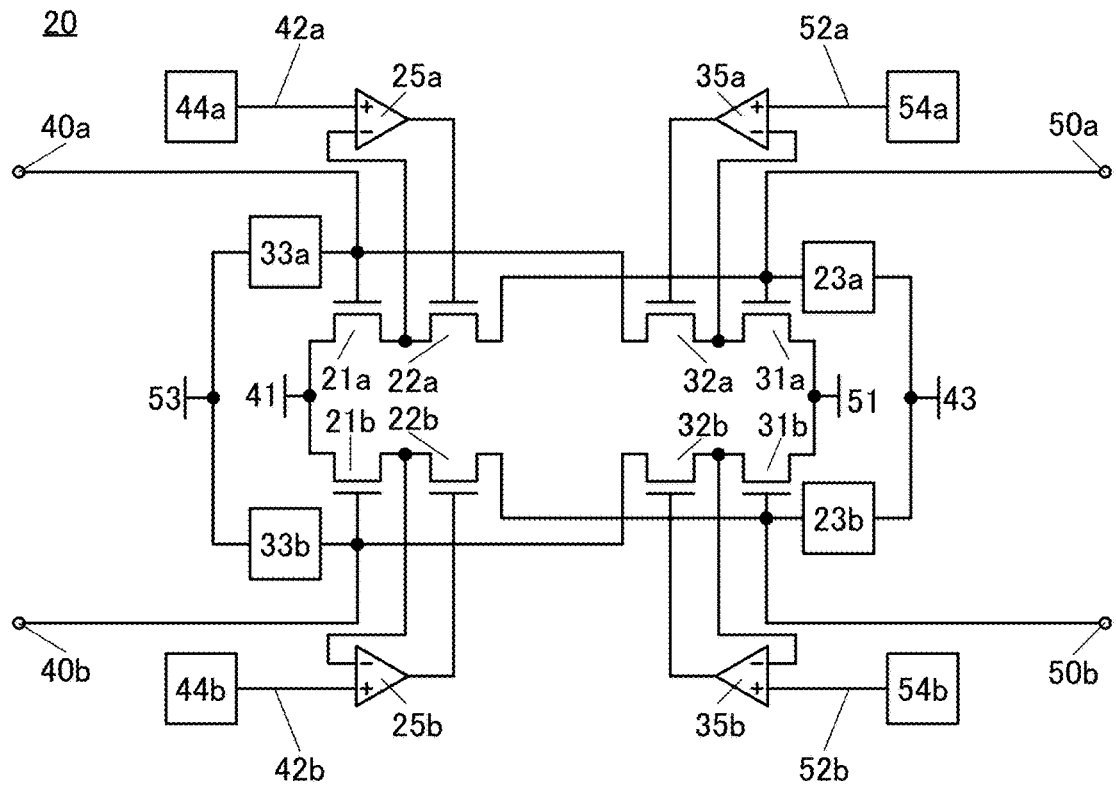
FIG. 15A and FIG. 15B are circuit diagrams illustrating configuration examples of a communication device.

FIG. 15A is a diagram illustrating a configuration example of the amplifier circuit 20, which is a modification example of the configuration illustrated in FIG. 11. The amplifier circuit 20 having the configuration illustrated in FIG. 15A differs from the amplifier circuit 20 having the configuration illustrated in FIG. 11 in that the non-inverting input terminal of the operational amplifier 25a and the non-inverting input terminal of the operational amplifier 25b are electrically connected to different wirings and the non-inverting input terminal of the operational amplifier 35a and the non-inverting input terminal of the operational amplifier 35b are electrically connected to different wirings.

In the amplifier circuit 20 having the configuration illustrated in FIG. 15A, the non-inverting input terminal of the operational amplifier 25a and the potential generation circuit 44a are electrically connected to each other through the wiring 42a. In addition, the non-inverting input terminal of the operational amplifier 25b and the potential generation circuit 44b are electrically connected to each other through the wiring 42b. The non-inverting input terminal of the operational amplifier 35a and the potential generation circuit 54a are electrically connected to each other through the wiring 52a. The non-inverting input terminal of the operational amplifier 35b and the potential generation circuit 54b are electrically connected to each other through the wiring 52b.

Figure 15B:
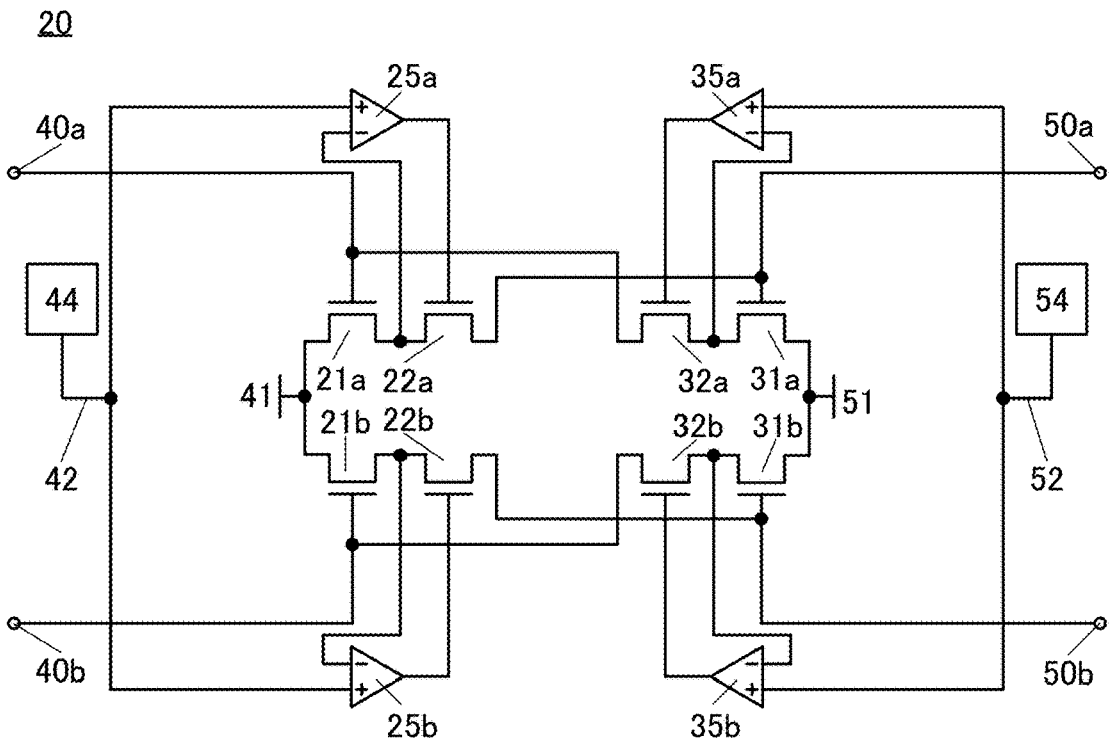

FIG. 15B is a diagram showing a configuration example of the amplifier circuit 20, which is a modification example of the configuration illustrated in FIG. 11. The amplifier circuit 20 having the configuration illustrated in FIG. 15B differs from the amplifier circuit 20 having the configuration illustrated in FIG. 11 in that the load 23a, the load 23b, the load 33a, the load 33b, the wiring 43, and the wiring 53 are not provided.

Figure 16A:
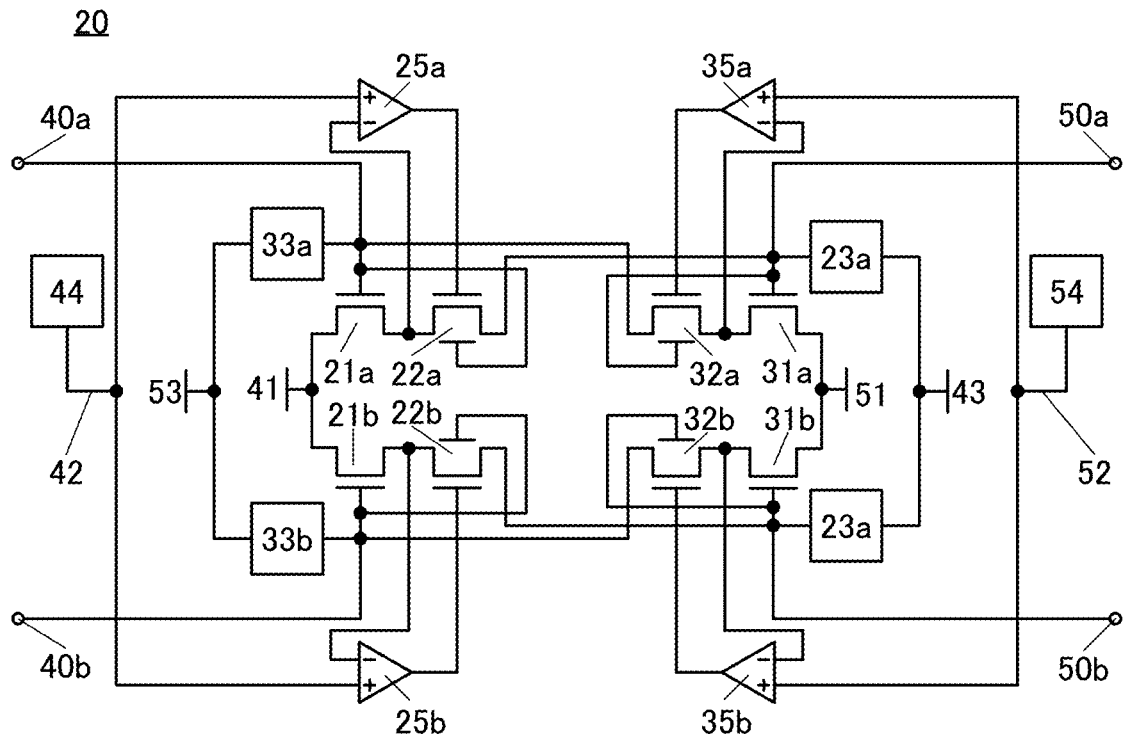
FIG. 16A is a circuit diagram illustrating a configuration example of a communication device.

FIG. 16A is a diagram showing a configuration example of the amplifier circuit 20, which is a modification example of the configuration illustrated in FIG. 11. The amplifier circuit 20 having the configuration illustrated in FIG. 16A differs from the amplifier circuit 20 having the configuration illustrated in FIG. 11 in that the transistor 22a, the transistor 22b, the transistor 32a, and the transistor 32b are each provided with a back gate.

The back gate of the transistor 22a is electrically connected to the terminal 40a. The back gate of the transistor 22b is electrically connected to the terminal 40b. The back gate of the transistor 32a is electrically connected to the terminal 50a. The back gate of the transistor 32b is electrically connected to the terminal 50b.

Figure 16B:
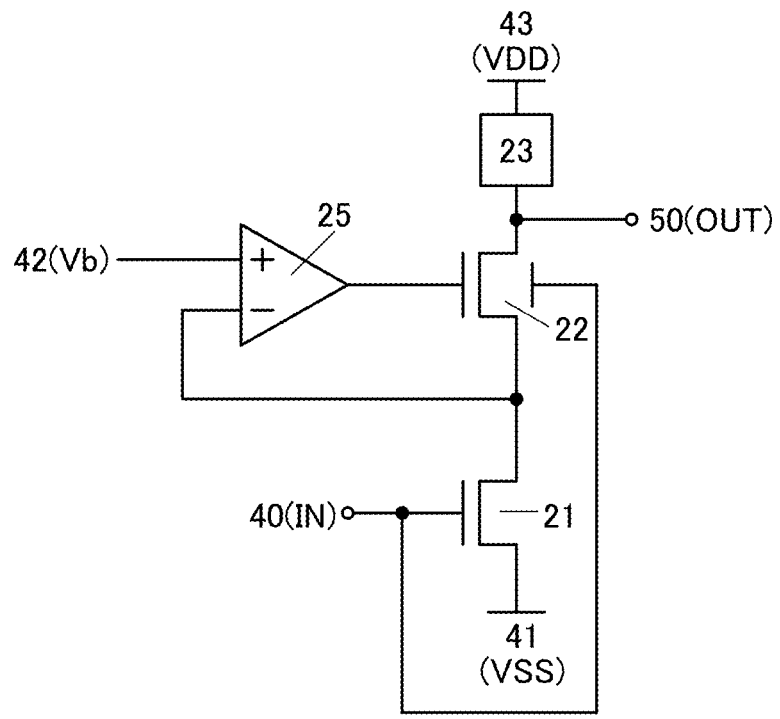
FIG. 16B is a circuit diagram illustrating a configuration example of a semiconductor device.

FIG. 16B is a diagram of the transistor 21, the transistor 22, the load 23, the operational amplifier 25, the terminal 40, the wiring 41, the wiring 42, the wiring 43, and the terminal 50 excerpted from FIG. 16A. Note that the terminal 40 is the input terminal IN and the terminal 50 is the output terminal OUT.

In the case illustrated in FIG. 16B, an increase in the potential of the input terminal IN increases the voltage Vgs which is the difference between the gate potential of the transistor 21 (the potential of the input terminal IN) and the source potential of the transistor 21 (the low potential), so that the on resistance of the transistor 21 is decreased and the drain current of the transistor 21 is increased. Accordingly, the drain current of the transistor 22 connected in series to the transistor 21 is also increased. Here, since the back gate of the transistor 22 is electrically connected to the input terminal IN, the threshold voltage of the transistor 22 is decreased with increasing the potential of the input terminal IN. Thus, for example, even when the transistor 21 and the transistor 22 are equal in all of channel length, channel width, constituent material, and the like, the increase amount of the difference between the gate potential and source potential of the transistor 22 with an increase in the potential of the input terminal IN can be made smaller than the increase amount of the difference between the gate potential and source potential of the transistor 21.

The above can inhibit the decrease in the drain potential of the transistor 21 (the source potential of the transistor 22) with the increase in the potential of the input terminal IN, which can inhibit the decrease in voltage Vds which is the difference between the drain potential and source potential of the transistor 21. Accordingly, the upper limit value of the potential of the input terminal IN for operating the transistor 21 in the saturation region can be increased. Thus, the amplitude of the signal that can be input to the input terminal IN can be increased. This can increase the amplitude of the signal that can be transmitted and received by the communication device 10.

The circuit having the configuration illustrated in FIG. 16B can also apply to a semiconductor device other than a communication device. For example, the circuit can be used as part of an amplifier circuit included in an operational amplifier.

Figure 17:
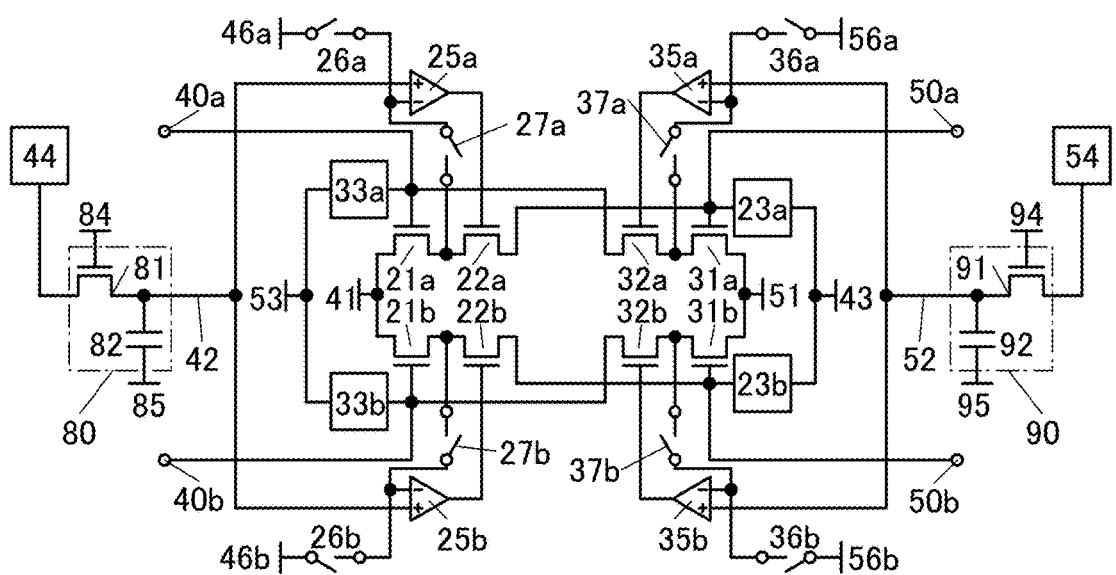
FIG. 17 is a circuit diagram illustrating a configuration example of a communication device.

FIG. 17 is a diagram illustrating a configuration example of the amplifier circuit 20. The amplifier circuit 20 illustrated in FIG. 17 includes a switch 26a, a switch 26b, a switch 27a, a switch 27b, a switch 36a, a switch 36b, a switch 37a, a switch 37b, a memory circuit 80, and a memory circuit 90, in addition to the transistor 21a, the transistor 21b, the transistor 22a, the transistor 22b, the load 23a, the load 23b, the operational amplifier 25a, the operational amplifier 25b, the transistor 31a, the transistor 31b, the transistor 32a, the transistor 32b, the load 33a, the load 33b, the operational amplifier 35a, the operational amplifier 35b, the terminal 40a, the terminal 40b, the potential generation circuit 44, the terminal 50a, the terminal 50b, and the potential generation circuit 54. Although the switches illustrated in FIG. 17 are all in an off state, their on/off is actually changed as appropriate in accordance with the operation of the amplifier circuit 20. The switches illustrated in FIG. 17 can be transistors, for example.

The memory circuit 80 can include a transistor 81 and a capacitor 82. The memory circuit 90 can include a transistor 91 and a capacitor 92.

One of the source and the drain of the transistor 21a is electrically connected to one of the source and the drain of the transistor 22a. One of the source and the drain of the transistor 22a is electrically connected to one terminal of the switch 27a. One of the source and the drain of the transistor 21b is electrically connected to one of the source and the drain of the transistor 22b. One of the source and the drain of the transistor 22b is electrically connected to one terminal of the switch 27b. One of the source and the drain of the transistor 31a is electrically connected to one of the source and the drain of the transistor 32a. One of the source and the drain of the transistor 32a is electrically connected to one terminal of the switch 37a. One of the source and the drain of the transistor 31b is electrically connected to one of the source and the drain of the transistor 32b. One of the source and the drain of the transistor 32b is electrically connected to one terminal of the switch 37b.

The other of the source and the drain of the transistor 21a and the other of the source and the drain of the transistor 21b are each electrically connected to the wiring 41. The other of the source and the drain of the transistor 31a and the other of the source and the drain of the transistor 31b are electrically connected to the wiring 51.

The non-inverting input terminal of the amplifier 25a and the non-inverting input terminal of the operational amplifier 25b are electrically connected to the wiring 42. The non-inverting input terminal of the amplifier 35a and the non-inverting input terminal of the operational amplifier 35b are electrically connected to the wiring 52. The inverting input terminal of the operational amplifier 25a is electrically connected to one terminal of the switch 26a and the other terminal of the switch 27a. The inverting input terminal of the operational amplifier 25b is electrically connected to one terminal of the switch 26b and the other terminal of the switch 27b. The inverting input terminal of the operational amplifier 35a is electrically connected to one terminal of the switch 36a and the other terminal of the switch 37a. The inverting input terminal of the operational amplifier 35b is electrically connected to one terminal of the switch 36b and the other terminal of the switch 37b. The output terminal of the operational amplifier 25a is electrically connected to the gate of the transistor 22a. The output terminal of the operational amplifier 25b is electrically connected to the gate of the transistor 22b. The output terminal of the operational amplifier 35a is electrically connected to the gate of the transistor 32a. The output terminal of the operational amplifier 35b is electrically connected to the gate of the transistor 32b.

The other terminal of the inductor 26a is electrically connected to a wiring 46a. The other terminal of the inductor 26b is electrically connected to a wiring 46b. The other terminal of the switch 36a is electrically connected to a wiring 56a. The other terminal of the switch 36b is electrically connected to a wiring 56b.

The terminal 40a is electrically connected to a gate of the transistor 21a, the other of the source and the drain of the transistor 32a, and the load 33a. The terminal 40b is electrically connected to a gate of the transistor 21b, the other of the source and the drain of the transistor 32b, and the load 33b. The terminal 50a is electrically connected to a gate of the transistor 31a, the other of the source and the drain of the transistor 22a, and the load 23a. The terminal 50b is electrically connected to a gate of the transistor 31b, the other of the source and the drain of the transistor 22b, and the load 23b. The load 23a and the load 23b are electrically connected to the wiring 43. The load 33a and the load 33b are electrically connected to the wiring 53.

The wiring 42 is electrically connected to the memory circuit 80. Specifically, the wiring 42 is electrically connected to one of a source and a drain of the transistor 81 and one terminal of the capacitor 82. The other of the source and the drain of the transistor 81 is electrically connected to the potential generation circuit 44, and a gate of the transistor 81 is electrically connected to a wiring 84. The other terminal of the capacitor 82 is electrically connected to a wiring 85.

The wiring 52 is electrically connected to the memory circuit 90. Specifically, the wiring 52 is electrically connected to one of a source and a drain of the transistor 91 and one terminal of the capacitor 92. The other of the source and the drain of the transistor 91 is electrically connected to the potential generation circuit 54, and a gate of the transistor 91 is electrically connected to a wiring 94. The other terminal of the capacitor 92 is electrically connected to the wiring 85.

The wiring 46a, the wiring 46b, the wiring 56a, the wiring 56b, the wiring 85, and the wiring 95 each have a function of a power supply line. For example, the potentials of the wiring 46a, the wiring 46b, the wiring 56a, the wiring 56b, the wiring 85, and the wiring 95 can be constant potentials. For example, the potentials of the wiring 46a, the wiring 46b, the wiring 56a, and the wiring 56b can be high potentials, and the potentials of the wiring 85 and the wiring 95 can be low potentials.

The memory circuit 80 has a function of holding the potential of the wiring 42. The memory circuit 90 has a function of holding the potential of the wiring 52. Continuing to supply a potential to the wiring 42 becomes unnecessary by providing the memory circuit 80, and continuing to supply a potential to the wiring 52 becomes unnecessary by providing the memory circuit 90. Thus, power consumption of the power amplifier circuit 20 can be reduced, and power consumption of the communication device 10 can be reduced accordingly.

The transistor 81 included in the memory circuit 80 has a function of controlling the supply of a potential to the wiring 42. Specifically, a potential that brings the transistor 81 into an on state is supplied to the wiring 84, making conduction between the potential generation circuit 44 and the wiring 42. Then, the potential generated by the potential generation circuit 44 is supplied to the wiring 42. The potential generated by the potential generation circuit 44 can be the bias potential Vb. Therefore the bias potential Vb can be supplied to the wiring 42. After the bias potential Vb is supplied to the wiring 42, a potential at which the transistor 81 is brought into an off state is supplied to the wiring 84. The transistor 81 brought into an off state enables the potential of the wiring 42 to be held.

The transistor 81 is preferably a transistor using a metal oxide in an active layer (an OS transistor). An oxide semiconductor which is a kind of metal oxide has a band gap of 2 eV or more and thus has an extremely low off-state current. When an OS transistor is used as the transistor 81, the potential of the wiring 42 can be held for a long time.

In the case where the transistor 81 is an OS transistor, the memory circuit 80 can be referred to as an "OS memory."

An OS memory can hold written data in a period of one year or longer, or even 10 years or longer after power supply is stopped. Thus, the OS memory can also be regarded as a nonvolatile memory.

An OS memory using an OS transistor employs a method in which charge is written to the node FN through the OS transistor; hence, high voltage, which a conventional flash memory requires, is unnecessary and a high-speed writing operation is possible. Furthermore, the number of data writing and reading in an OS memory is substantially unlimited because charge injection and extraction into/from a floating gate or a charge trap layer are not performed. An OS memory is less likely to degrade than a conventional flash memory and can have high reliability.

Unlike a magnetic memory, a resistive random access memory, or the like, an OS memory has no change in the structure at the atomic level. Thus, an OS memory has higher rewrite endurance than a magnetic memory and a resistive random access memory.

The above description of the memory circuit 80 can also be applied to the memory circuit 90 by replacing the memory circuit 80 with the memory circuit 90, the transistor 81 with the transistor 91, the capacitor 82 with the capacitor 92, the potential generation circuit 44 with the potential generation circuit 54, the wiring 42 with the wiring 52, the wiring 84 with the wiring 94, and the wiring 85 with the wiring 95.

Figure 18A:
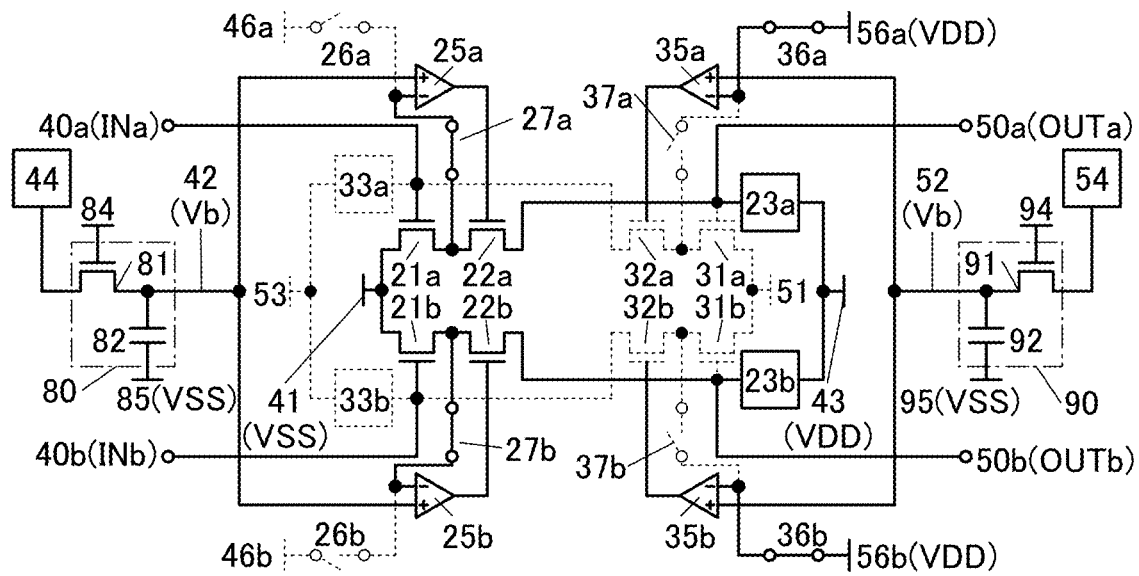
FIG. 18A and FIG. 18B are circuit diagrams illustrating examples of an operation method of a communication device.
Figure 18B:
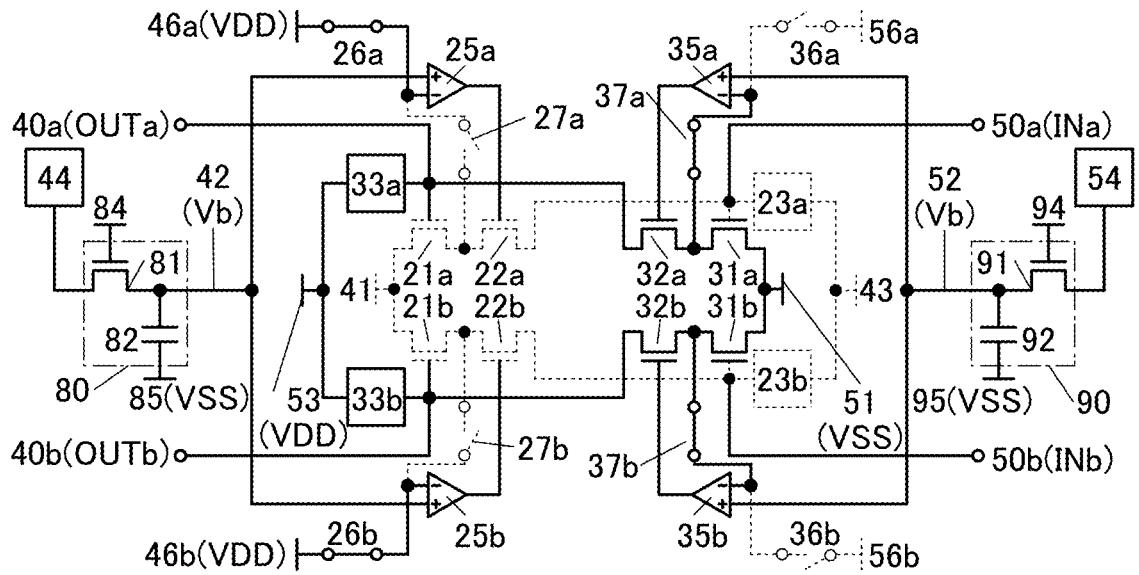

Examples of operation methods of the amplifier circuit 20 having the configuration illustrated in FIG. 17 are described using FIG. 18A and FIG. 18B. FIG. 18A illustrates an example of an operation method of the amplifier circuit 20 having the configuration illustrated in FIG. 17 where the terminal 40a is an input terminal INa, the terminal 40b is an input terminal INb, the terminal 50a is an output terminal OUTa, and the terminal 50b is an output terminal OUTb. FIG. 18B illustrates an example of an operation method of the amplifier circuit 20 having the configuration illustrated in FIG. 17 where the terminal 50a is an input terminal INa, the terminal 50b is an input terminal INb, the terminal 40a is an output terminal OUTa, and the terminal 40b is an output terminal OUTb.

In the case where the amplifier circuit 20 is operated by the method illustrated in FIG. 18A and FIG. 18B, charge is retained in advance in the memory 80 and the memory 90 such that the potentials of the wiring 42 and the wiring 52 each become the bias potential Vb.

First, the case where signals are input to the terminal 40a and the terminal 40b is described. In this case, the switch 27a, the switch 27b, the switch 36a, and the switch 36b are brought into an on state as illustrated in FIG. 18A. This makes conduction between one of the source and the drain of the transistor 21a and the inverting input terminal of the operational amplifier 25a, and conduction between one of the source and the drain of the transistor 21b and the inverting input terminal of the operational amplifier 25b. Thus, as illustrated in FIG. 14A and the like, the transistor 22a and the transistor 22b function as bias transistors.

By contrast, the switch 26a, the switch 26b, the switch 37a, and the switch 37b are bought into an off state. Accordingly, the potential of the inverting input terminal of the operational amplifier 35a and the potential of the inverting input terminal of the amplifier 35b become high potentials. In the state illustrated in FIG. 18A, the potential of the non-inverting input terminal of the operational amplifier 35a and the non-inverting input terminal of the operational amplifier 35b are each the bias potential Vb and lower than the high potential. Since the switch 37a and the switch 37b are in an off state, the amplifier 35a and the amplifier 35b are not fed back. Thus, in the state illustrated in FIG. 18A, the operational amplifier 35a and the operational amplifier 35b function as a comparator. As described above, the potential of the inverting input terminal of the operational amplifier 35a is higher than the potential of the non-inverting input terminal of the operational amplifier 35a, and the potential of the inverting input terminal of the operational amplifier 35b is higher than the potential of the non-inverting input terminal of the operational amplifier 35b. Thus, the operational amplifier 35a and the operational amplifier 35b each output a low potential, for example. Accordingly, a gate potential of the transistor 32a and a gate potential of the transistor 32b become low potentials, so that the transistor 32a and the transistor 32b are bought into an off state.

In FIG. 18A and FIG. 18B, the dotted lines indicate the transistor, load, switch, circuit, and wiring that do not contribute to transmission of a signal from the input terminal INa to the output terminal OUTa or transmission of a signal from the input terminal INb to the output terminal OUTb. As illustrated in FIG. 18A, for example, the switch 26a, the switch 26b, the transistor 32a, the transistor 32b, the switch 37a, and the switch 37b are in an off state and therefore do not contribute to the transmission of a signal from the input terminal INa to the output terminal OUTa or the transmission of a signal from the input terminal INb to the output terminal OUTb. Furthermore, since the transistor 32a and the transistor 32b are in an off state, current does not flow into the transistor 31a or the transistor 31b, and therefore the transistor 31a and the transistor 31b do not contribute to the transmission of a signal from the input terminal INa to the output terminal OUTa or the transmission of a signal from the input terminal INb to the output terminal OUTb. The load 33a, which is electrically connected to the other of the source and the drain of the transistor 32a in an off state, and the load 33b, which is electrically connected to the other of the source and the drain of the transistor 32b in an off state, do not contribute to the transmission of a signal from the input terminal INa to the output terminal OUTa or the transmission of a signal from the input terminal INb to the output terminal OUTb, either. As described above, in FIG. 18A, the dotted lines indicate the transistor 31a, the transistor 31b, the transistor 32a, the transistor 32b, the load 33a, the load 33b, the switch 26a, the switch 26b, the switch 37a, and the switch 37b and parts of the circuit and wiring that are electrically connected to these.

Next, the case where signals are input to the terminal 50a and the terminal 50b is described. In this case, the switch 26a, the switch 26b, the switch 37a, and the switch 37b are brought into an on state as illustrated in FIG. 18B. This makes conduction between one of the source and the drain of the transistor 31a and the inverting input terminal of the operational amplifier 35a, and conduction between one of the source and the drain of the transistor 31b and the inverting input terminal of the operational amplifier 35b. Thus, as illustrated in FIG. 14A and the like, the transistor 32a and the transistor 32b function as bias transistors.

By contrast, the switch 27a, the switch 27b, the switch 36a, and the switch 36b are bought into an off state. Accordingly, the potential of the inverting input terminal of the operational amplifier 25a and the potential of the inverting input terminal of the amplifier 25b become high potentials. In the state illustrated in FIG. 18B, the potential of the non-inverting input terminal of the operational amplifier 25a and the non-inverting input terminal of the operational amplifier 25b are each the bias potential Vb and lower than the high potential. Since the switch 27a and the switch 27b are in an off state, the amplifier 25a and the amplifier 25b are not fed back. Thus, in the state illustrated in FIG. 18B, the operational amplifier 35a and the operational amplifier 35b function as a comparator. As described above, the potential of the inverting input terminal of the operational amplifier 25a is higher than the potential of the non-inverting input terminal of the operational amplifier 25a, and the potential of the inverting input terminal of the operational amplifier 25b is higher than the potential of the non-inverting input terminal of the operational amplifier 25b. Thus, the operational amplifier 25a and the operational amplifier 25b each output a low potential, for example. Accordingly, a gate potential of the transistor 22a and a gate potential of the transistor 22b become low potentials, so that the transistor 22a and the transistor 22b are bought into an off state.

As illustrated in FIG. 18B, for example, the switch 27a, the switch 27b, the transistor 22a, the transistor 22b, the switch 36a, and the switch 36b are in an off state and therefore do not contribute to the transmission of a signal from the input terminal INa to the output terminal OUTa or the transmission of a signal from the input terminal INb to the output terminal OUTb. Furthermore, since the transistor 22a and the transistor 22b are in an off state, current does not flow into the transistor 21a or the transistor 21b, and therefore the transistor 21a and the transistor 21b do not contribute to the transmission of a signal from the input terminal INa to the output terminal OUTa or the transmission of a signal from the input terminal INb to the output terminal OUTb. The load 23a, which is electrically connected to the other of the source and the drain of the transistor 22a in an off state, and the load 23b, which is electrically connected to the other of the source and the drain of the transistor 22b in an off state, do not contribute to the transmission of a signal from the input terminal INa to the output terminal OUTa or the transmission of a signal from the input terminal INb to the output terminal OUTb, either. As described above, in FIG. 18B, the dotted lines indicate the transistor 21a, the transistor 21b, the transistor 22a, the transistor 22b, the load 23a, the load 23b, the switch 27a, the switch 27b, the switch 36a, and the switch 36b and parts of the circuit and wiring that are electrically connected to these.

The explanation illustrated in FIG. 14A and FIG. 14B can also be applied to the case where the amplifier circuit 20 has the configuration illustrated in FIG. 17. The configuration illustrated in FIG. 16A and the explanation illustrated in FIG. 16B can also be applied to the case where the amplifier circuit 20 has the configuration illustrated in FIG. 17. Specifically, back gates can be provided in the transistor 22a, the transistor 22b, the transistor 32a, and the transistor 32b included in the amplifier circuit 20 having the configuration illustrated in FIG. 17. The back gate of the transistor 22a can be electrically connected to the terminal 40a, the back gate of the transistor 22b can be electrically connected to the terminal 40b, the back gate of the transistor 32a can be electrically connected to the terminal 50a, and the back gate of the transistor 32b can be electrically connected to the terminal 50b.

Figure 19:
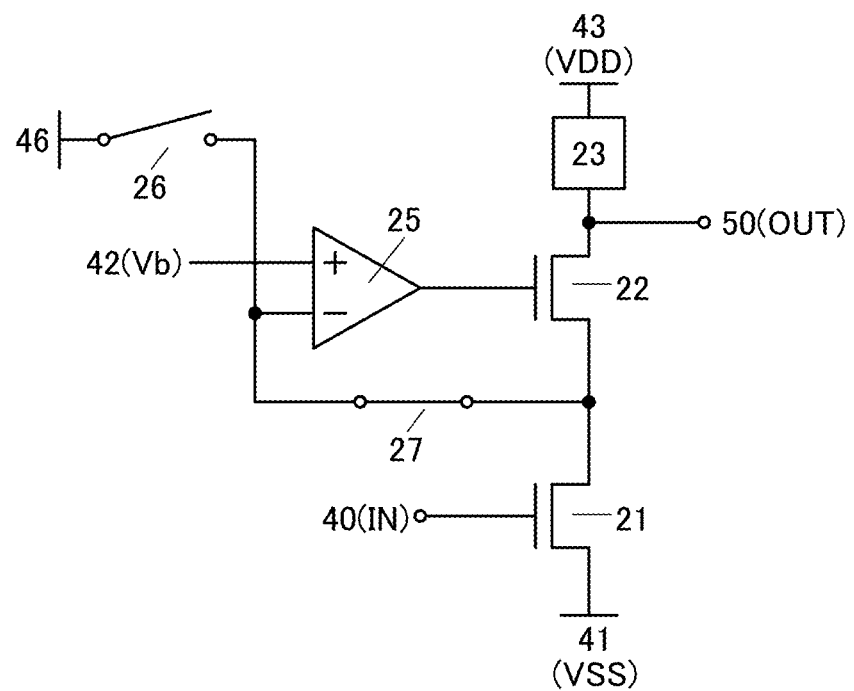
FIG. 19 is a circuit diagram illustrating a configuration example of a semiconductor device.

FIG. 19 is a diagram of the transistor 21 (the transistor 21a or the transistor 21b), the transistor 22 (the transistor 22a or the transistor 22b), the load 23 (the load 23a or the load 23b), the operational amplifier 25 (the operational amplifier 25a or the operational amplifier 25b), the switch 26 (the switch 26a or the switch 26b), the switch 27 (the switch 27a or the switch 27b), the terminal 40 (the terminal 40a or the terminal 40b), the wiring 41, the wiring 42, the wiring 43, and the terminal 50 (the terminal 50a or the terminal 50b) excerpted from FIG. 18A. Note that the terminal 40 is the input terminal IN (the input terminal INa or the input terminal INb) and the terminal 50 is the output terminal OUT (the output terminal OUTa or the output terminal OUTb).

The circuit having the configuration illustrated in FIG. 19 can also apply to a semiconductor device other than a communication device. For example, the circuit can be used as part of an amplifier circuit included in an operational amplifier.

Figure 20A:
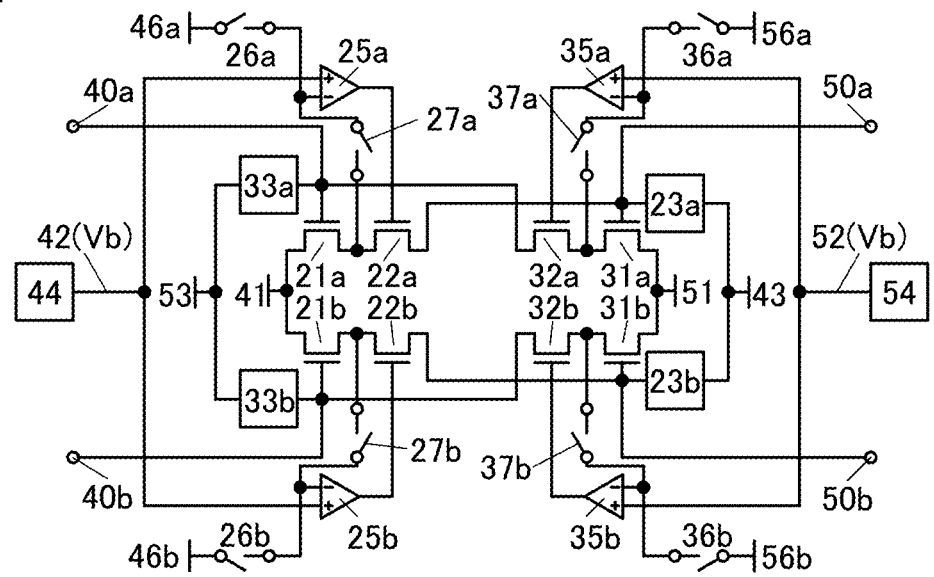
FIG. 20A and FIG. 20B are circuit diagrams illustrating configuration examples of a communication device.

FIG. 20A is a diagram illustrating a configuration example of the 20, which is a modification example of the configuration illustrated in FIG. 17. The amplifier circuit 20 having the configuration illustrated in FIG. 13A differs from the amplifier circuit 20 having the configuration illustrated in FIG. 17 in not including the memory circuit 80 or the memory circuit 90.

In the amplifier circuit 20 having the configuration illustrated in FIG. 20A, the potential generation circuit 44 and the potential generation circuit 54 each generate the bias potential Vb. Thus, the potentials of the wiring 42 and the wiring 52 are each the bias potential Vb.

Figure 20B:
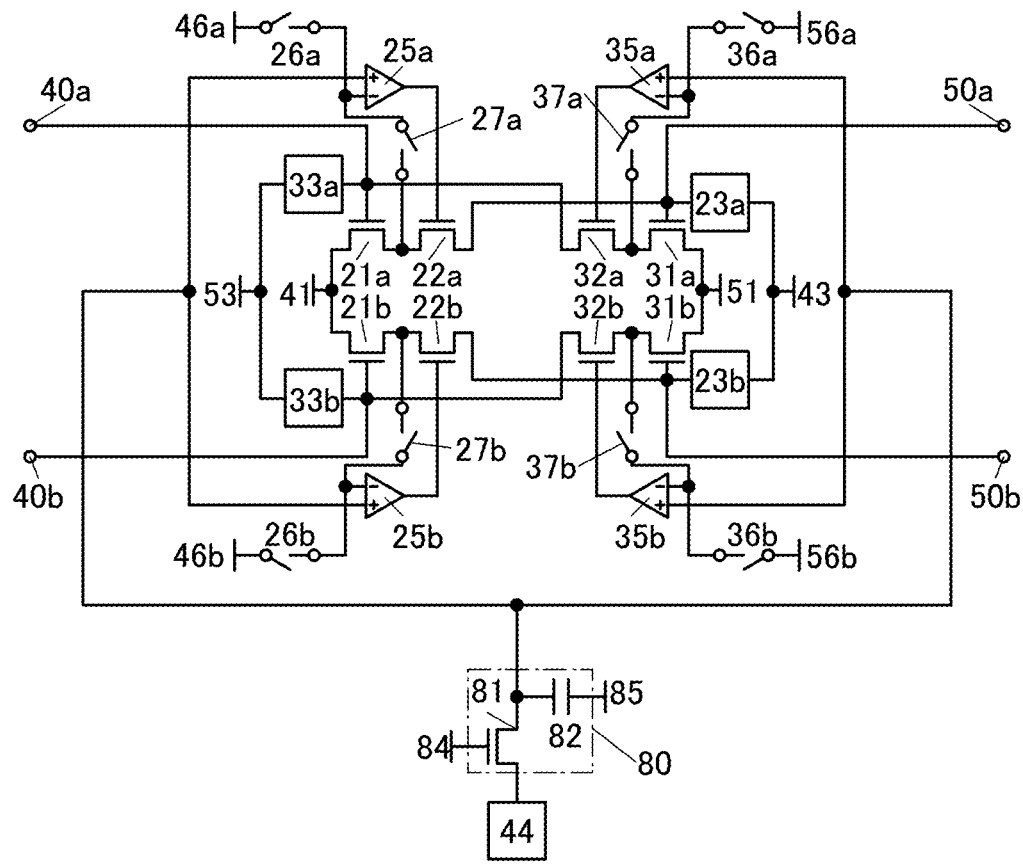

FIG. 20B is a diagram illustrating a configuration example of the 20, which is a modification example of the configuration illustrated in FIG. 17. The amplifier circuit 20 having the configuration illustrated in FIG. 20B differs from the amplifier circuit 20 having the configuration illustrated in FIG. 17 in that the non-inverting input terminal of the operational amplifier 25a and the non-inverting input terminal of the operational amplifier 25b and the non-inverting input terminal of the operational amplifier 35a and the non-inverting input terminal of the operational amplifier 35b are electrically connected to each other. The amplifier circuit 20 having the configuration illustrated in FIG. 20B differs from the amplifier circuit 20 having the configuration illustrated in FIG. 17 in that the memory circuit 90 and the potential generation circuit 54 are not provided.

In the amplifier circuit 20 having the configuration illustrated in FIG. 20B, the non-inverting input terminal of the operational amplifier 25a, the non-inverting input terminal of the operational amplifier 25b, the non-inverting input terminal of the operational amplifier 35a, and the non-inverting input terminal of the operational amplifier 35b are electrically connected to the memory circuit 80. Specifically, the non-inverting input terminal of the operational amplifier 25a, the non-inverting input terminal of the operational amplifier 25b, the non-inverting input terminal of the operational amplifier 35a, and the non-inverting input terminal of the amplifier 35b are electrically connected to one of the source and the drain of the transistor 81 and one terminal of the capacitor 82.

The structures, methods, and the like described in this embodiment can be used in combination as appropriate with the structures, configurations, methods, and the like described in the other embodiments and the like.

Embodiment 3

In this embodiment, structures of transistors that can be used in the communication device and semiconductor device described in the above embodiments are described.

Figure 21:
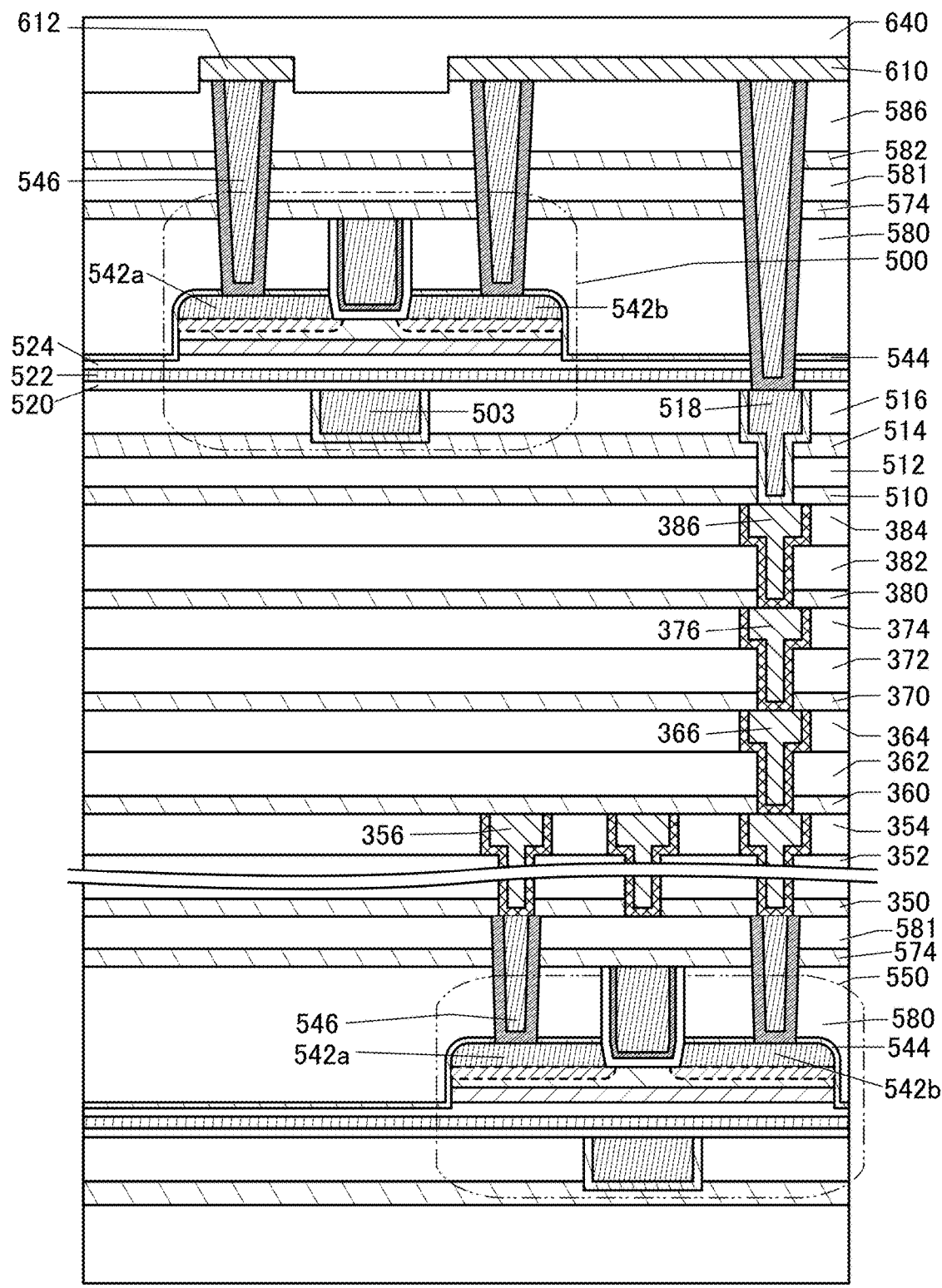
FIG. 21 is a diagram illustrating a structure example of a semiconductor device.
Figure 22A:
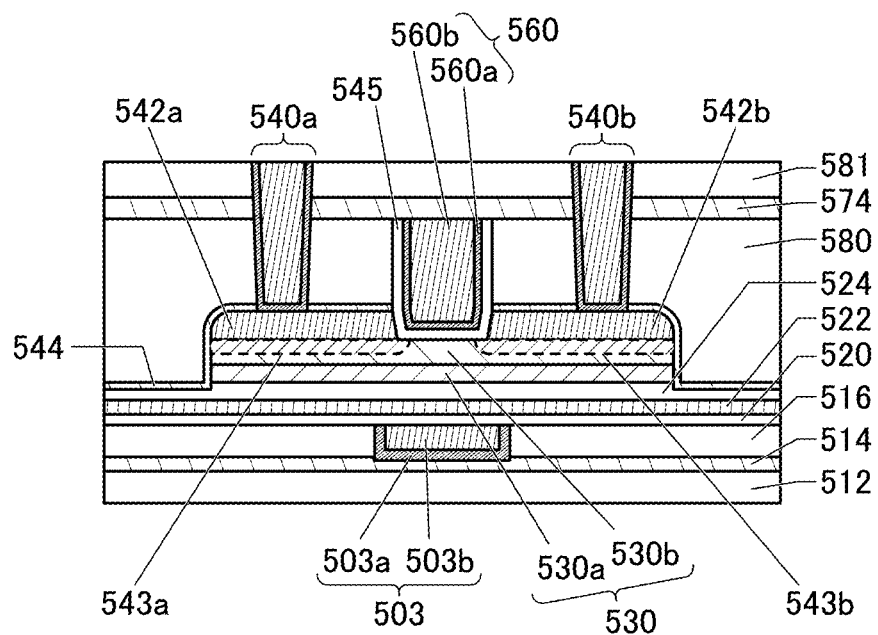
FIG. 22A and FIG. 22B are diagrams illustrating a structure example of transistors.
Figure 22B:
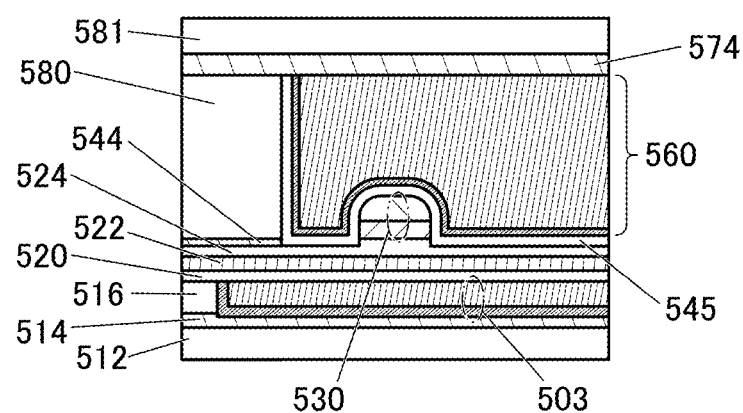

FIG. 21 illustrates part of a cross-sectional structure of a semiconductor device included in the communication device of one embodiment of the present invention or a semiconductor device of one embodiment of the present invention. The semiconductor device having the structure illustrated in FIG. 21 includes a transistor 550 and a transistor 500. FIG. 22A is a cross-sectional view of the transistor 500 and the transistor 550 in the channel length direction, and FIG. 22B is a cross-sectional view of the transistor 500 and the transistor 550 in the channel width direction. For example, the transistor 500 corresponds to the transistor 21 described in the above embodiment and the transistor 550 corresponds to the transistor 22 described in the above embodiment. The transistor 500 and the transistor 550 can be OS transistors. One or both of the transistor 500 and the transistor 550 may be a transistor other than an OS transistor. For example, one or both of the transistor 500 and the transistor 550 may be a transistor using silicon in an active layer (a Si transistor).

In the semiconductor device having the structure illustrated in FIG. 21, the transistor 500 is provided above the transistor 550. Note that the transistor 500 and the transistor 550 may be provided in the same layer.

As illustrated in FIG. 22A and FIG. 22B, the transistor 500 and the transistor 550 each include the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530a positioned over the insulator 524; an oxide 530b positioned over the oxide 530a; a conductor 542a and a conductor 542b positioned apart from each other over the oxide 530b; an insulator 580 that is positioned over the conductor 542a and the conductor 542b and is provided with an opening formed to overlap with a region between the conductor 542a and the conductor 542b; an insulator 545 positioned to have a region in contact with a bottom and a side surface of the opening; and a conductor 560 positioned on a formation surface of the insulator 545.

In addition, as shown in FIG. 22A and FIG. 22B, an insulator 544 is preferably positioned between the insulator 580 and the oxide 530a, the oxide 530b, the conductor 542a, and the conductor 542b. Furthermore, as shown in FIG. 22A and FIG. 22B, the conductor 560 preferably includes a conductor 560a provided inside the insulator 545 and a conductor 560b provided to be embedded inside the conductor 560a. As illustrated in FIG. 22A and FIG. 22B, an insulator 574 is preferably positioned over the insulator 580, the conductor 560, and the insulator 545.

In this specification and the like, the oxide 530a and the oxide 530b are sometimes collectively referred to as an oxide 530.

Although a structure of the transistor 500 and the transistor 550 in which two layers of the oxide 530a and the oxide 530b are stacked in a region where a channel is formed and its vicinity is shown, the present invention is not limited thereto. For example, a single layer of the oxide 530b or a stacked-layer structure of three or more layers may be employed.

Although the conductor 560 and the transistor 550 are shown to have a stacked-layer structure of two layers in the transistor 500, the present invention is not limited thereto. For example, the conductor 560 may have a single-layer structure or a stacked-layer structure of three or more layers. The transistor 500 and the transistor 550 illustrated in FIG. 21, FIG. 22A, and FIG. 22B are examples and the structure is not limited thereto; an appropriate transistor is used in accordance with a circuit configuration, a driving method, or the like.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500 and the transistor 550, the gate electrode can be positioned between the source electrode and the drain electrode in a self-aligned manner. Therefore, the conductor 560 and the transistor 550 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 and the transistor 550 can be improved, and the transistor 500 and the transistor 550 can have high frequency characteristics.

The conductor 560 functions as a first gate (also referred to as top gate) electrode in some cases. The conductor 503 functions as a second gate (also referred to as bottom gate) electrode in some cases. The conductor 560 functions as a front gate electrode and the conductor 503 functions as a back gate electrode in some cases. In that case, the threshold voltage of the transistor 500 and the transistor 550 can be controlled by changing a potential applied to the conductor 503 independently of a potential applied to the conductor 560. In particular, the threshold voltage of the transistor 500 and the transistor 550 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected, so that the channel formation region formed in the oxide 530 can be covered.

In this specification and the like, a transistor structure in which a channel formation region is electrically surrounded by the electric fields of a pair of gate electrodes (a first gate electrode and a second gate electrode) is referred to as a surrounded channel (s-channel) structure. In this specification and the like, the s-channel structure has a feature that the side surface and the vicinity of the oxide 530 in contact with the conductor 542a and the conductor 542b functioning as the source electrode and the drain electrode are of I-type like the channel formation region. Since the side surface and the vicinity of the oxide 530 that is in contact with the conductor 542a and the conductor 542b are in contact with the insulator 544, they can be of I-type like the channel formation region. Note that in this specification and the like, "i-type" can be equated with "highly purified intrinsic" to be described later. The s-channel structure disclosed in this specification and the like is different from a Fin-type structure and a planar structure. With the s-channel structure, resistance to a short-channel effect can be enhanced, that is, a transistor in which a short-channel effect is unlikely to occur can be provided.

The conductor 503 can include a conductor 503a and a conductor 503b. The conductor 503a is formed in contact with an inner wall of the opening in the insulator 514 and the insulator 516, and the conductor 503b is formed further inside. Note that in this embodiment, the conductor 503 has a structure in which the conductor 503a and the conductor 503b are stacked; however, the present invention is not limited to this structure. For example, the conductor 503 may be provided as a single layer or to have a stacked-layer structure of three or more layers.

Here, for the conductor 503a, a conductive material which has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which the above oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In the case where the conductor 503 also functions as a wiring, a conductive material with high conductivity that contains tungsten, copper, or aluminum as its main component is preferably used for the conductor 503b.

The insulator 520, the insulator 522, and the insulator 524 have a function of a gate insulating film for the conductor 503.

Here, as the insulator 524 in contact with the oxide 530, an insulator that contains oxygen more than oxygen in the stoichiometric composition is preferably used. Such oxygen is easily released from the insulator film heating. In this specification and the like, oxygen that is released by heating is referred to as "excess oxygen" in some cases. That is, a region containing excess oxygen (also referred to as an "excess-oxygen region") is preferably formed in the insulator 524. When such an insulator containing excess oxygen is provided in contact with the oxide 530, oxygen vacancies (Vo) in the oxide 530 can be reduced and the reliability of the transistor 500 and the transistor 550 can be improved. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Hydrogen in the oxide semiconductor is easily transferred by a stress such as heat or an electric field; thus, a large amount of hydrogen in the oxide semiconductor might reduce the reliability of the transistor. In one embodiment of the present invention, VoH in the oxide 530 is preferably reduced as much as possible so that the oxide 530 becomes a highly purified intrinsic or substantially highly purified intrinsic oxide. In order to obtain such an oxide semiconductor with sufficiently reduced VoH, it is important to remove impurities such as moisture and hydrogen in the oxide semiconductor (this treatment is also referred to as "dehydration" or "dehydrogenation treatment") and supply oxygen to the oxide semiconductor to fill oxygen vacancies (this treatment is also referred to as "oxygen adding treatment"). When an oxide semiconductor with sufficiently reduced impurities such as VoH is used for a channel formation region of a transistor, the transistor can have stable electrical characteristics.

As the insulator including an excess-oxygen region, specifically, an oxide material from which part of oxygen is released by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermkesorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of VoH→Vo+H occurs. Part of hydrogen generated at this time is bonded to oxygen to be H$_2$O, and removed from the oxide 530 or an insulator near the oxide 530 in some cases. Part of hydrogen is sometimes gettered by the conductor 542a or the conductor 542b.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated. Application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 500 and the transistor 550, the heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. The heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

The oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of VoH.

When the insulator 524 includes an excess-oxygen region, it is preferable that the insulator 522 have a function of inhibiting diffusion of oxygen (e.g., an oxygen atom and an oxygen molecule) (or that the insulator 522 be less likely to transmit the above oxygen).

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530, which is preferable.

The insulator 522 is preferably a single layer or stacked layers using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST). As miniaturization and high integration of transistors progress, a problem such as leakage current may arise because of a thinner gate insulating film. When a high-k material is used for an insulator functioning as the gate insulating film, a gate potential at the time when the transistor operates can be lowered while the physical thickness of the gate insulating film is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 and the transistor 550 into the oxide 530.

Aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

In this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

It is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high relative permittivity can be obtained.

In the transistor 500 and the transistor 550 in FIG. 22A and FIG. 22B, the insulator 520, the insulator 522, and the insulator 524 are illustrated as the gate insulating film having a three-layer structure for the conductor 503; however, the gate insulating film may have a single-layer structure, a two-layer structure, or a stacked-layer structure of four or more layers. In such cases, without limitation to a stacked-layer structure formed of the same material, a stacked-layer structure formed of different materials may be employed.

In the transistor 500 and the transistor 550, a metal oxide functioning as an oxide semiconductor is preferably used as the oxide 530 including a channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used.

The metal oxide functioning as an oxide semiconductor may be formed by a sputtering method or an atomic layer deposition (ALD) method. Note that the metal oxide functioning as an oxide semiconductor will be described in detail in another embodiment.

As the metal oxide functioning as the channel formation region in the oxide 530, a metal oxide whose band gap is greater than or equal to 2 eV is preferably used, and a metal oxide whose band gap is greater than or equal to 2.5 eV is more preferably used. The use of a metal oxide having such a wide band gap can reduce the off-state current of a transistor.

When the oxide 530a is provided below the oxide 530b in the oxide 530, impurities can be inhibited from diffusing into the oxide 530b from the components formed below the oxide 530a.

The oxide 530 preferably has a stacked-layer structure of a plurality of oxide layers that differ in the atomic ratio of metal atoms. Specifically, the atomic ratio of the element M to constituent elements in the metal oxide used as the oxide 530a is preferably greater than the atomic ratio of the element M to constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Moreover, the atomic ratio of In to the element M in the metal oxide used as the oxide 530b is preferably greater than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum is gradually varied at a junction portion of the oxide 530a and the oxide 530b. In other words, the energy level of the conduction band minimum at a junction portion of the oxide 530a and the oxide 530b is continuously varied or continuously connected. To vary the energy level gradually, the density of defect states in a mixed layer formed at the interface between the oxide 530a and the oxide 530b is preferably made low.

Specifically, when the oxide 530a and the oxide 530b contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 and the transistor 550 can have high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as tantalum nitride is preferable because it has a barrier property against hydrogen or oxygen.

Although the conductor 542a and the conductor 542b have a single-layer structure in FIG. 22A, they may have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure in which a titanium film or a titanium nitride film, an aluminum film or a copper film, and a titanium film or a titanium nitride film are stacked in this order and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

As illustrated in FIG. 22A, a region 543a and a region 543b are sometimes formed as low-resistance regions at and near the interface between the oxide 530 and the conductor 542a (and the conductor 542b). In that case, the region 543a functions as one of a source region and a drain region, and the region 543b functions as the other of the source region and the drain region. A channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In that case, the region 543a (the region 543b) has increased carrier density to be a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more of hafnium, aluminum, gallium, yttrium, zirconium, tungsten, titanium, tantalum, nickel, germanium, neodymium, lanthanum, magnesium, and the like can be used as the insulator 544. For the insulator 544, silicon nitride oxide or silicon nitride can be used, for example.

It is particularly preferable to use, as the insulator 544, an insulator containing an oxide of one or both of aluminum and hafnium, for example, aluminum oxide, hafnium oxide, or an oxide containing aluminum and hafnium (hafnium aluminate). It is particularly preferable to use, as the insulator 544, aluminum oxide or hafnium oxide, which is an insulator containing an oxide of one or both of aluminum and hafnium. Alternatively, it is preferable to use an oxide containing aluminum and hafnium (hafnium aluminate) or the like. In particular, hafnium aluminate has higher heat resistance than a hafnium oxide film and thus is less likely to be crystallized by heat treatment in a later step, and thus hafnium aluminate is preferable. Note that the insulator 544 is not necessarily provided when the conductor 542a and the conductor 542b are oxidation-resistant or do not significantly lose the conductivity even after absorbing oxygen. Note that the insulator 544 is not an essential component when the conductor 542a and the conductor 542b are oxidation-resistant materials or materials that do not significantly lose the conductivity even after absorbing oxygen. Design is determined as appropriate in consideration of required transistor characteristics.

The insulator 544 can inhibit impurities such as water and hydrogen contained in the insulator 580 from diffusing into the oxide 530b. Moreover, the oxidation of the conductor 560 due to excess oxygen in the insulator 580 can be inhibited.

The insulator 545 functions as a gate insulating film for the conductor 560. The insulator 545 is preferably formed using an insulator which contains excess oxygen and from which oxygen is released by heating, like the insulator 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When an insulator containing excess oxygen is provided as the insulator 545, oxygen can be effectively supplied from the insulator 545 to the channel formation region of the oxide 530b. As in the insulator 524, the concentration of impurities such as water and hydrogen in the insulator 545 is preferably lowered. The thickness of the insulator 545 is preferably greater than or equal to 1 nm and less than or equal to 20 nm.

Furthermore, in order that excess oxygen of the insulator 545 can be efficiently supplied to the oxide 530, a metal oxide may be provided between the insulator 545 and the conductor 560. The metal oxide preferably has a function of inhibiting diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidization of the conductor 560 due to excess oxygen can be inhibited. The metal oxide can be formed using a material that can be used for the insulator 544.

Note that the insulator 545 may have a stacked-layer structure like the gate insulating film for the conductor 503. With miniaturization and high integration of a transistor, a problem such as generation of leakage current sometimes arises because of a thin gate insulating film. Thus, when an insulator functioning as a gate insulating film has a stacked-layer structure of a high-k material and a thermally stable material, a gate potential at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIG. 22A and FIG. 22B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, the conductivity of the conductor 560b can be prevented from being lowered because of oxidization due to oxygen in the insulator 545. As a conductive material having a function of inhibiting diffusion of oxygen, for example, tantalum, tantalum nitride, ruthenium, or ruthenium oxide is preferably used. The conductor 560a can be formed using an oxide semiconductor that can be used for the oxide 530. In that case, when the conductor 560b is formed by a sputtering method, the conductor 560a can have a reduced electric resistance value and become a conductor. Such a conductor can be referred to as an OC (Oxide Conductor) electrode.

Furthermore, the conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and the above conductive material.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided, oxygen in the insulator 580 can be efficiently supplied to the oxide 530. The concentration of impurities such as water and hydrogen in the insulator 580 is preferably lowered.

The opening of the insulator 580 is formed to overlap with a region between the conductor 542a and the conductor 542b. Thus, the conductor 560 is embedded in the opening of the insulator 580 and the region between the conductor 542a and the conductor 542b.

For miniaturization of the semiconductor device, the gate length needs to be short. Meanwhile, it is necessary to prevent a reduction in conductivity of the conductor 560. When the conductor 560 is made thick in order to prevent a reduction in conductivity of the conductor 560, the conductor 560 might have a shape with a high aspect ratio. Even when having a shape with a high aspect ratio, the conductor 560 can be formed without collapsing during the process because the conductor 560 is embedded in the opening of the insulator 580 in this embodiment.

The insulator 574 is preferably provided in contact with the top surfaces of the insulator 580, the conductor 560, and the insulator 545. When the insulator 574 is formed by a sputtering method, the insulator 545 and the insulator 580 can include an excess-oxygen region. Therefore, oxygen can be supplied from the excess-oxygen region to the oxide 530.

For example, a metal oxide containing one or more of hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

The insulator 581 functioning as an interlayer film is preferably provided over the insulator 574. As in the insulator 524 or the like, the concentration of impurities such as water and hydrogen in the film of the insulator 581 is preferably lowered.

A conductor 540a and a conductor 540b are provided in the openings formed in the insulator 581, the insulator 574, the insulator 580, and the insulator 544. The conductor 540a and the conductor 540b are provided to face each other with the conductor 560 therebetween. The conductor 540a and the conductor 540b have a structure similar to that of a conductor 546 described later.

A wiring layer may be provided above the transistor 550. For example, in addition to the insulator 574 and the insulator 581, an insulator 350, an insulator 352, and an insulator 354 are stacked over the transistor 550 in FIG. 21. Furthermore, a conductor 356 is embedded in the insulator 350, the insulator 352, and the insulator 354. The conductor 356 has a function of a plug or a wiring that is connected to the transistor 550.

As a material for each of the plugs and wirings, a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 354 and the conductor 356. For example, an insulator 360, an insulator 362, and an insulator 364 are stacked sequentially in FIG. 21. Furthermore, a conductor 366 is embedded in the insulator 360, the insulator 362, and the insulator 364. The conductor 366 functions as a plug or a wiring.

A wiring layer may be provided over the insulator 364 and the conductor 366. For example, an insulator 370, an insulator 372, and an insulator 374 are stacked sequentially in FIG. 21. Furthermore, a conductor 376 is embedded in the insulator 370, the insulator 372, and the insulator 374. The conductor 376 functions as a plug or a wiring.

A wiring layer may be provided over the insulator 374 and the conductor 376. For example, an insulator 380, an insulator 382, and an insulator 384 are stacked sequentially in FIG. 8. Furthermore, a conductor 386 is embedded in the insulator 380, the insulator 382, and the insulator 384. The conductor 386 functions as a plug or a wiring.

The conductor 366, the conductor 376, and the conductor 386 can each have a structure similar to that of the conductor 356.

Although the semiconductor device of one embodiment of the present invention includes the wiring layer including the conductor 356, the wiring layer including the conductor 366, the wiring layer including the conductor 376, and the wiring layer including the conductor 386 in the above, the semiconductor device of one embodiment of the present invention is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384.

Furthermore, a conductor 518, a conductor included in the transistor 500 (a conductor 503 for example), and the like are embedded in the insulator 510, the insulator 512, the insulator 514, and the insulator 516. The conductor 518 has a function of a plug or a wiring.

An insulator 582 and an insulator 586 are stacked over the transistor 500 in addition to the insulator 574 and the insulator 581. A substance having a barrier property against oxygen or hydrogen is preferably used for the insulator 582. For the insulator 582, a metal oxide such as aluminum oxide, hafnium oxide, or tantalum oxide is preferably used, for example.

In particular, aluminum oxide has an excellent blocking effect that prevents both oxygen and impurities such as hydrogen and moisture, which can cause a change in electrical characteristics of the transistor, from passing through the film. Accordingly, the use of aluminum oxide can prevent entry of impurities such as hydrogen and moisture into the transistor 500 during and after a manufacturing process of the transistor. In addition, release of oxygen from the oxide contained in the transistor 500 can be prevented. Therefore, aluminum oxide is suitably used as a protective film for the transistor 500.

The conductor 546 and the like are embedded in the insulator 520, the insulator 522, the insulator 524, the insulator 544, the insulator 580, the insulator 574, the insulator 581, the insulator 582, and the insulator 586.

The conductor 546 functions as a plug or a wiring that is connected to the transistor 500 or the transistor 550.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water may be formed using a material similar to that for the insulator 522 or the insulator 514, for example. Note that an opening may be formed to surround the transistor 550 and an insulator having a high barrier property against hydrogen or water may be formed to cover the opening after the transistor 550 is formed like after the transistor 500 is formed.

A conductor 610 and a conductor 612 may be provided over the conductor 546 and the insulator 586. The conductor 610 and the conductor 612 each have a function of a plug or a wiring that is electrically connected to the transistor 500. In the structure illustrated in FIG. 21, one of a source electrode and a drain electrode of the transistor 550 (the conductor 542b of the transistor 550) is electrically connected to one of a source electrode and a drain electrode of the transistor 500 (the conductor 542b of the transistor 500) through the conductor 546, the conductor 356, the conductor 366, the conductor 376, the conductor 386, the conductor 518, and the conductor 610.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in this embodiment; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

An insulator 640 is provided over the conductor 610, the conductor 612, and the insulator 586. The insulator 640 may function as a planarization film that covers a roughness thereunder.

With the use of the structure, a semiconductor device that includes a transistor including an oxide semiconductor can be miniaturized or highly integrated.

<Modification Example 1 of Transistor>

Figure 23A:
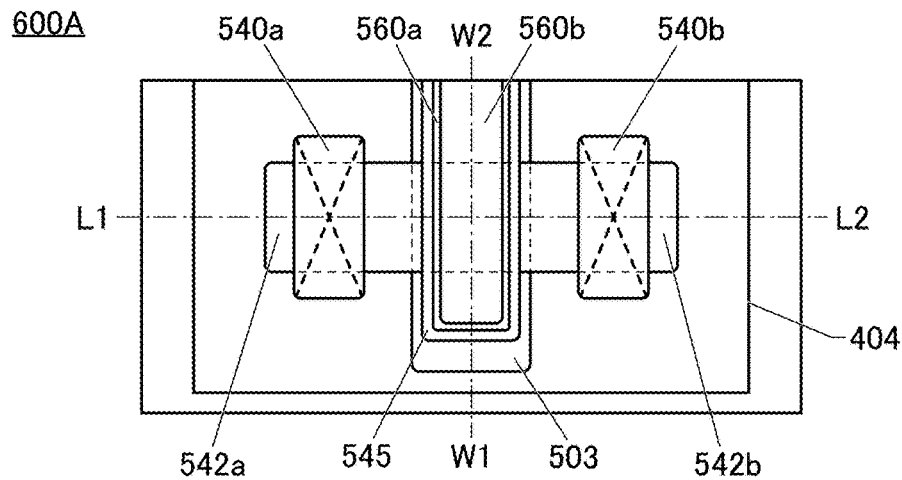
FIG. 23A, FIG. 23B, and FIG. 23C are diagrams illustrating a structure example of a transistor.
Figure 23B:
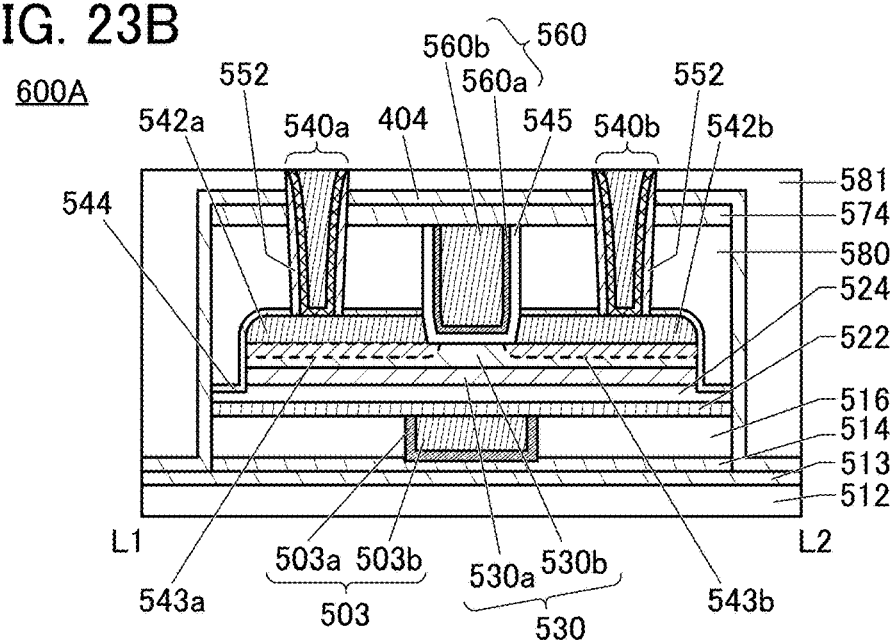
Figure 23C:
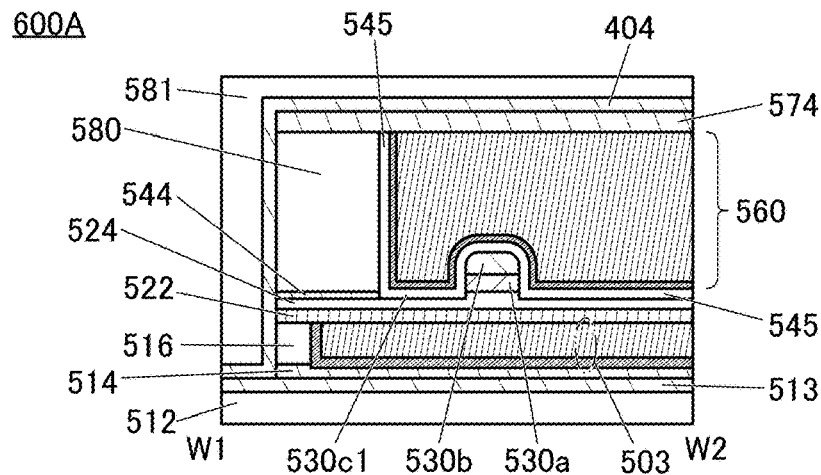

A structure example of a transistor 600A is described with reference to FIG. 23A, FIG. 23B, and FIG. 23C. The transistor 600A is a modification example of the transistor 500 and the transistor 550 having the structure illustrated in FIG. 22A and FIG. 22B. FIG. 23A is a top view of the transistor 600A. FIG. 23B is a cross-sectional view taken along the dashed-dotted line L1-L2 in FIG. 23A. FIG. 23C is a cross-sectional view taken along the dashed-dotted line W1-W2 in FIG. 23A. Note that for simplification of the drawing, some components are not illustrated in the top view in FIG. 23A.

The transistor 600A differs from the transistor 500 and the transistor 550 having the structure illustrated in FIG. 22A and FIG. 22B in including an insulator 552, an insulator 513, and an insulator 404. The transistor 600A also differs from the transistor 500 and the transistor 550 having the structure illustrated in FIG. 22A and FIG. 22B in that the insulator 552 is provided in contact with a side surface of the conductor 540a and in contact with a side surface of the conductor 540b. Moreover, the transistor 600A differs from the transistor 500 and the transistor 550 having the structure illustrated in FIG. 22A and FIG. 22B in that the insulator 520 is not included.

In the transistor 600A, the insulator 513 is provided over the insulator 512. The insulator 404 is provided over the insulator 574 and the insulator 513.

In the transistor 600A, the insulator 514, the insulator 516, the insulator 522, the insulator 524, the insulator 544, the insulator 580, and the insulator 574 are patterned and covered with the insulator 404. That is, the insulator 404 is in contact with the top surfaces of the insulator 574 and the insulator 513 and the side surfaces of the insulator 574, the insulator 580, the insulator 544, the insulator 524, the insulator 522, the insulator 516, and the insulator 514. With such a structure, the oxide 530 and the like are isolated from the outside by the insulator 404 and the insulator 513.

The insulator 513 and the insulator 404 preferably have high capability of inhibiting diffusion of hydrogen (e.g., at least one of hydrogen atoms, hydrogen molecules, and the like) or water molecules. For example, the insulator 513 and the insulator 404 are preferably formed using silicon nitride or silicon nitride oxide with a high hydrogen barrier property. This can inhibit diffusion of hydrogen or the like into the oxide 530, thereby suppressing the degradation of the characteristics of the transistor 600A. Thus, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that has a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water and hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. In this manner, the reliability of the semiconductor device of one embodiment of the present invention can be increased.

<Modification Example 2 of Transistor>

Figure 24A:
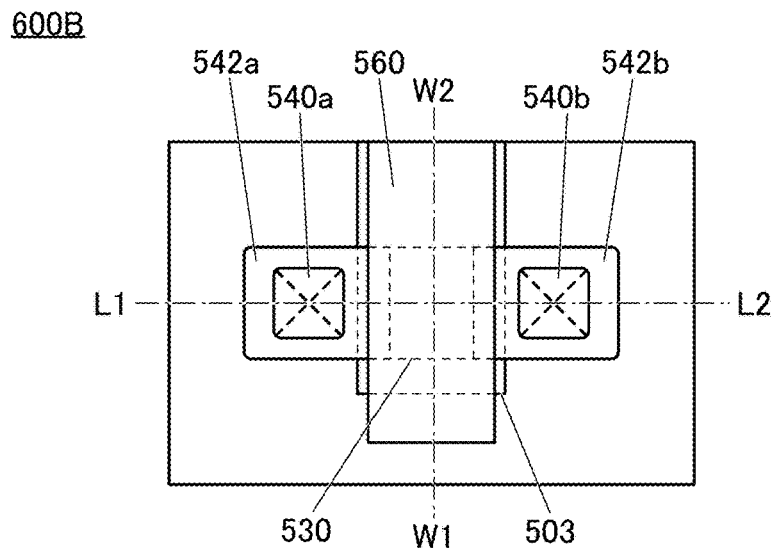
FIG. 24A, FIG. 24B, and FIG. 24C are diagrams illustrating a structure example of a transistor.
Figure 24B:
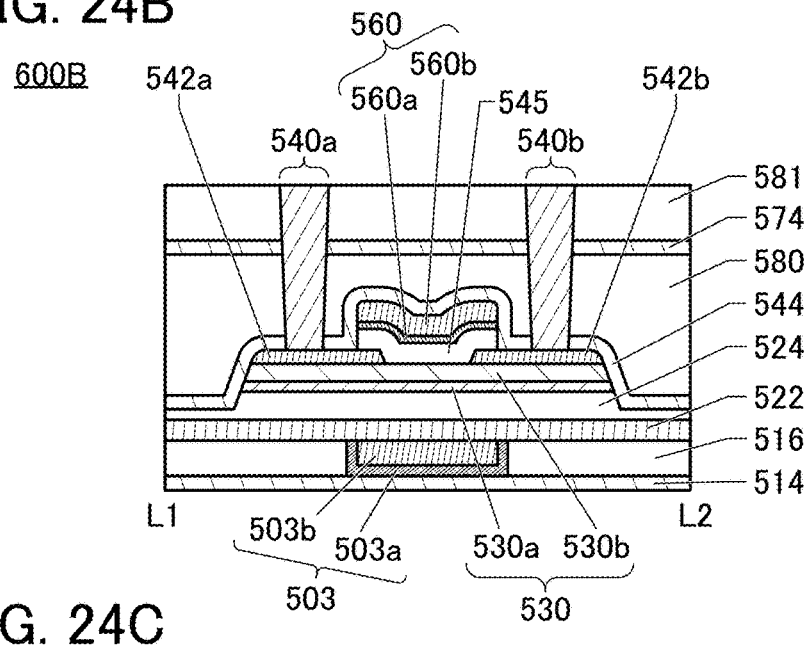
Figure 24C:
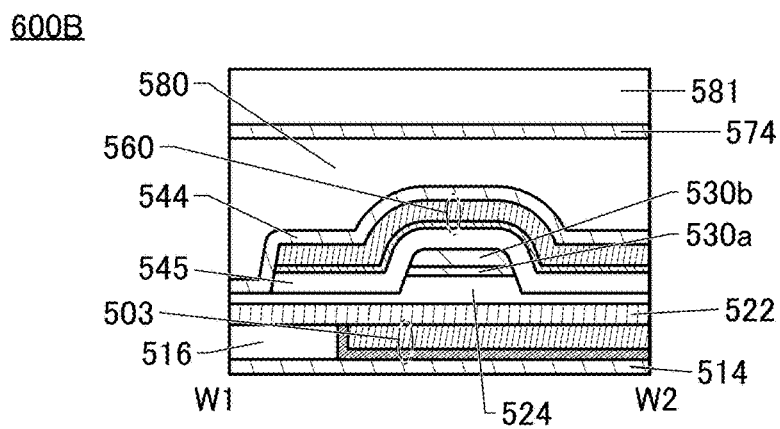

A structure example of a transistor 600B is described with reference to FIG. 24A, FIG. 24B, and FIG. 24C. FIG. 24A is atop view of the transistor 600B. FIG. 24B is a cross-sectional view taken along the dashed-dotted line L1-L2 in FIG. 24A. FIG. 24C is a cross-sectional view taken along the dashed-dotted line W1-W2 in FIG. 24A. Note that for simplification of the drawing, some components are not illustrated in the top view in FIG. 24A.

The transistor 600B is a modification example of the transistor 500 and the transistor 550 and is a transistor that can be replaced with the transistor 500 and the transistor 550. Thus, the difference between the transistor 600B and the transistor 500 and the transistor 550 is mainly described to avoid repeated description.

The conductor 560 functioning as the first gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, the conductor 560a is preferably formed using a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing a decrease in conductivity of the conductor 560b.

The insulator 544 is preferably provided to cover the top surface and the side surface of the conductor 560 and the side surface of the insulator 545. Note that the insulator 544 is preferably formed using an insulating material having a function of inhibiting diffusion of oxygen and impurities such as water and hydrogen. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 544 can inhibit the oxidation of the conductor 560. In addition, the insulator 544 can inhibit diffusion of impurities such as water and hydrogen contained in the insulator 580 into the transistor 600B.

The transistor 600B has a structure in which the conductor 560 overlaps with part of the conductor 542a and part of the conductor 542b and thus tends to have larger parasitic capacitance than the transistor 500 and the transistor 550. Thus, the transistor 600B tends to have a lower operation frequency than the transistor 500 and the transistor 550. However, the transistor 600B does not require a step of embedding the conductor 560, the insulator 545, and the like in the opening formed in the insulator 580 and the like; thus, the productivity of the transistor 600B is higher than that of the transistor 500 and the transistor 550.

The structures, the configurations, the methods, and the like described in this embodiment can be combined as appropriate with any of the structures, the configurations, the methods, and the like described in the other embodiments, for example.

Embodiment 4

In this embodiment, an oxide semiconductor which is a kind of metal oxides is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of oxide semiconductor will be explained with FIG. 25A. FIG. 25A is a diagram showing the classification of crystal structures of an oxide semiconductor, typically IGZO (a metal oxide containing In, Ga, and Zn).

As shown in FIG. 25A, an oxide semiconductor is roughly classified into "Amorphous," "Crystalline," and "Crystal." The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 25A are in an intermediate state between "Amorphous" and "Crystal," and belong to a new boundary region (new crystalline phase). That is, these structures are completely different from "Amorphous," which is energetically unstable, and "Crystal."

Note that a crystal structure of a film or a substrate can be evaluated with an X-ray diffraction (XRD) spectrum. FIG. 25B shows an XRD spectrum, which is obtained by GIXD (Grazing-Incidence XRD) measurement, of a CAAC-IGZO film classified into "Crystalline." Note that a GIXD method is also referred to as a thin film method or a Seemann-Bohlin method.

The XRD spectrum that is shown in FIG. 25B and obtained by GIXD measurement is hereinafter simply referred to as an XRD spectrum. The CAAC-IGZO film in FIG. 25B has a composition in the vicinity of In:Ga:Zn=4: 2:3 [atomic ratio]. The CAAC-IGZO film in FIG. 25B has a thickness of 500 nm.

As shown in FIG. 25B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 25B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 25C shows a diffraction pattern of the CAAC-IGZO film. FIG. 25C shows a diffraction pattern obtained by the NBED method in which an electron beam is incident in the direction parallel to the substrate. The composition of the CAAC-IGZO film in FIG. 25C is In:Ga:Zn=4:2:3 [atomic ratio] or the vicinity thereof. In the nanobeam electron diffraction method, electron diffraction is performed with a probe diameter of 1 nm.

As shown in FIG. 25C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 25A when classified in terms of the crystal structure. Oxide semiconductors are classified into a single crystal oxide semiconductor and a non-single-crystal oxide semiconductor, for example.

Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In] in the second region and lower [Ga] than [Ga] in the second region. Moreover, the second region has higher [Ga] than [Ga] in the first region and lower [In] than [In] in the first region.

Specifically, the first region includes indium oxide, indium zinc oxide, or the like as its main component. The second region includes gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. A CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/cm$^3$, preferably lower than or equal to $2 \times 10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1 \times 10^{18}$ atoms/cm$^3$, preferably lower than or equal to $2 \times 10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide semiconductor with sufficiently reduced impurities is used for the channel formation region of the transistor, stable electrical characteristics can be given.

The configurations, structures, methods, and the like described in this embodiment can be used in combination as appropriate with the structures, configurations, methods, and the like described in the other embodiments and the like.

Embodiment 5

In this embodiment, application examples of the above-described semiconductor device are described. Note that in this embodiment, the scope of the term "semiconductor device" includes a communication device. Also in the other embodiments, the scope of the term "semiconductor device" sometimes includes a communication device.

[Semiconductor Wafer and Chip]

Figure 26A:
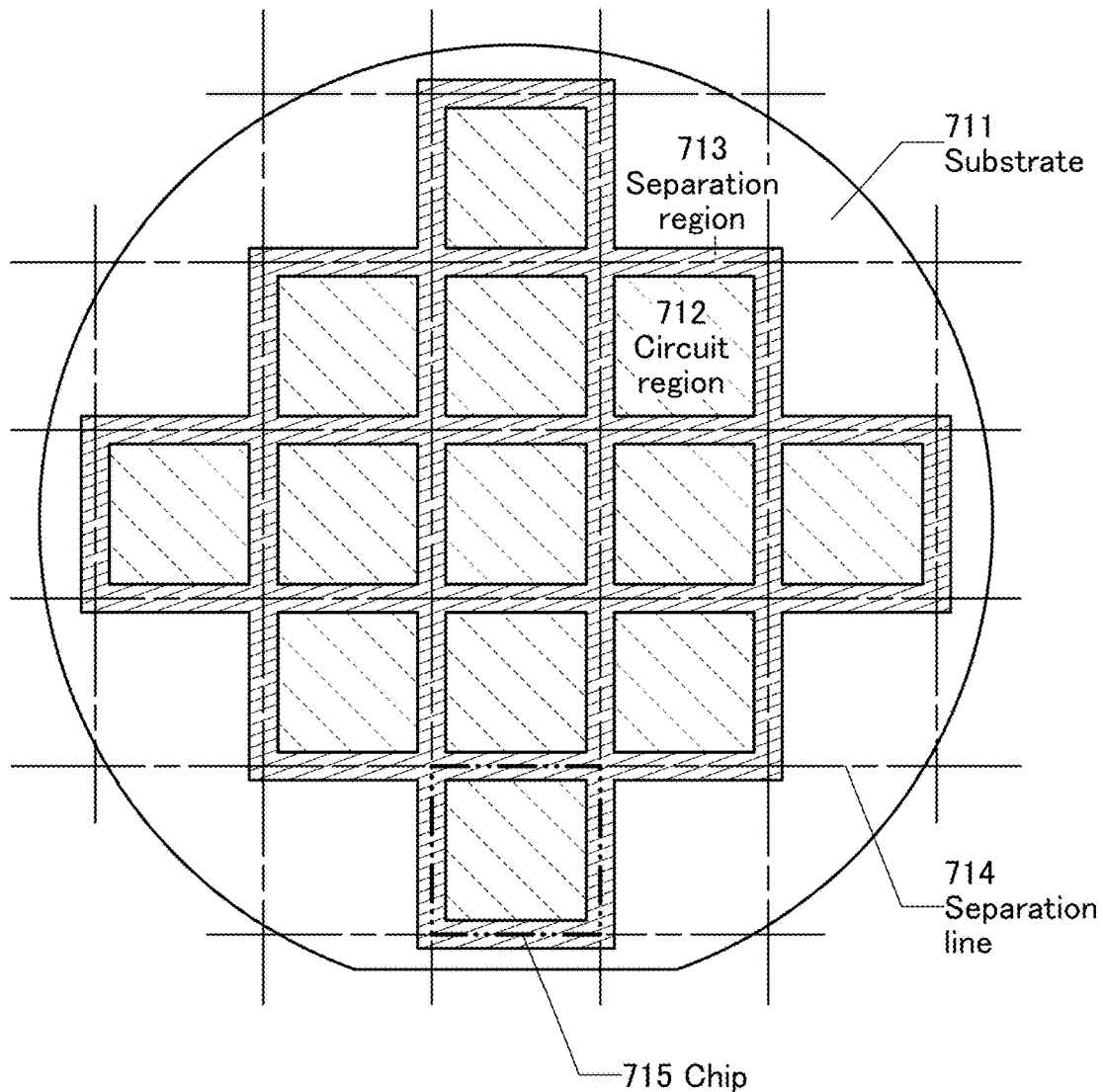
FIG. 26A is a top view of a semiconductor wafer.

FIG. 26A is a top view of a substrate 711 before dicing treatment. As the substrate 711, a semiconductor substrate (also referred to as a "semiconductor wafer") can be used, for example. A plurality of circuit regions 712 are provided on the substrate 711. A semiconductor device, a CPU, an RF tag, an image sensor, or the like of one embodiment of the present invention can be provided in the circuit region 712.

Figure 26B:
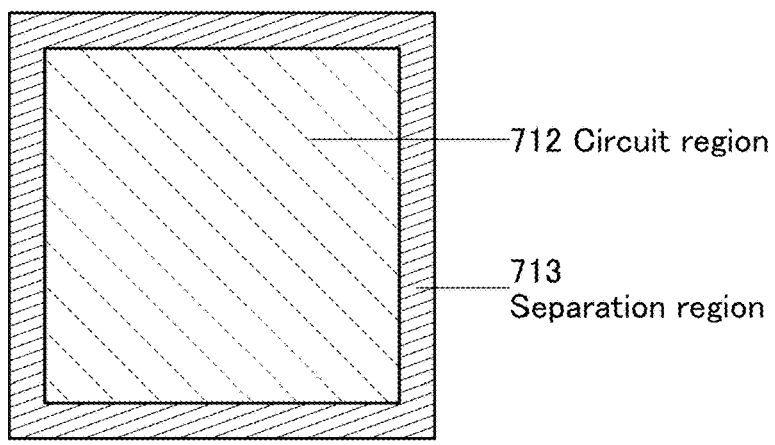
FIG. 26B is an enlarged view of a chip.

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 26B is an enlarged view of the chip 715.

A conductive layer or a semiconductor layer may be provided in the separation regions 713. Providing a conductive layer or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing semiconductor devices can be reduced. Moreover, semiconductor devices can be manufactured with improved productivity.

For a semiconductor layer provided in the separation regions 713, a material having a band gap of 2.5 eV or more and 4.2 eV or less is preferably used, and a material having a band gap of 2.7 eV or more and 3.5 eV or less is more preferably used. The use of such a material allows accumulated charges to be released slowly; thus, the rapid move of charges due to ESD can be suppressed and electrostatic breakdown is less likely to occur.

[Electronic Component]

FIG. 27 shows an example in which the chip 715 is used in an electronic component. Note that the electronic component is also referred to as a semiconductor package or an IC package. There are various standards and names for the electronic component on a terminal extraction direction and a terminal shape.

The electronic component is completed when the semiconductor device described in the above embodiment is combined with components other than the semiconductor device in an assembly process (post-process).

Figure 27A:
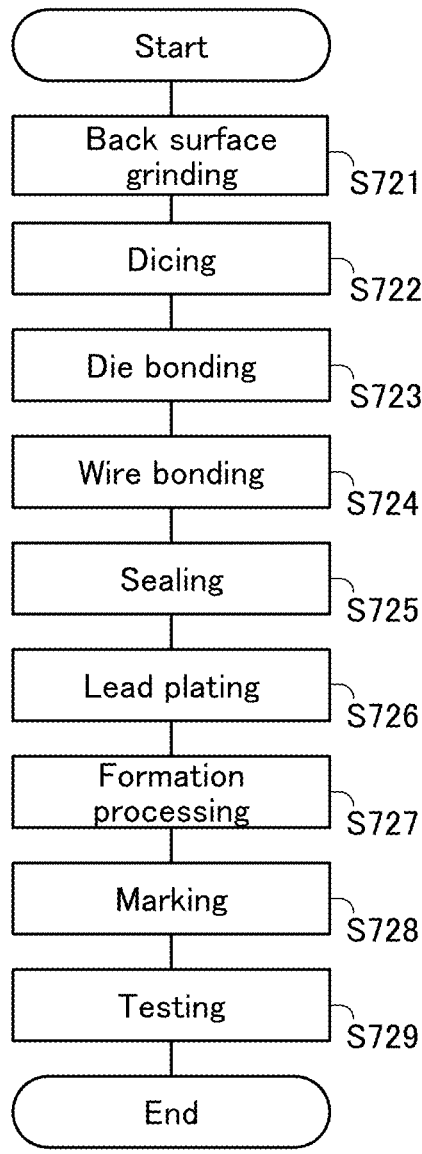
FIG. 27A is a flowchart showing an example of a fabrication process of an electronic component.

The post-process will be described with reference to a flow chart in FIG. 27A. After an element substrate including the semiconductor device described in the above embodiment is completed in a pre-process, a "back surface grinding step" of grinding a back surface (a surface where a semiconductor device and the like are not formed) of the element substrate is performed (Step S721). When the element substrate is thinned by grinding, warpage or the like of the element substrate is reduced, so that the size of the electronic component can be reduced.

Next, a "dicing step" of dividing the element substrate into a plurality of chips (chips 715) is performed (Step S722). Then, a "die bonding step" of separately picking up the divided chips and bonding the chips onto a lead frame is performed (Step S723). To bond a chip and a lead frame in the die bonding step, a method such as bonding using resin or a tape is selected as appropriate depending on products. Note that the chip may be bonded onto an interposer substrate instead of the lead frame.

Next, a "wire bonding step" of electrically connecting a lead of the lead frame and an electrode on the chip through a metal fine line (wire) is performed (Step S724). A silver line or a gold line can be used as the metal fine line. Ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, a "lead plating step" of plating the lead of the lead frame is performed (Step S726). This plating process prevents rust of the lead and enables more securely soldering at the time of mounting the electronic component on a printed circuit board in a later step. Then, a "forming step" of cutting and forming of the lead is performed (Step S727).

Next, a "marking step" of printing (marking) on a surface of the package is performed (Step S728). After a "testing step" for checking whether an external shape is good and whether there is an operation malfunction, for example (Step S729), the electronic component is completed (Step S729).

Figure 27B:
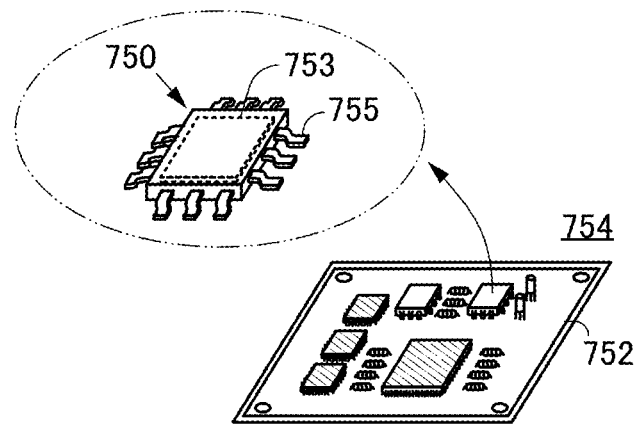
FIG. 27B a schematic perspective view of an electronic component.

FIG. 27B is a schematic perspective view of a completed electronic component. FIG. 27B is a schematic perspective view illustrating a QFP (Quad Flat Package) as an example of the electronic component. In an electronic component 750 in FIG. 27B, a lead 755 and a semiconductor device 753 are shown. As the semiconductor device 753, the semiconductor device described in the above embodiment or the like can be used.

The electronic component 750 in FIG. 27B is mounted on a printed circuit board 752, for example. A plurality of electronic components 750 are combined and electrically connected to each other over the printed circuit board 752; thus, a substrate on which the electronic components are mounted (a circuit board 754) is completed. The completed circuit board 754 is provided in an electronic device or the like.

[Electronic Device]

Next, examples of electronic devices including the semiconductor device of one embodiment of the present invention or the above-described electronic component will be described with reference to FIG. 28.

Examples of electronic devices including the semiconductor device of one embodiment of the present invention or the electronic component include display devices of televisions, monitors, and the like; lighting devices; desktop personal computers; laptop personal computers; word processors; image reproduction devices that reproduce still images and moving images stored in recording media such as DVDs (Digital Versatile Discs); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from the power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The semiconductor device of one embodiment of the present invention or the electronic component can be used for a communication device or the like incorporated in the electronic devices.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), for example.

The electronic devices can have a variety of functions such as a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium, for example.

Figure 28:
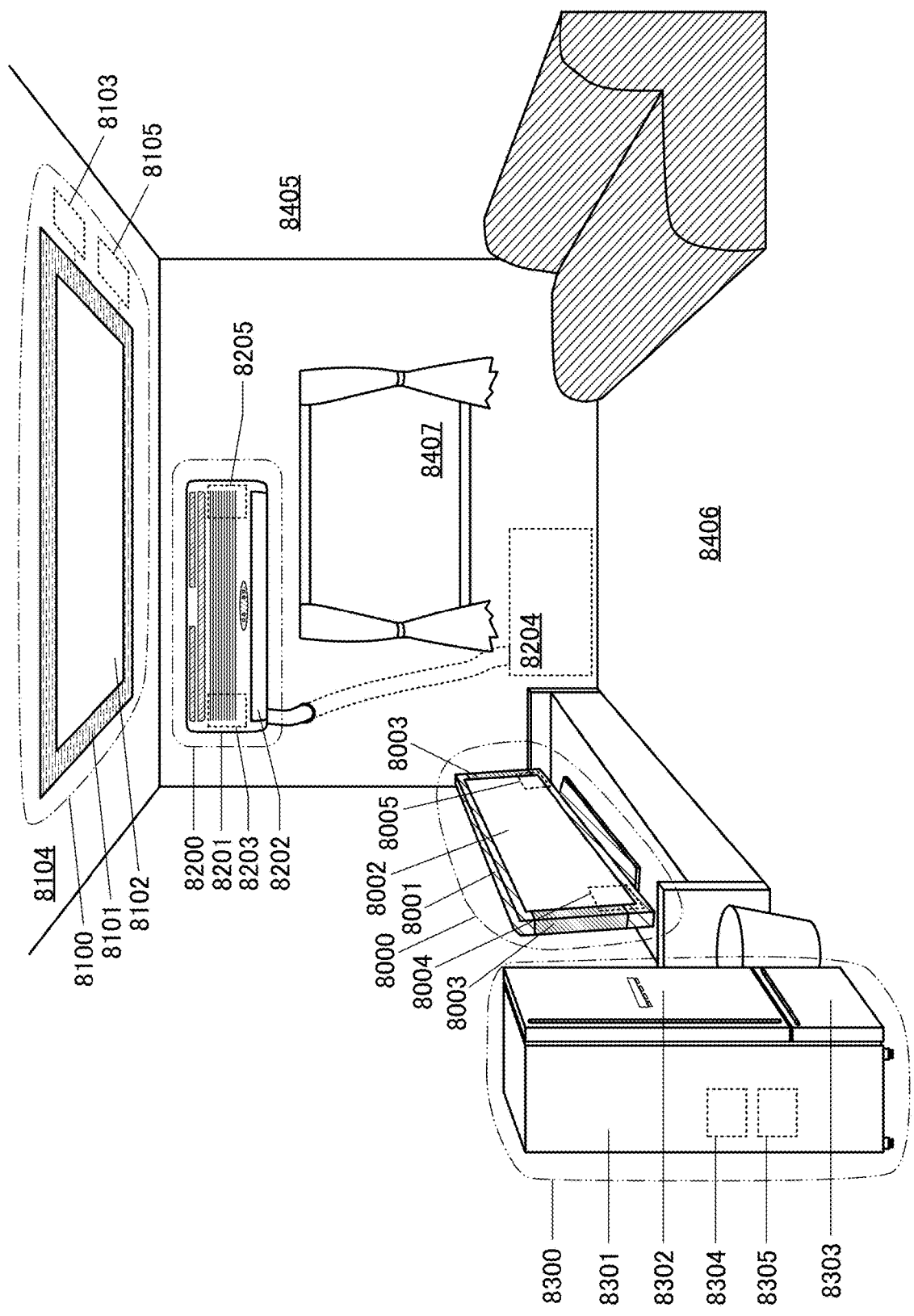
FIG. 28 is a diagram illustrating examples of electronic devices.

FIG. 28 and FIG. 29A to FIG. 29F illustrate examples of electronic devices. In FIG. 28, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like.

The semiconductor device 8004 of one embodiment of the present invention is provided in the housing 8001. The semiconductor device 8004 can retain control data, a control program, or the like. The semiconductor device 8004 has a communication function, and the display device 8000 can function as an IoT device. The display device 8000 can receive electric power from a commercial power supply. Alternatively, the display device 8000 can use electric power stored in the power storage device 8005.

A display device such as a liquid crystal display device, a light-emitting display device in which a light-emitting element such as an organic EL element is provided in each pixel, an electrophoresis display device, a DMD (Digital Micromirror Device), a PDP (Plasma Display Panel), or a FED (Field Emission Display) can be used for the display portion 8002.

Note that the display device includes, in its category, all of information display devices for personal computers, advertisement displays, and the like besides TV broadcast reception.

In FIG. 28, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 28 illustrates the case where the semiconductor device 8103 is provided in a ceiling 8104 on which the housing 8101 and the light source 8102 are installed, the semiconductor device 8103 may be provided in the housing 8101. The semiconductor device 8103 can retain data such as emission luminance of the light source 8102, a control program, or the like. The semiconductor device 8103 has a communication function, and the lighting device 8100 can function as an IoT device. The lighting device 8100 can receive electric power from a commercial power supply. Alternatively, the lighting device 8100 can use electric power stored in the power storage device.

Although FIG. 28 illustrates the installation lighting device 8100 provided in the ceiling 8104 as an example, the semiconductor device of one embodiment of the present invention can be used in an installation lighting device provided in, for example, a wall 8405, a floor 8406, a window 8407, or the like other than the ceiling 8104, or a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element.

In FIG. 28, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 28 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control data, a control program, or the like of the air conditioner. The semiconductor device 8203 has a communication function, and the air conditioner can function as an IoT device. The air conditioner can receive electric power from a commercial power supply. Alternatively, the air conditioner can use electric power stored in the power storage device 8205.

Although FIG. 28 illustrates the split-type air conditioner including the indoor unit and the outdoor unit as an example, the semiconductor device of one embodiment of the present invention can be used in a unified-type air conditioner in which the functions of an indoor unit and an outdoor unit are included in one housing.

In FIG. 28, an electric refrigerator-freezer 8300 is an example of an electronic device including a semiconductor device 8304 of one embodiment of the present invention. Specifically, the electric refrigerator-freezer 8300 includes a housing 8301, a refrigerator door 8302, a freezer door 8303, the semiconductor device 8304, a power storage device 8305, and the like. In FIG. 28, the power storage device 8305 is provided in the housing 8301. The semiconductor device 8304 can retain control data, a control program, or the like of the electric refrigerator-freezer 8300. The semiconductor device 8304 has a communication function, and the electric refrigerator-freezer 8300 can function as an IoT device. The electric refrigerator-freezer 8300 can receive electric power from a commercial power supply or use electric power stored in the power storage device 8305.

Figure 29A:
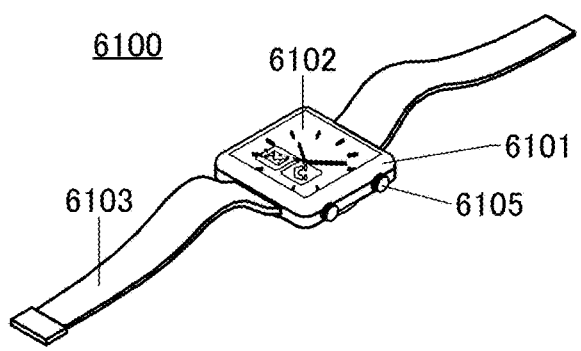
FIG. 29A, FIG. 29B, FIG. 29C, FIG. 29D, FIG. 29E, and FIG. 29F are diagrams showing examples of an electronic device.

FIG. 29A illustrates an example of a watch-type portable information terminal. A portable information terminal 6100 includes a housing 6101, a display portion 6102, a band 6103, operation buttons 6105, and the like. The portable information terminal 6100 further includes a secondary battery and the semiconductor device of one embodiment of the present invention or the electronic component. The portable information terminal 6100 including the semiconductor device of one embodiment of the present invention or the electronic component can function as an IoT device.

Figure 29B:
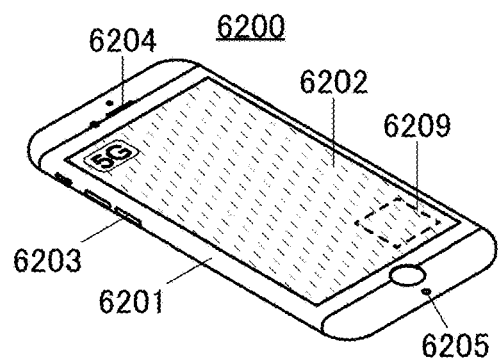

FIG. 29B illustrates an example of a portable telephone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device of one embodiment of the present invention or the electronic component. The portable information terminal 6200 including the semiconductor device of one embodiment of the present invention or the electronic component can function as an IoT device.

Figure 29C:
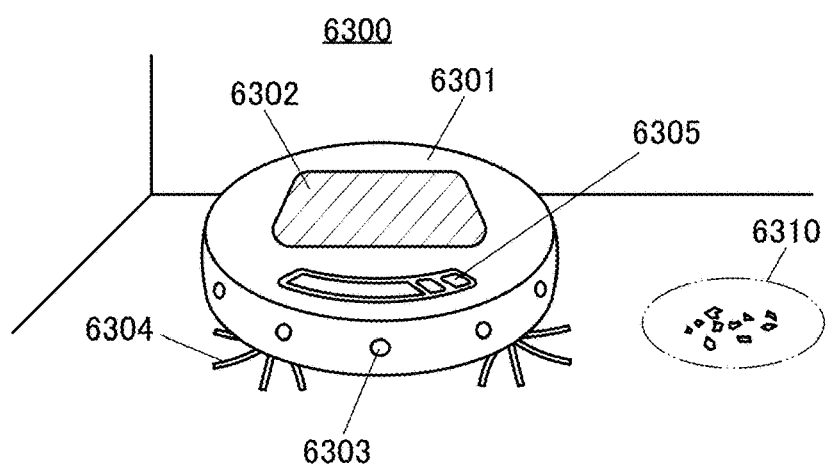

FIG. 29C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not illustrated, the cleaning robot 6300 is provided with a tire, an inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images taken by the cameras 6303. In the case where the cleaning robot 6300 detects an object, e.g. wiring, that is likely to be caught in the brush 6304 by image analysis, the rotation of the brush 6304 can be stopped. The cleaning robot 6300 further includes a secondary battery and the semiconductor device of one embodiment of the present invention or the electronic component. The cleaning robot 6300 including the semiconductor device of one embodiment of the present invention or the electronic component can function as an IoT device.

Figure 29D:
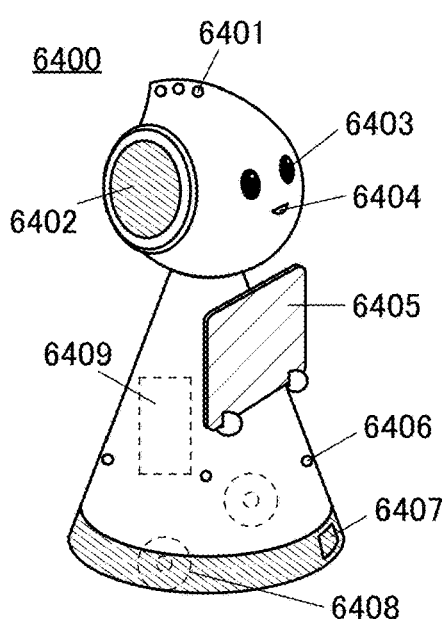

FIG. 29D illustrates an example of a robot. A robot 6400 illustrated in FIG. 29D includes an arithmetic unit 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display portion 6405 has a function of displaying various kinds of information. The robot 6400 can display information desired by a user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407.

The robot 6400 further includes a secondary battery and the semiconductor device of one embodiment of the present invention or the electronic component. The robot 6400 including the semiconductor device of one embodiment of the present invention or the electronic component can function as an IoT device.

Figure 29E:
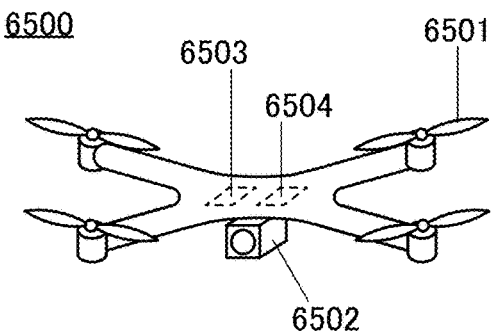

FIG. 29E illustrates an example of a flying object. A flying object 6500 illustrated in FIG. 29E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there is an obstacle in the way of the movement. Moreover, the electronic component 6504 can estimate the remaining battery level from a change in the power storage capacity of the battery 6503. The flying object 6500 further includes the semiconductor device of one embodiment of the present invention or the electronic component. The flying object 6500 including the semiconductor device of one embodiment of the present invention or the electronic component can function as an IoT device.

Figure 29F:
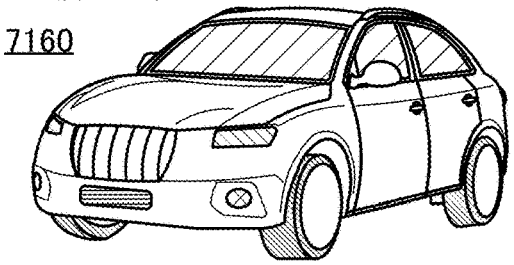

FIG. 29F illustrates an example of an automobile. An automobile 7160 includes an engine, tires, a brake, a steering gear, a camera, and the like. The automobile 7160 further includes the semiconductor device of one embodiment of the present invention or the electronic component. The automobile 7160 including the semiconductor device of one embodiment of the present invention or the electronic component can function as an IoT device.

The structures, the configurations, the methods, and the like described in this embodiment can be combined as appropriate with any of the structures, the configurations, the methods, and the like described in the other embodiments and examples.

Embodiment 6

The use of the OS transistor described in this specification and the like enables a normally-off CPU (also referred to as "Noff CPU") to be obtained. Note that the Noff CPU is an integrated circuit including a normally-off transistor, which is in a non-conduction state (also referred to as off state) even when a gate voltage is 0 V.

In the Noff CPU, power supply to a circuit that does not need to operate can be stopped so that the circuit can be brought into a standby state. The circuit brought into the standby state because of the stop of power supply does not consume power. Thus, the power usage of the Noff CPU can be minimized. Moreover, the Noff CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff CPU can be reduced without a significant decrease in operation speed.

The Noff-CPU can be suitably used for a small-scale system such as an IoT end device (also referred to as an "endpoint microcomputer"), for example.

Figure 30:
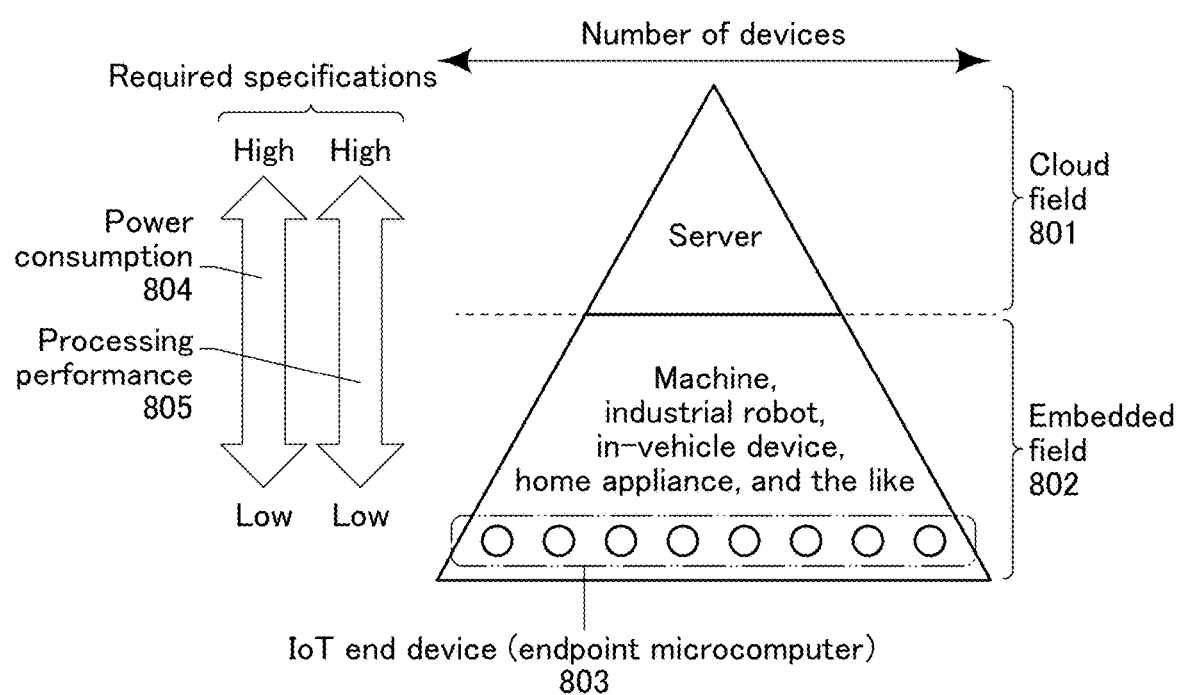
FIG. 30 is a diagram illustrating a hierarchical structure of an IoT network and tendencies of required specifications.

FIG. 30 illustrates a hierarchical structure of an IoT network and tendencies of required specifications. FIG. 30 illustrates power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption at the upper level. Thus, a high-performance CPU, a high-performance GPU, a large-scale SoC (System on a Chip), and the like are used in the cloud field 801. Furthermore, lower power consumption is required rather than higher processing performance at the lower level where the number of devices is explosively increased. The communication device or semiconductor device of one embodiment of the present invention can be suitably used for a communication device in the IoT end device 803 which needs to have low power consumption.

Note that an "endpoint" refers to an end region of the embedded field 802. Examples of devices used in the endpoint include microcomputers used in a factory, a home appliance, infrastructure, agriculture, and the like.

Figure 31:
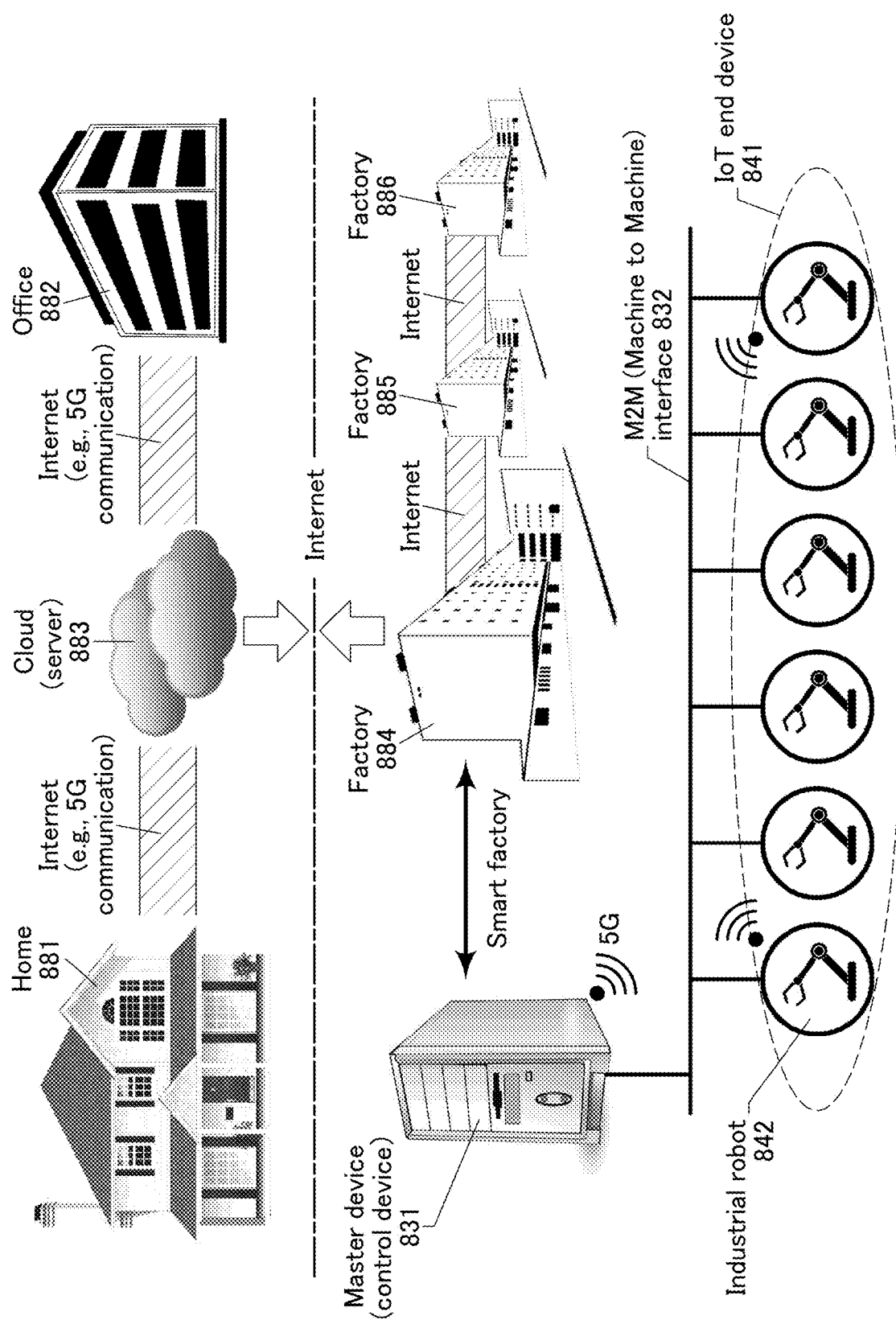
FIG. 31 is a conceptual diagram of factory automation.

FIG. 31 shows a conceptual diagram showing factory automation as an application example of the endpoint microcomputer. A factory 884 is connected to a cloud 883 through Internet connection (Internet). The cloud 883 is connected to a home 881 and an office 882 through the Internet connection. The Internet connection may be wired communication or wireless communication. In the case of wireless communication, for example, wireless communication based on a communication standard such as the 4th generation mobile communication system (4G) or the 5th generation mobile communication system (5G) can be performed using the communication device or semiconductor device of one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet (registered trademark), which is a kind of wired communication, or local 5G, which is a kind of wireless communication, may be used.

A factory manager can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; under the name "Smart Factory." Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff CPU. Although the embedded field of IoT sometimes requires quick response, the use of the Noff CPU achieves high-speed return from a standby state.

The configurations, structures, methods, and the like described in this embodiment can be used in combination as appropriate with the structures, configurations, methods, and the like described in the other embodiments and the like.

REFERENCE NUMERALS

10: communication device, 11: antenna, 12: amplifier, 13: amplifier, 14: phase shifter, 15: amplifier, 16: inductor, 17: inductor, 18: wiring, 19: wiring, 20: amplifier circuit, 21: transistor, 21a: transistor, 21b: transistor, 22: transistor, 22a: transistor, 22b: transistor, 23: load, 23a: load, 23b: load, 24: switch, 25: operational amplifier, 25a: operational amplifier, 25b: operational amplifier, 26: switch, 26a: switch, 26b: switch, 27: switch, 27a: switch, 27b: switch, 28: transistor, 31: transistor, 31a: transistor, 31b: transistor, 32: transistor, 32a: transistor, 32b: transistor, 33: load, 33a: load, 33b: load, 34: switch, 35a: operational amplifier, 35b: operational amplifier, 36a: switch, 36b: switch, 37a: switch, 37b: switch, 38: transistor, 40: terminal, 40a: terminal, 40b: terminal, 41: wiring, 42: wiring, 42a: wiring, 42b: wiring, 43: wiring, 44: potential generation circuit, 44a: potential generation circuit, 44b: potential generation circuit, 46a: wiring, 46b: wiring, 50: terminal, 50a: terminal, 50b: terminal, 51: wiring, 52: wiring, 52a: wiring, 52b: wiring, 53: wiring, 54: potential generation circuit, 54a: potential generation circuit, 54b: potential generation circuit, 56a: wiring, 56b: wiring, 61: phase shifter, 62: capacitor, 63: switch, 64: phase shifter, 65: inductor, 66: inductor, 73: wiring, 75: wiring, 80: memory circuit, 81: transistor, 82: capacitor, 84: wiring, 85: wiring, 90: memory circuit, 91: transistor, 92: capacitor, 94: wiring, 95: wiring, 101: inductor, 102: capacitor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 503: conductor, 503a: conductor, 503b: conductor, 510: insulator, 512: insulator, 513: insulator, 514: insulator, 516: insulator, 518: conductor, 520: insulator, 522: insulator, 524: insulator, 530: oxide, 530a: oxide, 530b: oxide, 540a: conductor, 540b: conductor, 542a: conductor, 542b: conductor, 543a: region, 543b: region, 544: insulator, 545: insulator, 546: conductor, 550: transistor, 552: insulator, 560: conductor, 560a: conductor, 560b: conductor, 574: insulator, 580: insulator, 581: insulator, 582: insulator, 586: insulator, 600A: transistor, 600B: transistor, 610: conductor, 612: conductor, 640: insulator, 711: substrate, 712: circuit region, 713: separation region, 714: separation line, 715: chip, 750: electronic component, 752: printed circuit board, 753: semiconductor device, 754: circuit board, 755: lead, 801: cloud field, 802: field, 803: IoT end device, 804: power consumption, 805: processing performance, 831: master device, 832: interface, 841: IoT end device, 842: industrial robot, 881: home, 882: office, 883: cloud, 884: factory, 885: factory, 886: factory, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electronic component, 7160: automobile, 8000: display device, 8001: housing, 8002: display portion, 8003: speaker portion, 8004: semiconductor device, 8005: power storage device, 8100: lighting device, 8101: housing, 8102: light source, 8103: semiconductor device, 8104: ceiling, 8105: power storage device, 8200: indoor unit, 8201: housing, 8202: air outlet, 8203: semiconductor device, 8204: outdoor unit, 8205: power storage device, 8300: electric refrigerator-freezer, 8301: housing, 8302: refrigerator door, 8303: freezer door, 8304: semiconductor device, 8305: power storage device, 8405: sidewall, 8406: floor, 8407: window

The invention claimed is:

1. A communication device comprising an amplifier circuit,
wherein the amplifier circuit comprises a first transistor, a second transistor, a third transistor, a fourth transistor, a fifth transistor, a sixth transistor, a seventh transistor, an eighth transistor, a first load, a second load, a third load, a fourth load, a first terminal, a second terminal, a third terminal, and a fourth terminal,
wherein one of a source and a drain of the first transistor is electrically connected to one of a source and a drain of the second transistor,
wherein one of a source and a drain of the third transistor is electrically connected to one of a source and a drain of the fourth transistor,
wherein one of a source and a drain of the fifth transistor is electrically connected to one of a source and a drain of the sixth transistor,
wherein one of a source and a drain of the seventh transistor is electrically connected to one of a source and a drain of the eighth transistor, wherein the other of the source and the drain of the first transistor and the other of the source and the drain of the third transistor are electrically connected to a first power supply line, wherein the other of the source and the drain of the fifth transistor and the other of the source and the drain of the seventh transistor are electrically connected to a second power supply line, wherein a gate of the second transistor and a gate of the fourth transistor are electrically connected to a first wiring, wherein a gate of the sixth transistor and a gate of the eighth transistor are electrically connected to a second wiring, wherein the first terminal is electrically connected to the gate of the first transistor, the other of the source and the drain of the sixth transistor, and the first load, wherein the second terminal is electrically connected to the gate of the third transistor, the other of the source and the drain of the eighth transistor, and the second load, wherein the third terminal is electrically connected to the gate of the fifth transistor, the other of the source and the drain of the second transistor, and the third load, and wherein the fourth terminal is electrically connected to the gate of the seventh transistor, the other of the source and the drain of the fourth transistor, and the fourth load.

2. A communication device comprising an amplifier circuit, wherein the amplifier circuit comprises a first transistor, a second transistor, a third transistor, a fourth transistor, a fifth transistor, a sixth transistor, a seventh transistor, an eighth transistor, a first operational amplifier, a second operational amplifier, a third operational amplifier, a fourth operational amplifier, a first load, a second load, a third load, a fourth load, a first terminal, a second terminal, a third terminal, and a fourth terminal, wherein one of a source and a drain of the first transistor is electrically connected to one of a source and a drain of the second transistor, wherein one of a source and a drain of the third transistor is electrically connected to one of a source and a drain of the fourth transistor, wherein one of a source and a drain of the fifth transistor is electrically connected to one of a source and a drain of the sixth transistor, wherein one of a source and a drain of the seventh transistor is electrically connected to one of a source and a drain of the eighth transistor, wherein the other of the source and the drain of the first transistor and the other of the source and the drain of the third transistor are electrically connected to a first power supply line, wherein the other of the source and the drain of the fifth transistor and the other of the source and the drain of the seventh transistor are electrically connected to a second power supply line, wherein a non-inverting input terminal of the first operational amplifier and a non-inverting input terminal of the second operational amplifier are electrically connected to a first wiring, wherein a non-inverting input terminal of the third operational amplifier and a non-inverting input terminal of the fourth operational amplifier are electrically connected to a second wiring, wherein an inverting input terminal of the first operational amplifier is electrically connected to the one of the source and the drain of the first transistor, wherein an inverting input terminal of the second operational amplifier is electrically connected to the one of the source and the drain of the third transistor, wherein an inverting input terminal of the third operational amplifier is electrically connected to the one of the source and the drain of the fifth transistor, wherein an inverting input terminal of the fourth operational amplifier is electrically connected to the one of the source and the drain of the seventh transistor, wherein an output terminal of the first operational amplifier is electrically connected to a gate of the second transistor, wherein an output terminal of the second operational amplifier is electrically connected to a gate of the fourth transistor, wherein an output terminal of the third operational amplifier is electrically connected to a gate of the sixth transistor, wherein an output terminal of the fourth operational amplifier is electrically connected to a gate of the eighth transistor, wherein the first terminal is electrically connected to a gate of the first transistor, the other of the source and the drain of the sixth transistor, and the first load, wherein the second terminal is electrically connected to a gate of the third transistor, the other of the source and the drain of the eighth transistor, and the second load, wherein the third terminal is electrically connected to a gate of the fifth transistor, the other of the source and the drain of the second transistor, and the third load, and wherein the fourth terminal is electrically connected to a gate of the seventh transistor, the other of the source and the drain of the fourth transistor, and the fourth load.

3. The communication device according to claim 1, wherein the second transistor, the fourth transistor, the sixth transistor, and the eighth transistor each comprise a back gate, wherein the back gate of the second transistor is electrically connected to the first terminal, wherein the back gate of the fourth transistor is electrically connected to the second terminal, wherein the back gate of the sixth transistor is electrically connected to the third terminal, and wherein the back gate of the eighth transistor is electrically connected to the fourth terminal.

4. The communication device according to claim 1, wherein, when a first signal wave is input to the first terminal, the amplifier circuit has a function of outputting a signal wave corresponding to the first signal wave from the third terminal, wherein, when a second signal wave is input to the second terminal, the amplifier circuit has a function of outputting a signal wave corresponding to the second signal wave from the fourth terminal, wherein, when a third signal wave is input to the third terminal, the amplifier circuit has a function of outputting a signal wave corresponding to the third signal wave from the first terminal, and wherein, when a fourth signal wave is input to the fourth terminal, the amplifier circuit has a function of outputting a signal wave corresponding to the fourth signal wave from the second terminal.

5. The communication device according to claim 4,
wherein, when the first signal wave is input to the first terminal and the second signal wave is input to the second terminal, a potential of the first wiring is a potential at which the second and fourth transistors are operated in a saturation region and a potential of the second wiring is a potential at which the sixth and eighth transistors are bought into an off state, and
wherein, when the third signal wave is input to the third terminal and the fourth signal wave is input to the fourth terminal, the potential of the first wiring is a potential at which the second and fourth transistors are bought into an off state and the potential of the second wiring is a potential at which the sixth and eighth transistors are operated in a saturation region.

6. The communication device according to claim 4,
wherein there is an antiphase relationship between the first signal wave and the second signal wave, and
wherein there is an antiphase relationship between the third signal wave and the fourth signal wave.

7. The communication device according to claim 1,
wherein the one of the source and the drain of each of the first to eighth transistors is a source.

8. The communication device according to claim 2,
wherein the second transistor, the fourth transistor, the sixth transistor, and the eighth transistor each comprise a back gate,
wherein the back gate of the second transistor is electrically connected to the first terminal,
wherein the back gate of the fourth transistor is electrically connected to the second terminal,
wherein the back gate of the sixth transistor is electrically connected to the third terminal, and
wherein the back gate of the eighth transistor is electrically connected to the fourth terminal.

9. The communication device according to claim 2,
wherein, when a first signal wave is input to the first terminal, the amplifier circuit has a function of outputting a signal wave corresponding to the first signal wave from the third terminal,
wherein, when a second signal wave is input to the second terminal, the amplifier circuit has a function of outputting a signal wave corresponding to the second signal wave from the fourth terminal,
wherein, when a third signal wave is input to the third terminal, the amplifier circuit has a function of outputting a signal wave corresponding to the third signal wave from the first terminal, and
wherein, when a fourth signal wave is input to the fourth terminal, the amplifier circuit has a function of outputting a signal wave corresponding to the fourth signal wave from the second terminal.

10. The communication device according to claim 9,
wherein, when the first signal wave is input to the first terminal and the second signal wave is input to the second terminal, a potential of the first wiring is a potential at which the second and fourth transistors are operated in a saturation region and a potential of the second wiring is a potential at which the sixth and eighth transistors are bought into an off state, and
wherein, when the third signal wave is input to the third terminal and the fourth signal wave is input to the fourth terminal, the potential of the first wiring is a potential at which the second and fourth transistors are bought into an off state and the potential of the second wiring is a potential at which the sixth and eighth transistors are operated in a saturation region.

11. The communication device according to claim 9,
wherein there is an antiphase relationship between the first signal wave and the second signal wave, and
wherein there is an antiphase relationship between the third signal wave and the fourth signal wave.

12. The communication device according to claim 2,
wherein the one of the source and the drain of each of the first to eighth transistors is a source.

* * * * *